(12) United States Patent
Nishimura et al.

(10) Patent No.: US 8,574,725 B2
(45) Date of Patent: Nov. 5, 2013

(54) ORGANIC EL ELEMENT AND SOLUTION CONTAINING ORGANIC EL MATERIAL

(75) Inventors: Kazuki Nishimura, Sodegaura (JP);
Toshihiro Iwakuma, Sodegaura (JP);
Kenichi Fukuoka, Sodegaura (JP);
Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 504 days.

(21) Appl. No.: 12/744,181

(22) PCT Filed: Nov. 21, 2008

(86) PCT No.: PCT/JP2008/071266
§ 371 (c)(1),
(2), (4) Date: Sep. 15, 2010

(87) PCT Pub. No.: WO2009/066778
PCT Pub. Date: May 28, 2009

(65) Prior Publication Data
US 2011/0001130 A1    Jan. 6, 2011

(30) Foreign Application Priority Data
Nov. 22, 2007    (JP) .................................. 2007-303710

(51) Int. Cl.
*H01L 51/54* (2006.01)
*C09K 11/06* (2006.01)

(52) U.S. Cl.
USPC ........... 428/690; 428/917; 313/504; 313/506; 252/301.16

(58) Field of Classification Search
None
See application file for complete search history.

(56) References Cited

U.S. PATENT DOCUMENTS

| | | | |
|---|---|---|---|
| 6,203,933 B1 | 3/2001 | Nakaya et al. | |
| 7,201,974 B2 | 4/2007 | Hamada | |
| 7,429,425 B2 | 9/2008 | Ikeda et al. | |
| 2002/0182441 A1 | 12/2002 | Lamanski et al. | |
| 2003/0044643 A1* | 3/2003 | Arakane et al. | 428/690 |
| 2004/0076853 A1 | 4/2004 | Jarikov | |
| 2004/0258956 A1 | 12/2004 | Matsusue | |
| 2005/0057150 A1* | 3/2005 | Kim et al. | 313/504 |
| 2006/0099447 A1 | 5/2006 | Lee et al. | |
| 2006/0115679 A1 | 6/2006 | Chun et al. | |

(Continued)

FOREIGN PATENT DOCUMENTS

| | | |
|---|---|---|
| EP | 2 218 123 | 8/2010 |
| JP | 8-311442 | 11/1996 |

(Continued)

OTHER PUBLICATIONS

Supplementary European Search Report EP 08 85 2937 dated Jul. 11, 2012.

(Continued)

*Primary Examiner* — Dawn Garrett
(74) *Attorney, Agent, or Firm* — Foley & Lardner LLP

(57) ABSTRACT

An organic electroluminescence device includes: an anode; a cathode; and an organic thin-film layer interposed between the anode and the cathode. The organic thin-film layer includes a phosphorescent-emitting layer containing a host and a phosphorescent dopant. The host contains a first host and a second host. The first host includes a substituted or unsubstituted polycyclic fused aromatic skeleton, the skeleton having 10 to 30 ring-forming atoms not including an atom of a substituent. The second host has an affinity level greater than the affinity level of the first host.

16 Claims, 1 Drawing Sheet

(56) References Cited

U.S. PATENT DOCUMENTS

| | | |
|---|---|---|
| 2006/0134456 A1 | 6/2006 | Ikeda et al. |
| 2006/0257684 A1 | 11/2006 | Arakane et al. |
| 2006/0280965 A1 | 12/2006 | Kwong et al. |
| 2008/0074038 A1* | 3/2008 | Kim et al. .................... 313/504 |
| 2009/0009074 A1 | 1/2009 | Ikeda et al. |
| 2009/0026919 A1 | 1/2009 | Stossel et al. |
| 2009/0174313 A1* | 7/2009 | Nishimura et al. ........... 313/504 |
| 2010/0295445 A1* | 11/2010 | Kuma et al. ................... 313/504 |

FOREIGN PATENT DOCUMENTS

| | | | |
|---|---|---|---|
| JP | 2002-141172 A | 5/2002 |
| JP | 2003-347058 A | 12/2003 |
| JP | 2004-319456 A | 11/2004 |
| JP | 2006-135295 A | 5/2006 |
| JP | 2006-156941 A | 6/2006 |
| JP | 2006-269232 A | 10/2006 |
| JP | 2007-042875 A | 2/2007 |
| JP | 2007-084458 A | 4/2007 |
| JP | 2007-194241 A | 8/2007 |
| JP | 2007-242910 A | 9/2007 |
| WO | WO 2004/016575 A1 | 2/2004 |
| WO | WO 2004/034751 A1 | 4/2004 |
| WO | WO 2005/029923 A1 | 3/2005 |
| WO | WO 2006/039982 A1 | 4/2006 |
| WO | WO 2006/061759 A2 | 6/2006 |
| WO | WO 2006/130598 A2 | 12/2006 |
| WO | WO 2007/072889 A1 | 6/2007 |
| WO | WO 2007/109657 A2 | 9/2007 |

OTHER PUBLICATIONS

H. Kanno et al., "Highly efficient and stable red phosphorescent organic light-emitting device using bis[2-(2-benzothiazoyl)phenolato]zinc(II) as host material," Applied Physics Letters, 90 (2007), pp. 123509-1 through 123509-3.

International Search Report mailed Mar. 3, 2009 received in PCT/JP2008/071266.

Steven L. Murov et al., Handbook of Photochemistry, Second Edition, Revised and Expanded, 1993 (8 pages).

Office Action Japanese Patent Application No. 2009-542611 dated Apr. 30, 2013.

* cited by examiner

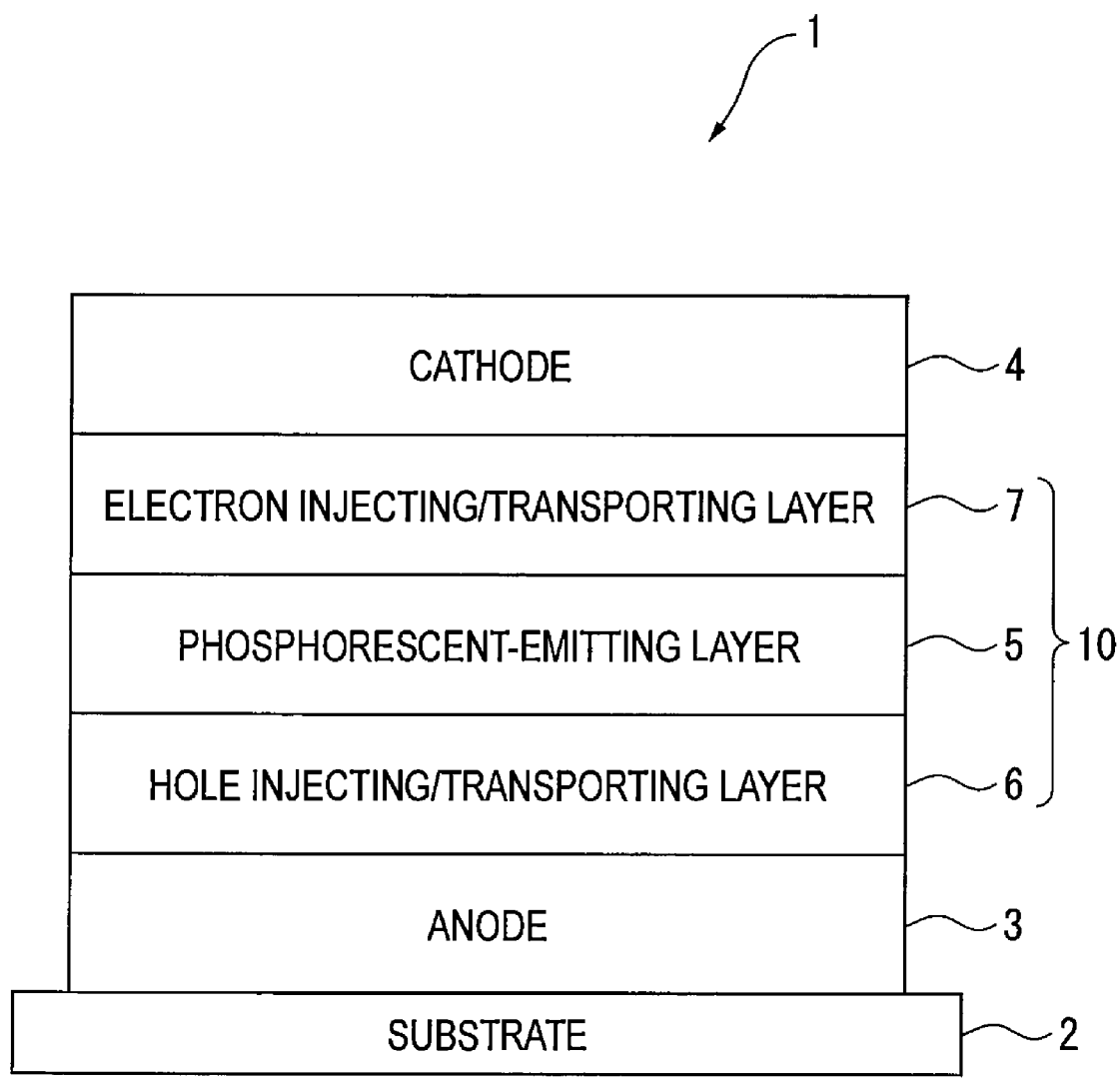

ORGANIC EL ELEMENT AND SOLUTION CONTAINING ORGANIC EL MATERIAL

TECHNICAL FIELD

The present invention relates to an organic electroluminescence device and an organic-electroluminescent-material-containing solution. Especially, the invention relates to an organic electroluminescence device that includes a phosphorescent-emitting layer containing a host and a phosphorescent dopant.

BACKGROUND ART

An organic electroluminescence device, which includes an organic emitting layer between an anode and a cathode, has been known to emit light using exciton energy generated by a recombination of holes and electrons that have been injected into the organic emitting layer.

Such an organic electroluminescence device, which has the advantages as a self-emitting device, is expected to serve as an emitting device excellent in luminous efficiency, image quality, power consumption and thin design.

In order to use an emitting material in an organic electroluminescence device, a doping method for doping a dopant material in a host material has been known.

The doping method is designed so that excitons are efficiently generated by the injected holes and electrons and exciton energy is efficiently converted into light emission, where the exciton energy generated by the host is transferred to the dopant, so that light is emitted from the dopant.

Examples of a further improvement to be made in an organic electroluminescence device include improvements in emission lifetime and luminous efficiency, to which various studies have been made.

For instance, in order to enhance internal quantum efficiency, developments have been made on a phosphorescent material that emits light using triplet excitons. In recent years, there has been a report on a phosphorescent organic electroluminescence device (see, for instance, Patent Document 1).

With the use of such a phosphorescent material, 100% internal quantum efficiency can be theoretically achieved and an organic electroluminescence device with high efficiency and low power consumption can be obtained.

In order to intermolecularly transfer the energy from a phosphorescent host to a phosphorescent dopant (phosphorescent material) in a phosphorescent-emitting layer provided by doping the phosphorescent material, triplet energy gap (referred to as Eg(T) hereinafter) of the phosphorescent host material is required to be larger than the Eg(T) of the phosphorescent dopant.

Typically known material that exhibits effectively large Eg(T) is CBP.

By using CBP as the phosphorescent host, energy can be transferred to a phosphorescent dopant for emitting light of a predetermined emitting wavelength (e.g., green, red), by which an emitting device of high efficiency that shows phosphorescent emission can be obtained.

However, although an organic electroluminescence device in which CBP is used as the phosphorescent host exhibits much higher luminous efficiency due to phosphorescent emission, the organic electroluminescence device has such a short lifetime as to be practically inapplicable.

Accordingly, a material other than CBP that is usable as the phosphorescent host has been under development (see, for instance, non-Patent Document 1).

On the other hand, a variety of host materials for fluorescent dopants are known. Various proposals have been made on a host material capable of, with a combination of a fluorescent dopant, exhibiting excellent luminous efficiency and lifetime.

However, though a fluorescent host has a greater singlet energy gap Eg(S) than that of a fluorescent dopant, since the Eg(T) of the fluorescent host is not necessarily large, direct conversion of the fluorescent host to a phosphorescent host is not possible.

For instance, well-known examples of such a fluorescent host include an anthracene derivative, pylene derivative and naphthacene derivative. However, the Eg(T) of, for instance, an anthracene derivative is approximately 1.9 eV, which is insufficient for obtaining emission of visible light wavelength from 450 nm to 750 nm and is thus not suitable as a phosphorescent host.

On the other hand, it is known that an organic electroluminescence device with a long lifetime and a high efficiency can be obtained with the use of an emission layer containing a dopant in a host of a plurality of materials.

For instance, in Patent Document 2, a phosphorescent-emitting layer is provided using a phosphorescent host containing two or more hole-transferring substances to improve the efficiency and lifetime.

[Patent Document 1] US2002/182441
[Patent Document 2] JP-A-2006-135295
[non-Patent Document 1] Applied Physics letters Vol. 90.123509 (2007)

DISCLOSURE OF THE INVENTION

Problems to be Solved by the Invention

Since the organic electroluminescence device disclosed in the Patent Document 1 includes the phosphorescent-emitting layer, the organic electroluminescence device exhibits high luminous efficiency and low power consumption. However, the lifetime of the organic electroluminescence device is short.

In the non-Patent Document 1, though a variety of materials have been studied as a phosphorescent host, no such phosphorescent host that is capable of efficiently transferring energy to a phosphorescent dopant and providing a phosphorescent-emitting layer that has a practically long lifetime has not been found.

The organic electroluminescence device according to Patent Document 2 exhibits an emission with long lifetime and high efficiency with the use of a phosphorescent host of a plurality of materials. However, since the material constituting the phosphorescent host is CBP or a compound similar to CBP, the effect is not sufficient.

An object of the invention is to provide a phosphorescent-emitting organic electroluminescence device with a high efficiency and long lifetime and an organic-electroluminescent-material-containing solution.

Means for Solving the Problems

An organic electroluminescence device according to an aspect of the invention includes: an anode; a cathode; and an organic thin-film layer interposed between the anode and the cathode, in which the organic thin-film layer includes a phosphorescent-emitting layer containing a host and a phosphorescent dopant, the host contains a first host and a second host, one of the first host and the second host exhibits a higher affinity level than the other, and at least one of the first host and the second host includes a substituted or unsubstituted polycyclic fused aromatic skeleton, the skeleton having 10 to 30 ring-forming atoms not including an atom of a substituent.

In the above aspect of the invention, a phosphorescent dopant is added to the host including the first host and the second host to provide a phosphorescent-emitting layer.

The phosphorescent dopant is provided by a material that emits phosphorescent light by receiving energy from the host or a material that emits light by generating triplet excitons directly thereon.

In the above aspect of the invention, the stability of the molecule can be enhanced and the emission lifetime can be lengthened by providing at least one of the skeletons of the first and the second hosts by a polycyclic fused aromatic compound.

At this time, since the stability of the molecule is not sufficiently enhanced when there are too small number of ring-forming atoms (not counting atom(s) of substituent(s)) in the polycyclic fused aromatic skeleton, the ring-forming atoms (not counting atom(s) of substituent(s)) in the polycyclic fused aromatic skeleton are 10 or more.

On the other hand, when the ring number of the polycyclic fused aromatic skeleton is too much, HOMO-LUMO gap becomes too narrow to reduce the Eg(T). In this case, the energy transfer to the phosphorescent dopant that causes a phosphorescent emission of useful wavelength cannot be obtained. Accordingly, the ring-forming atoms (not counting atom(s) of substituent(s)) in the polycyclic fused aromatic skeleton are 30 or less.

Incidentally, the ring-forming atoms (not counting atom(s) of substituent(s)) in the polycyclic fused aromatic skeleton are favorably in a range from 15 to 30, more favorably 20 to 30.

However, when the host is provided only by the polycyclic fused aromatic compound, the following problem arises.

As described above, the host having the polycyclic fused aromatic skeleton has a large Eg(T), so that the energy transfer from the host to the phosphorescent dopant can be secured.

Generally speaking, a material that exhibits a large Eg(T) shows small affinity level (referred to as Af hereinafter).

Accordingly, when the host is provided solely by a polycyclic fused aromatic compound, the reduced Af prohibits the electron injection to the host. Consequently, the drive voltage of the organic electroluminescence device increases to lower the luminous efficiency. Further, the recombination of hole and electron may be concentrated to a side adjacent to the cathode of the emitting layer to reduce the emission lifetime.

In contrast, the host includes the first host and the second host in the above aspect of the invention. Since the first host and the second host are provided by different materials, there is a difference in the respective Af, where the Af of one of the first and the second hosts is larger than the Af of the other.

According to the above arrangement, since the electrons from the cathode are injected into one of the hosts with larger Af, the increase in the drive voltage of the organic electroluminescence device and concentration of electron recombination to the side of the cathode can be avoided, so that the decrease in luminous efficiency and emission lifetime can be prevented.

Incidentally, metal complexes containing Al, Zn, Ga, Be and the like may alternatively be used as the host in addition to the polycyclic fused aromatic compound. Examples of the metal complexes are BAlq and $Zn(BTP)_2$.

In the above aspect of the invention, the first host preferably has a substituted or unsubstituted polycyclic fused aromatic skeleton of 10 to 30 ring-forming atoms (not counting atom(s) of substituent(s)), and an affinity level of the second host is preferably greater than the affinity level of the first host.

According to the above arrangement, since the electrons from the cathode are injected into the second host with larger Af, the increase in the drive voltage of the organic electroluminescence device and concentration of electron recombination to the side of the cathode can be avoided, so that the decrease in luminous efficiency and emission lifetime can be prevented.

In the above aspect of the invention, since the first host and the second host are contained in a single organic layer, a device preparation time can be reduced as compared with a double-layer structure of the first and the second hosts. Specifically, when the layer is provided in-line, since the layer preparation time of the respective layers has to be synchronized, increase in the number of layers results in increase in preparation time. On the other hand, though the rate control of respective vapor deposition sources during layer formation becomes difficult in a single layer structure, the device preparation time can be reduced.

It should be noted that a "fluorescent host" and a "phosphorescent host" herein respectively mean a host material combined with a fluorescent dopant and a host material combined with a phosphorescent dopant, and that a distinction between the fluorescent host and phosphorescent host is not unambiguously derived only from a molecular structure of the host in a limited manner.

In other words, the fluorescent host herein means a material for forming a fluorescent-emitting layer containing a fluorescent dopant, and does not mean a host that is only usable as a host of a fluorescent material. Likewise, the phosphorescent host herein means a material for forming a phosphorescent-emitting layer containing a phosphorescent dopant, and does not mean a host that is only usable as a host of a phosphorescent material.

The affinity level Af (electron affinity) means energy emitted or absorbed when an electron is fed to a molecule of a material. The affinity level is defined as "positive" when energy is emitted while being defined as "negative" when energy is absorbed.

The affinity level Af is defined by an ionization potential Ip and an optical energy gap Eg(S) as follows.

$$Af=Ip-Eg(S)$$

Here, the ionization potential Ip refers to energy necessary for a compound of each material to remove electrons to ionize, for which a value measured with an ultraviolet ray photoelectron spectrometer (AC-3 manufactured by Riken Keiki Co., Ltd.).

The optical energy gap Eg(S) refers to a difference between a conduction level and a valence electron level. For instance, Eg(S) is a value obtained by converting into energy a wavelength value at an intersection of a long-wavelength-side tangent line in an absorbing spectrum of a toluene-diluted solution of each material and a base line in the absorbing spectrum obtained according to absorbance.

In the above aspect of the invention, the first host preferably has the polycyclic fused aromatic skeleton, and a minimum excited triplet energy gap of the first host is in a range from 2.1 eV to 2.7 eV.

Since the Eg(T) of the first host is in a range from 2.1 eV to 2.7 eV, the energy can be transferred to a phosphorescent dopant of which Eg(T) is 2.7 eV or less, more efficiently 2.5 eV or less to cause a phosphorescent emission.

While an anthracene derivative, which is well-known as a fluorescent host, is not suitably applied as a host for red-emitting phosphorescent dopant, the first host according to the invention, of which the Eg(T) is 2.1 eV or more, can be effectively applied for the red-emitting phosphorescent dopant to emit light.

However, while CBP, which is a conventionally-known phosphorescent host, can serve as the host even for a phosphorescent dopant for emitting light of a shorter wavelength than green, the first host according to the invention with the Eg(T) of 2.7 eV or less can be used for a green-emitting phosphorescent dopant but cannot be used for a phosphorescent dopant for emitting light of a shorter wavelength than green.

Traditionally, the host material is selected in terms of wide application to a variety of phosphorescent dopants ranging from a phosphorescent dopant that exhibits blue phosphorescent emission to a phosphorescent dopant that exhibits red phosphorescent emission. Accordingly, CBP and the like that exhibit a large Eg(T) has been used as a host.

However, though the Eg(T) of CBP is large, the emission lifetime is shortened.

In this respect, since the ring-forming atoms (not counting atom(s) of substituent(s)) of the polycyclic fused aromatic skeleton is in a range from 10 to 30 and the Eg(T) is in a range from 2.1 eV to 2.7 eV in the above aspect of the invention, though the compound is not applicable as a host for blue light (i.e. with wide gap), the compound serves as a host for a phosphorescent dopant of 2.7 eV or less.

Further, when the Eg(T) is too large as is exhibited by CBP, the difference between the Eg(T) of the phosphorescent dopant and the Eg(T) of the host to a red-emitting phosphorescent dopant becomes too large to prohibit an efficient intermolecular energy transfer.

On the other hand, since the Eg(T) of the first host of the invention is suitable for a red-emitting phosphorescent dopant, the energy can be efficiently transferred from the host to the phosphorescent dopant, thus providing an extremely efficient phosphorescent-emitting layer.

The Eg(T) of a material is defined based on, for instance, a phosphorescence spectrum.

The Eg(T) may be exemplarily defined as follows.

Specifically, each material is dissolved in an EPA solvent (diethylether:isopentane:ethanol=5:5:2 in volume ratio) at a concentration of 10 μmol/L, thereby forming a sample for phosphorescence measurement.

The sample for phosphorescence measurement is put into a quartz cell and is cooled to 77 K.

Excitation light is irradiated to the sample and the wavelength of emitted phosphorescence is measured.

A tangent line is drawn to be tangent to a rising section adjacent to short-wavelength of the obtained phosphorescence spectrum, a wavelength value at an intersection of the tangent line and a base line obtained from absorbance is obtained.

The value of the obtained wavelength value converted into energy is defined as the Eg(T).

For the measurement, for instance, a commercially-available measuring equipment F-4500 (manufactured by Hitachi, Ltd.) may be used.

However, the Eg(T) does not need to be defined by the above method, but may be defined by any other suitable method as long as such a method is compatible with the invention.

Preferably in the aspect of the invention, the polycyclic fused aromatic skeleton is present in a chemical structure formula as a divalent or multivalent group.

Examples of the substituent for the polycyclic fused aromatic skeleton are halogen atom, hydroxyl group, substituted or unsubstituted amino group, nitro group, cyano group, substituted or unsubstituted alkyl group, substituted or unsubstituted alkenyl group, substituted or unsubstituted cycloalkyl group, substituted or unsubstituted alkoxy group, substituted or unsubstituted aromatic hydrocarbon group, substituted or unsubstituted aromatic heterocyclic group, substituted or unsubstituted aralkyl group, substituted or unsubstituted aryloxy group, substituted or unsubstituted alkoxycarbonyl group, and carboxyl group.

When the polycyclic fused aromatic skeleton includes a plurality of substituents, the substituents may form a ring.

Examples of the halogen atom are fluorine, chlorine, bromine and iodine.

The substituted or unsubstituted amino group is represented by $-NX^1X^2$. $X^1$ and $X^2$ each independently and exemplarily represent a hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted alkyl group are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted alkenyl group are vinyl group, allyl group, 1-butenyl group, 2-butenyl group, 3-butenyl group, 1,3-butanedienyl group, 1-methylvinyl group, styryl group, 4-diphenylaminostyryl group, 4-di-p-tolylaminostyryl group, 4-di-m-tolylaminostyryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group, and 3-phenyl-1-butenyl group.

Examples of the substituted or unsubstituted cycloalkyl group are cyclopropyl group, cyclobutyl group, cyclopentyl group, cyclohexyl group, and 4-methylcyclohexyl group.

The substituted or unsubstituted alkoxy group is represented by —OY. Examples of Y are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or unsubstituted aromatic hydrocarbon group are a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, and 4"-t-butyl-p-terphenyl-4-yl group.

Examples of the substituted or unsubstituted heterocyclic group are a 1-pyroryl group, 2-pyroryl group, 3-pyroryl group, pyrazinyl group, 2-pyridiny group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthrydinyl group, 2-phenanthrydinyl group, 3-phenanthrydinyl group, 4-phenanthrydinyl group, 6-phenanthrydinyl group, 7-phenanthrydinyl group, 8-phenanthrydinyl group, 9-phenanthrydinyl group, 10-phenanthrydinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, -1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-3-yl group, -3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, 4-t-butyl-3-indolyl group and the like.

Examples of the substituted or unsubstituted aralkyl group are a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrorylmethyl group, 2-(1-pyroryl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The substituted or unsubstituted aryloxy group is represented by —OZ. Examples of Z include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a 2-pyrrolyl group, a 3-pyrrolyl group, a pyrazinyl group, a 2-pyrizinyl group, a 3-pyrizinyl group, a 4-pyrizinyl group, a 2-indolyl group, a 3-indolyl group, a 4-indolyl group, a 5-indolyl group, a 6-indolyl group, a 7-indolyl group, a 1-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a 2-quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 1-phenoxazinyl group, a 2-phenoxazinyl group, a 3-phenoxazinyl group, a 4-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

The substituted or unsubstituted alkoxycarbonyl group are represented as —COOY. Examples of Y are methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Preferably in the aspect of the invention, the polycyclic fused aromatic skeleton has a substituent, and the substituent is a substituted or unsubstituted aryl group or a heteroaryl group.

By introducing an aryl group or a heteroaryl group as the substituent, the Eg(T) can be adjusted and molecular associate can be prevented. Thus, the lifetime can be prolonged.

In the aspect of the invention, the substituent preferably has no carbazole skeleton.

When a substituent having a carbazole skeleton is introduced, the Eg(T) is largened due to increase in Ip, and thus such a material becomes applicable as a host for a phosphorescent dopant for emission of a shorter wavelength. However, introduction of a carbazole group, which is typically vulnerable to oxidation, may unfavorably lead to shorter lifetime.

In this respect, since the substituents having carbazole skeleton is excluded in the above aspect of the invention, though the Eg(T) is reduced, the lifetime can be prolonged.

In the above aspect of the invention, the polycyclic fused aromatic skeleton is preferably selected from the group consisting of a substituted or unsubstituted phenanthrene-diyl, chrysene-diyl, fluoranthene-diyl and triphenylene-diyl.

Further, the polycyclic fused aromatic skeleton is preferably substituted by a group including phenanthrene, chrysene, fluoranthene and triphenylene.

Preferably in the aspect of the invention, the polycyclic fused aromatic skeleton is represented by any one of formulae (1) to (4) as follows.

[Chemical Formula 1]

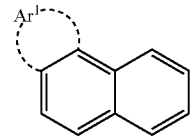

(1)

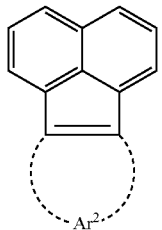
(2)

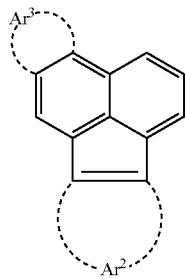
(3)

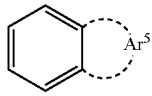
(4)

In the formulae (1) to (4), $Ar^1$ to $Ar^5$ each represent a substituted or unsubstituted fused cyclic structure having 4 to 10 ring-forming carbon atoms (not counting atom(s) of substituent(s)).

Examples of the compounds represented by the above formula (1) are substituted or unsubstituted phenanthrene and chrysene.

Examples of the compounds represented by the above formula (2) are substituted or unsubstituted acenaphthylene, acenaphthene and fluoranthene.

Examples of the compounds represented by the above formula (3) are substituted or unsubstituted benzofluoranthene.

Examples of the compounds represented by the above formula (4) are substituted or unsubstituted naphthalene.

Preferably in the aspect of the invention, the polycyclic fused aromatic skeleton is phenanthrene represented by the following formula (50) or its derivative.

[Chemical Formula 2]

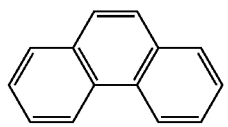
(50)

Examples of the substituent for the phenanthrene derivative are an alkyl group, cycloalkyl group, aralkyl group, alkenyl group, cycloalkenyl group, alkynyl group, hydroxyl group, mercapto group, alkoxy group, alkylthio group, arylether group, arylthioether group, aryl group, heterocyclic group, halogen, haloalkane, haloalkene, haloalkyne, cyano group, aldehyde group, carbonyl group, carboxyl group, ester group, amino group, nitro group, silyl group and siloxanyl group.

Examples of the phenanthrene derivative are those represented by the following formula (50A).

[Chemical Formula 3]

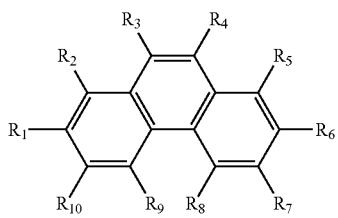
(50A)

In the formula (50A), $R_1$ to $R_{10}$ respectively independently represent: a hydrogen atom; a substituent including substituted or unsubstituted aryl group having 5 to 30 ring-forming carbon atoms (not counting carbon atom(s) of substituent(s)), branched or linear alkyl group having 1 to 30 carbon atoms or substituted or unsubstituted cycloalkyl group having 3 to 20 carbon atoms; or a combination of the substituents.

Examples of the phenanthrene derivative represented by the formula (50) are as follows.

[Chemical Formula 4]

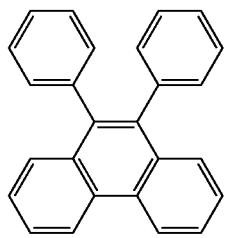 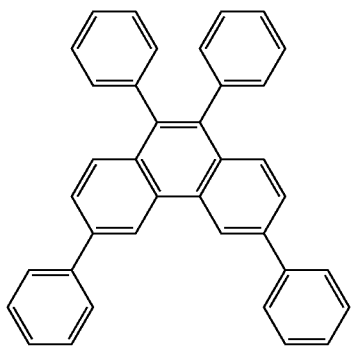 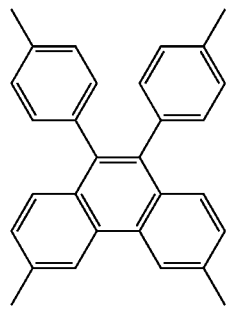

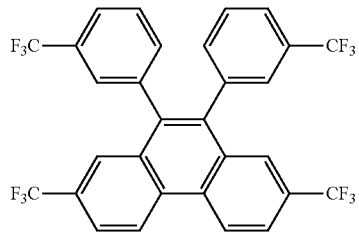 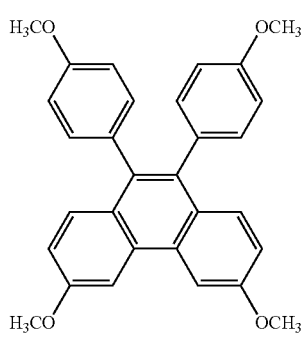 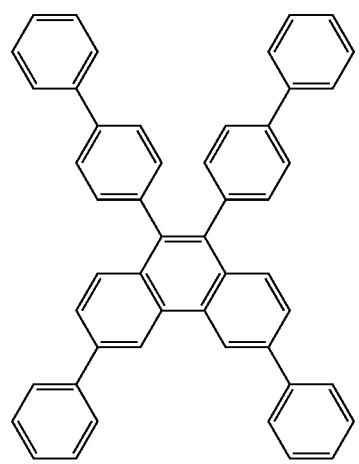
-continued
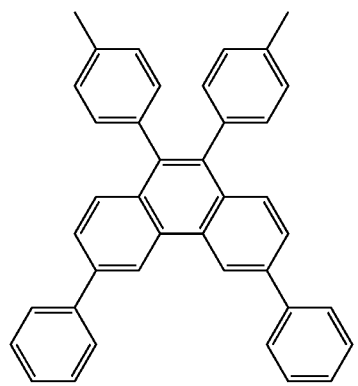
[Chemical Formula 5]
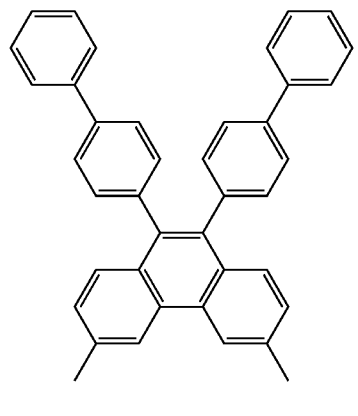 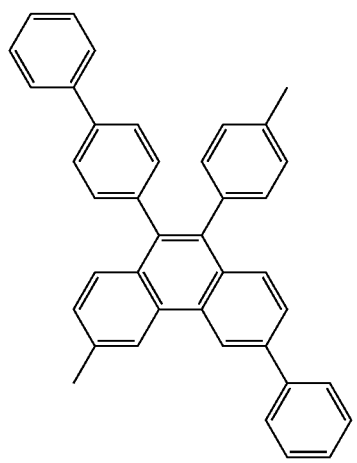 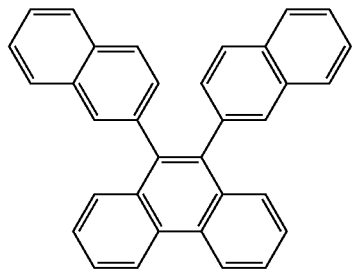
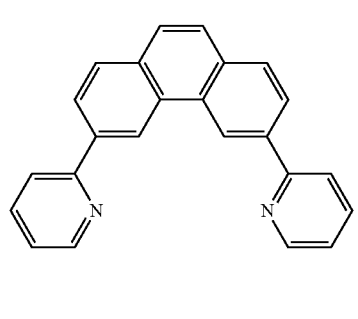 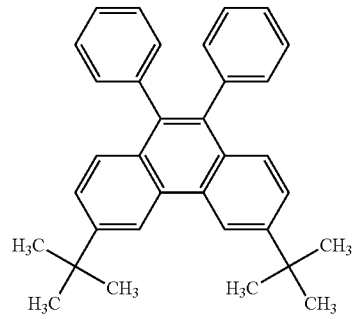

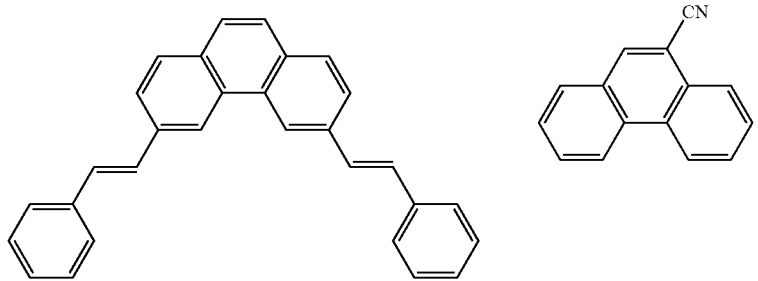
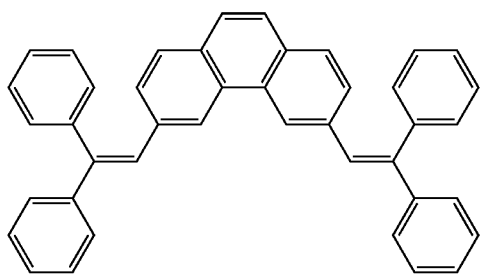
[Chemical Formula 6]
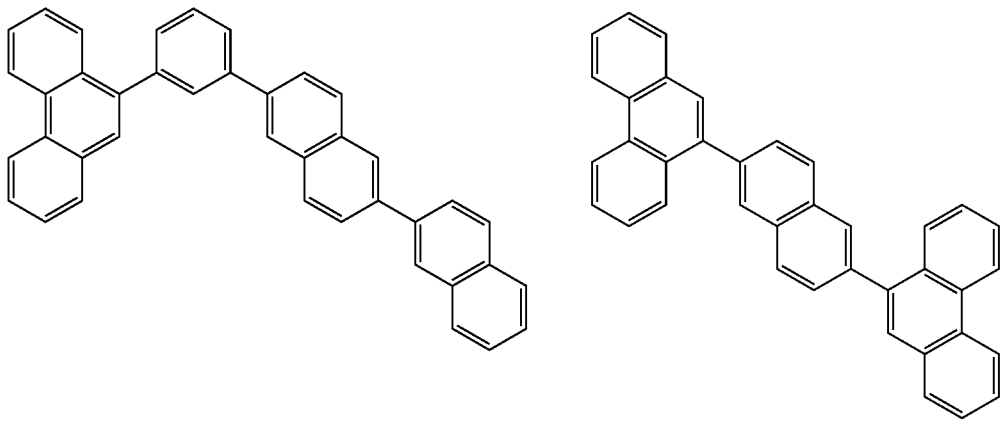
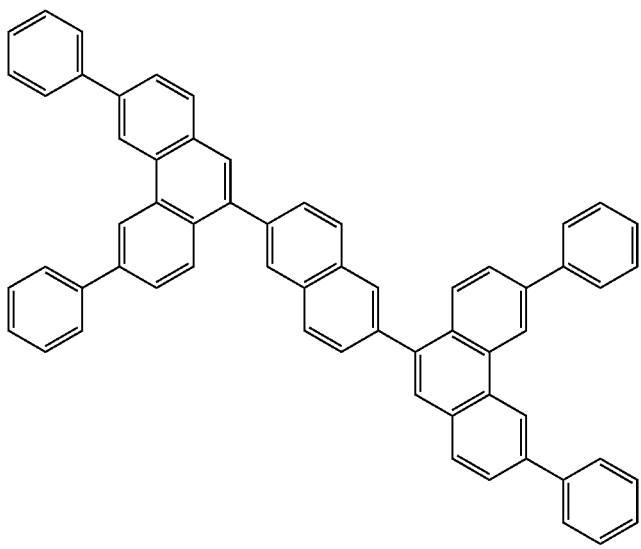

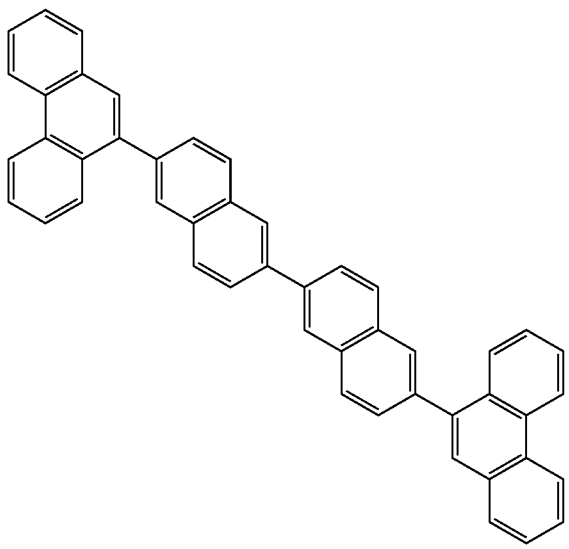
[Chemical Formula 7]
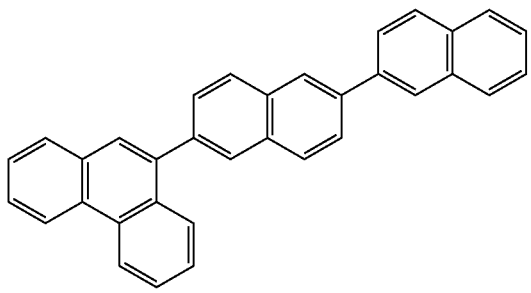 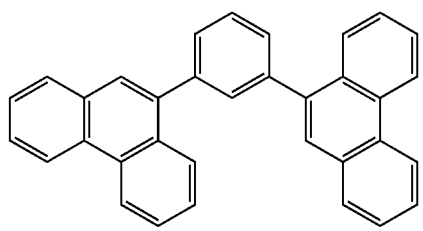
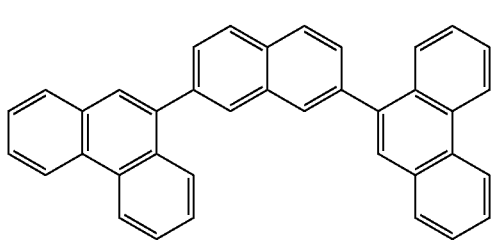 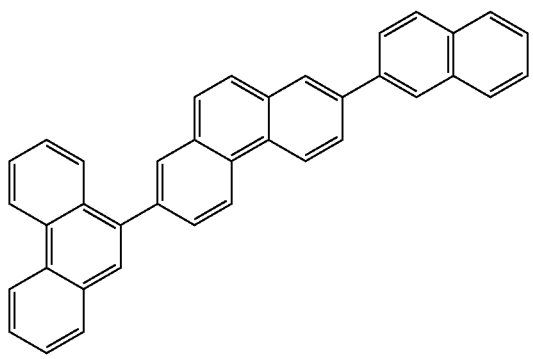
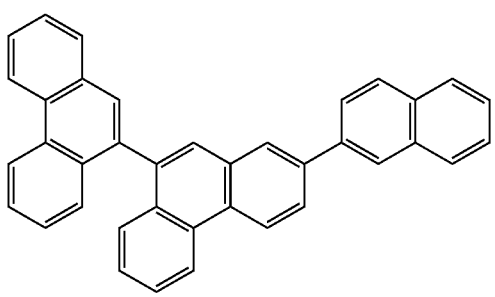 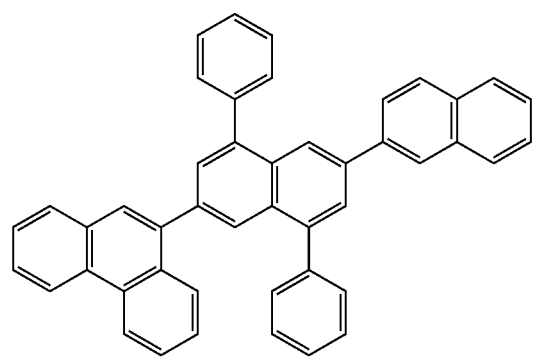

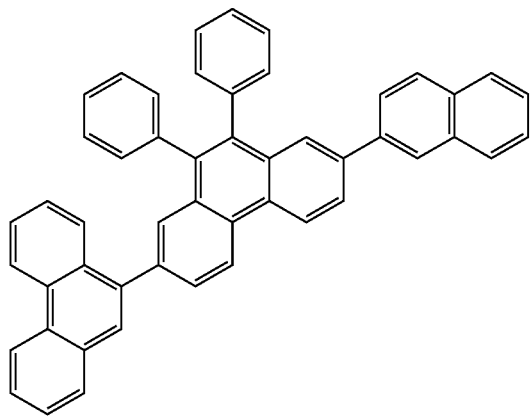
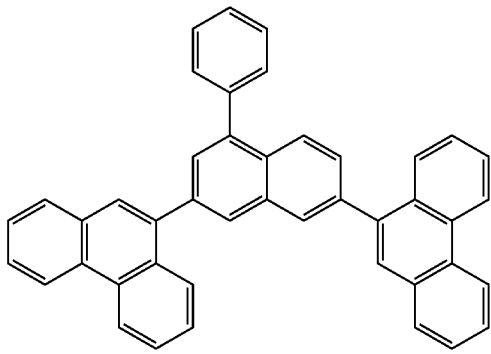
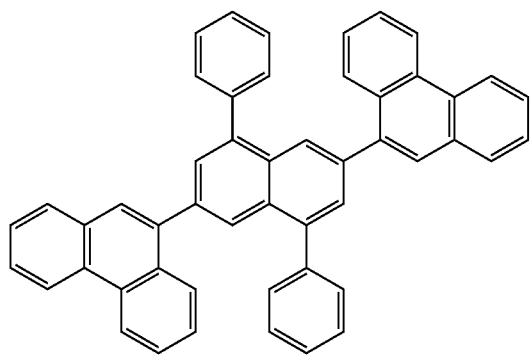
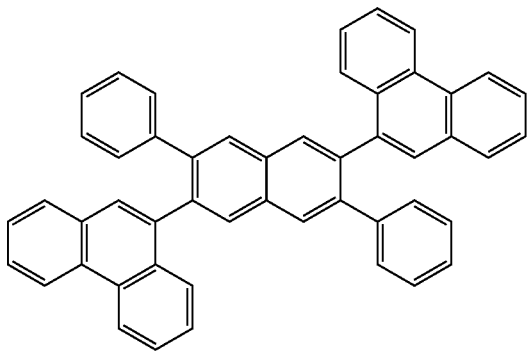
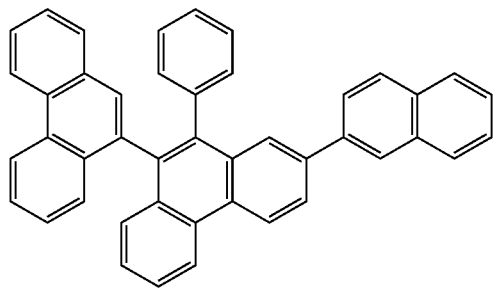
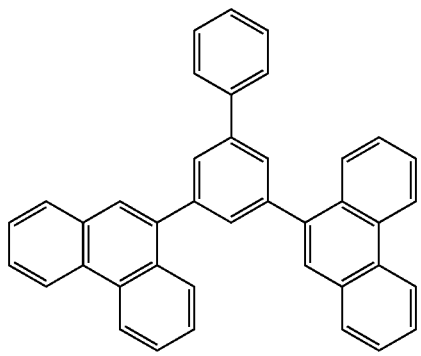
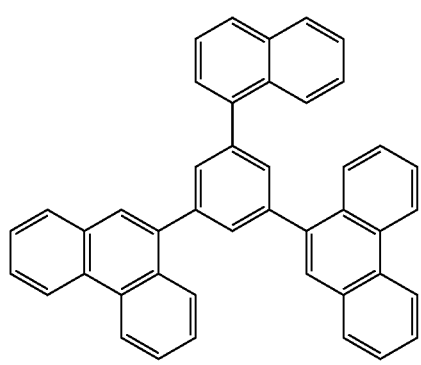
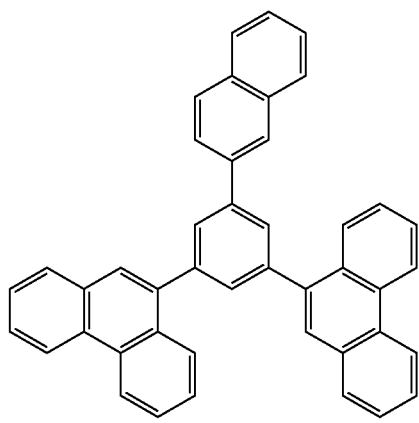

-continued
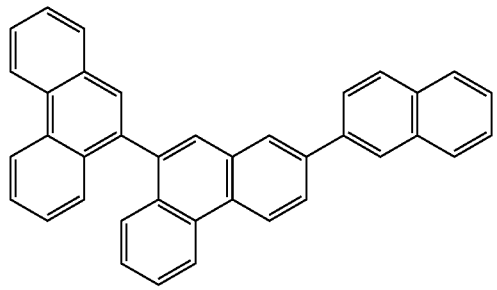
[Chemical Formula 8]

-continued
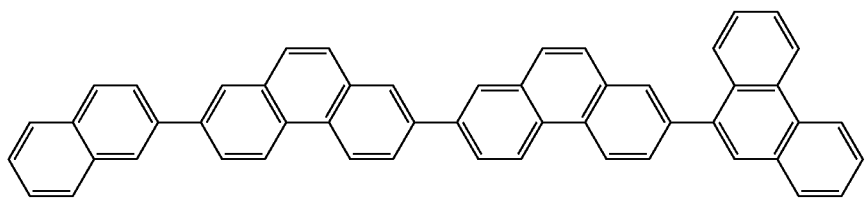
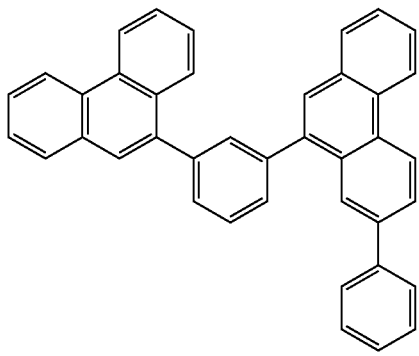
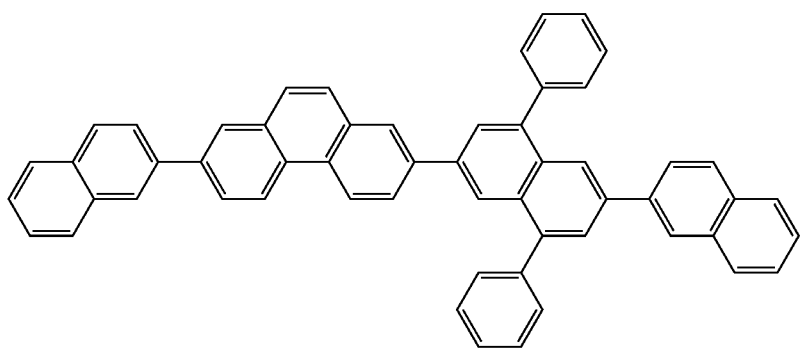
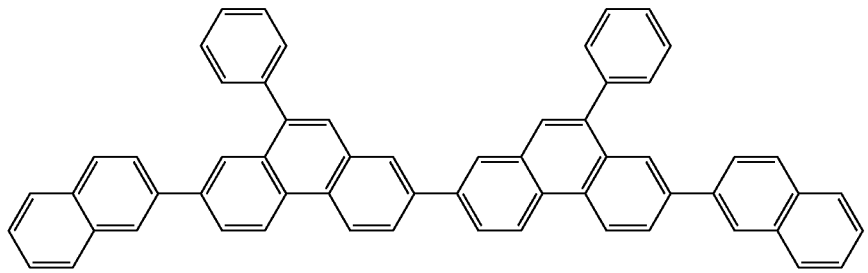
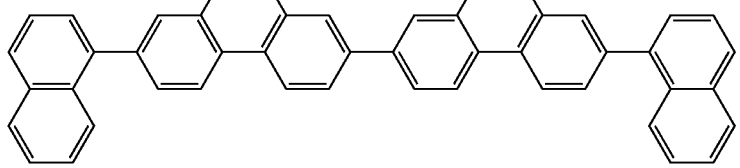
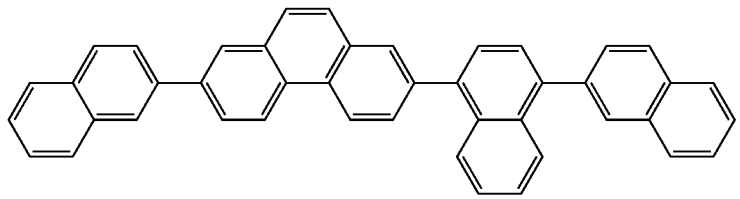

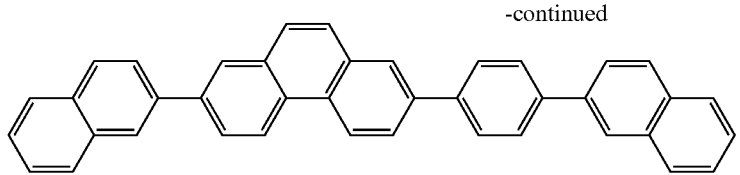
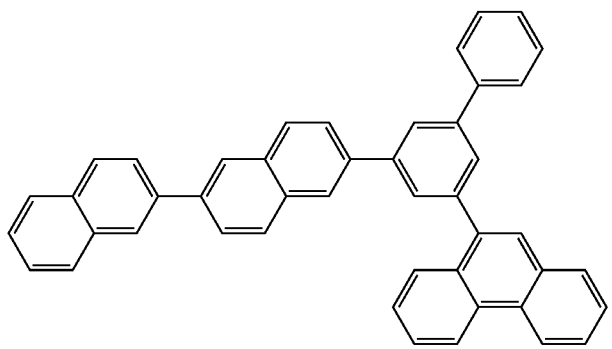
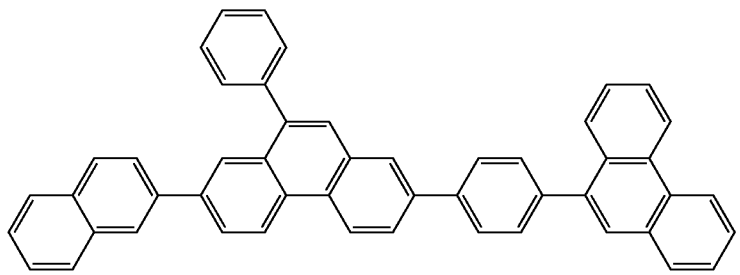
[Chemical Formula 9]
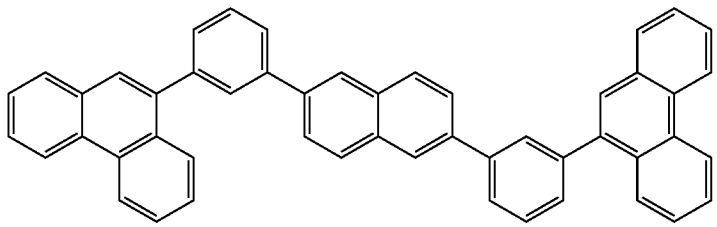
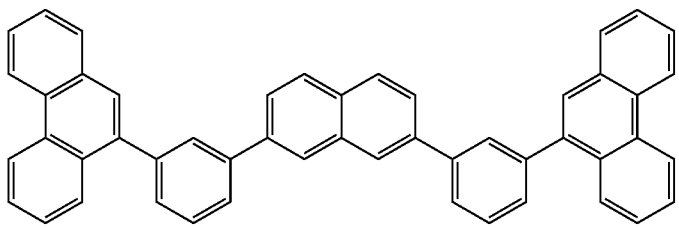
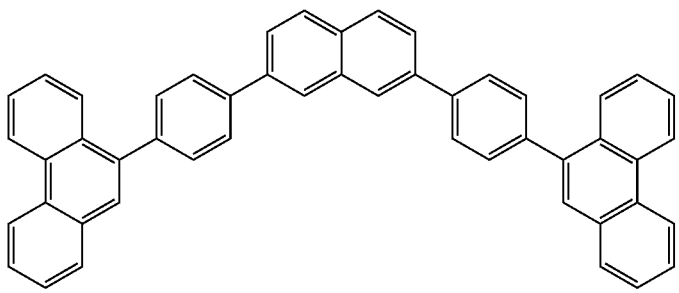

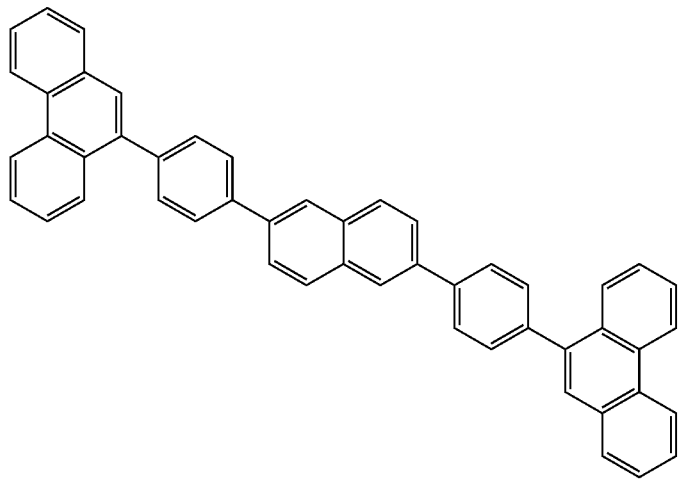
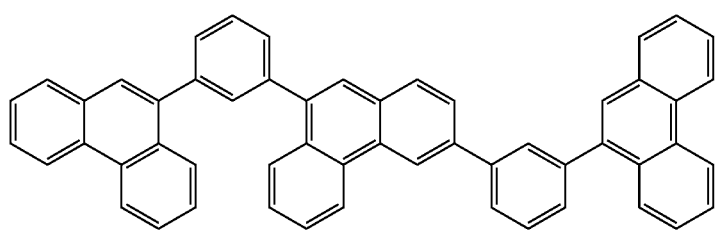
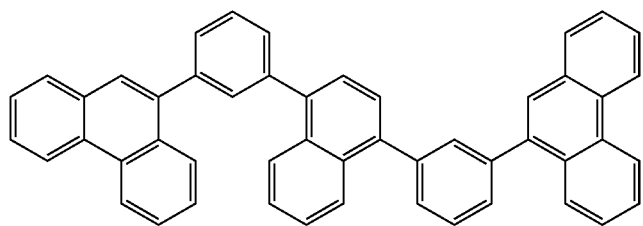
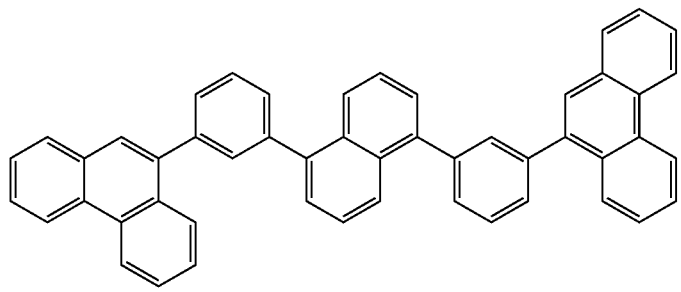
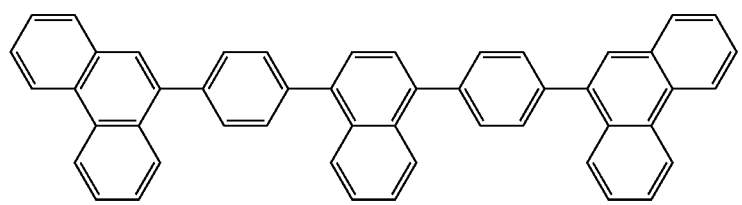

-continued
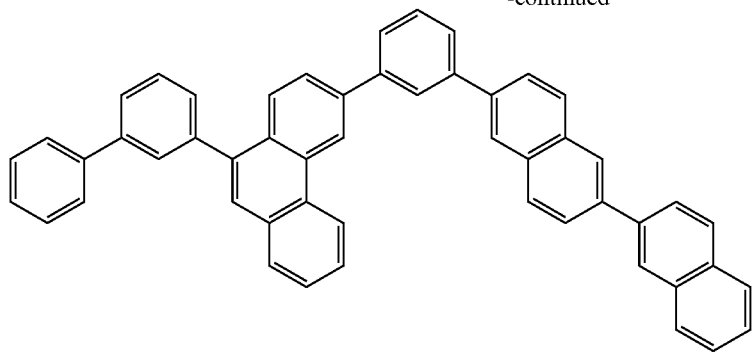
[Chemical Formula 10]
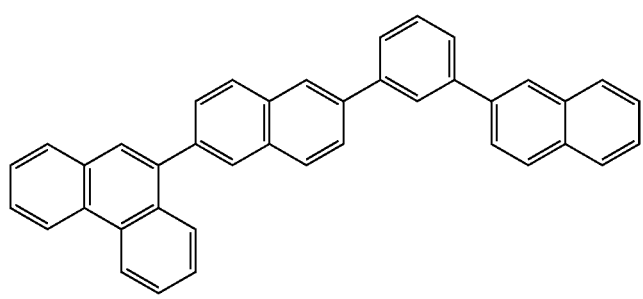
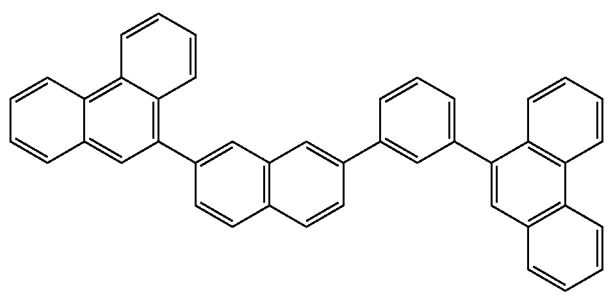
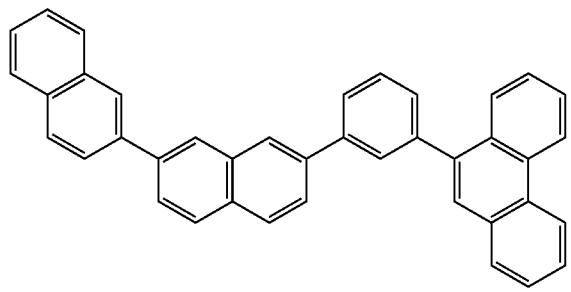
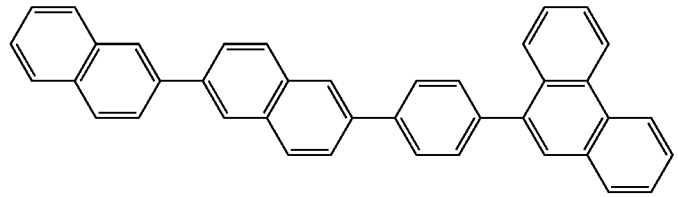
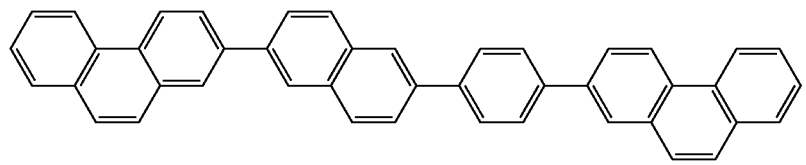

-continued
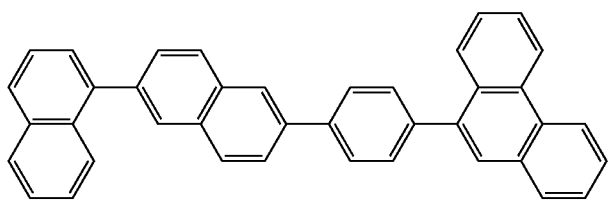
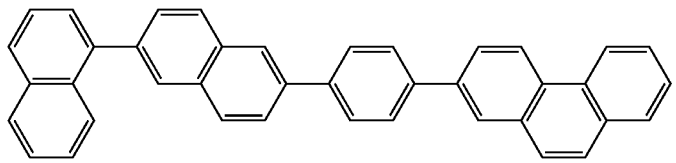
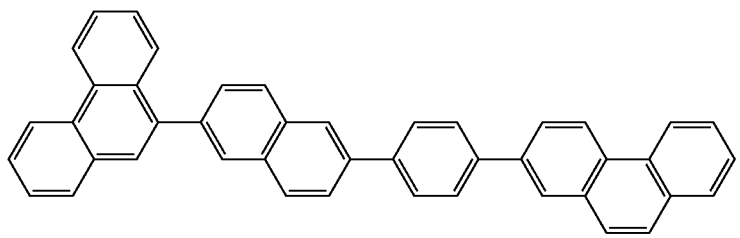
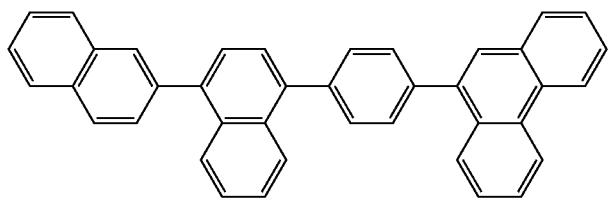
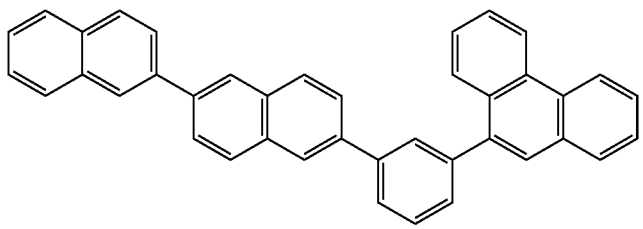
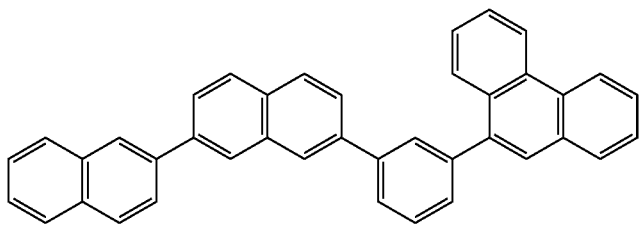
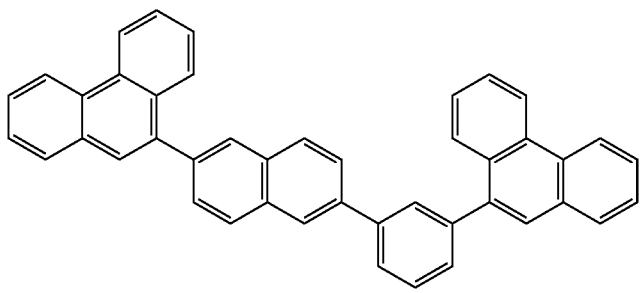

-continued
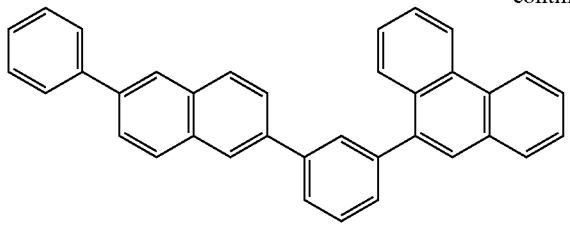
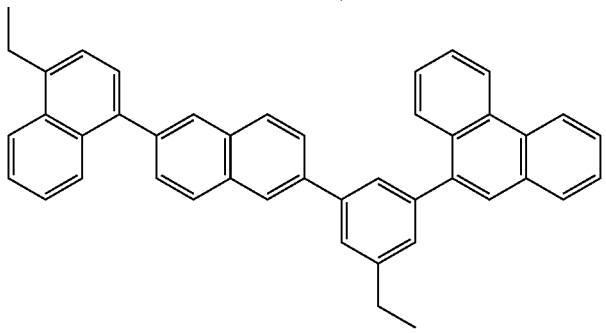
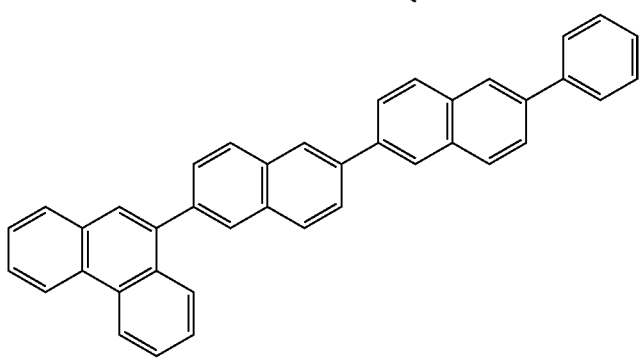
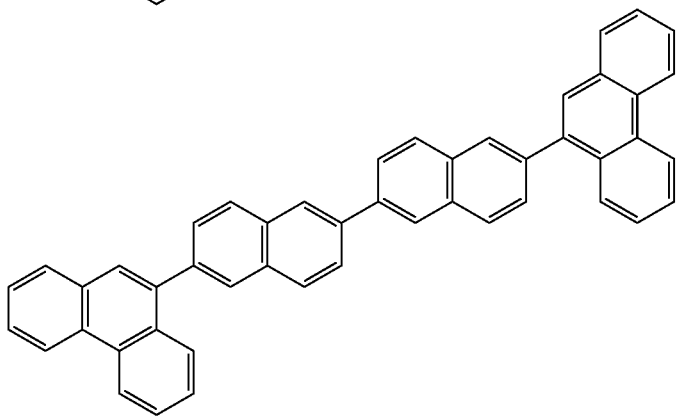
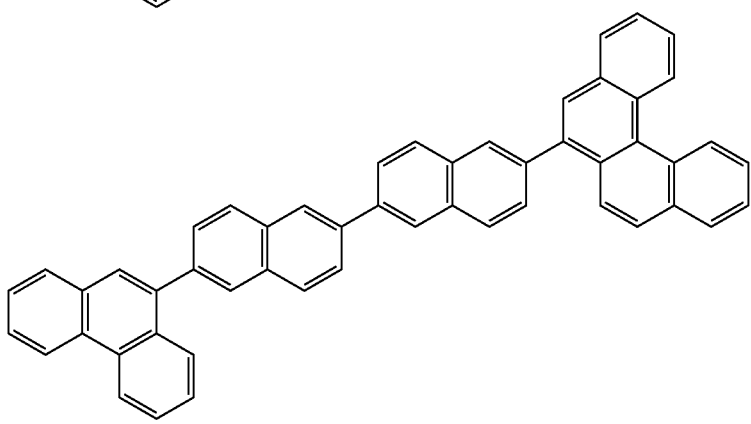

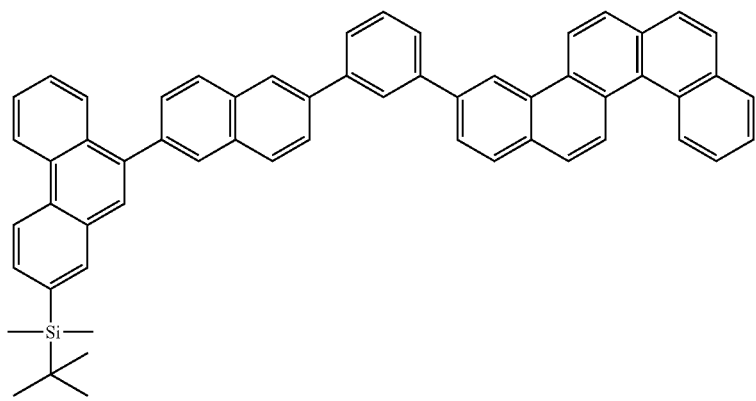
[Chemical Formula 11]
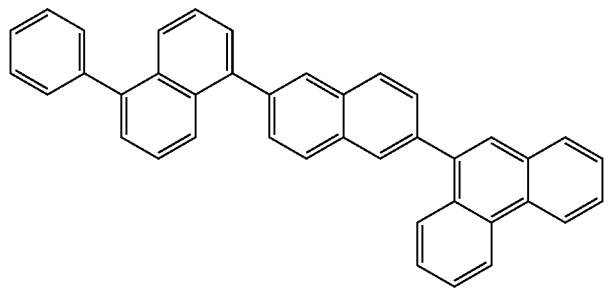
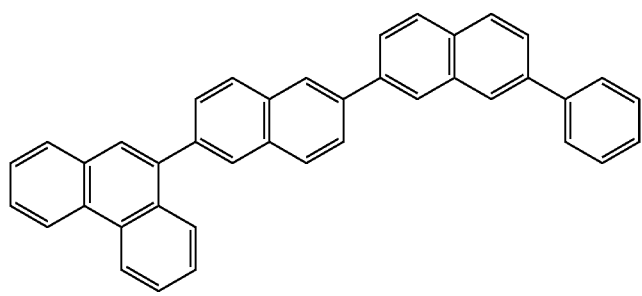
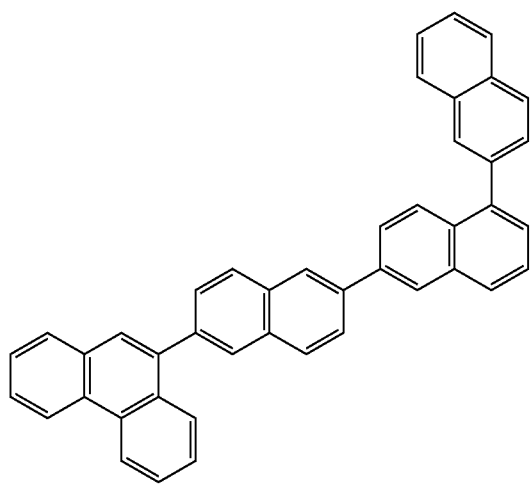

-continued
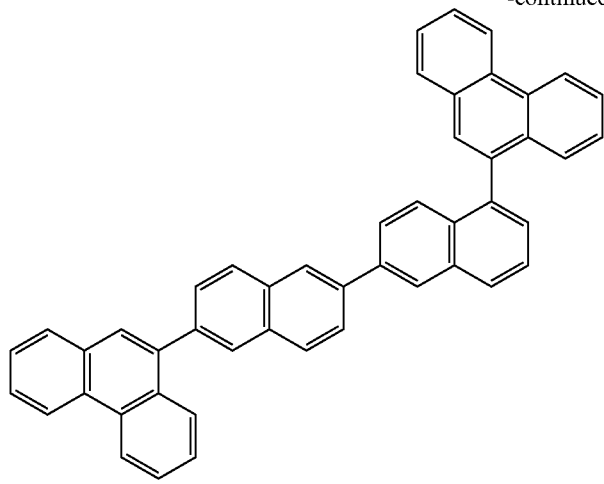
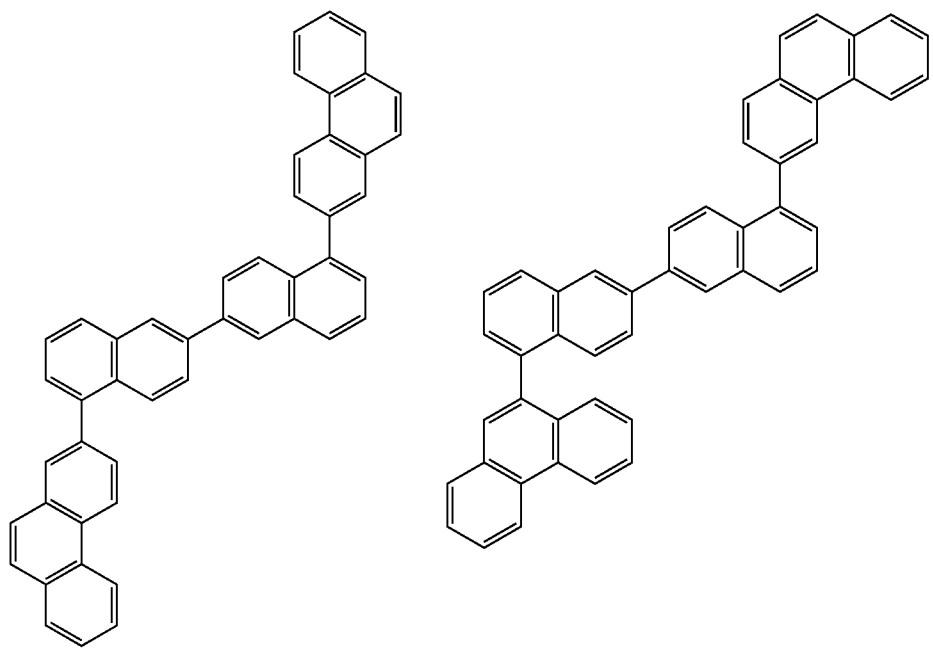
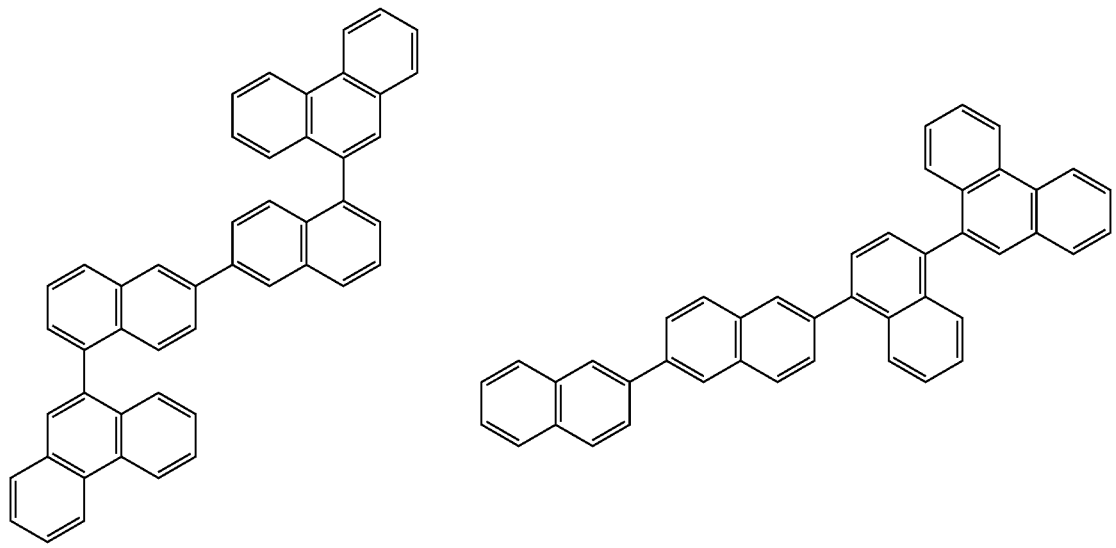

-continued
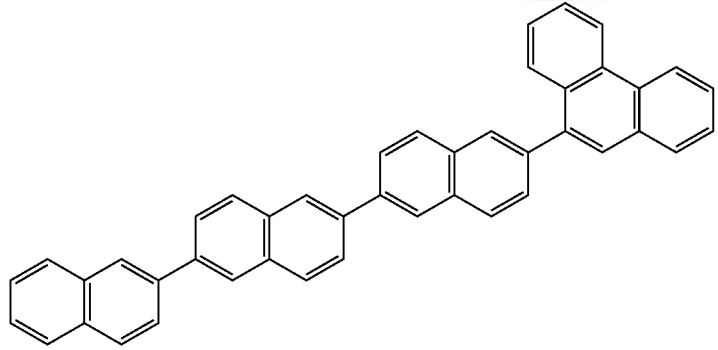
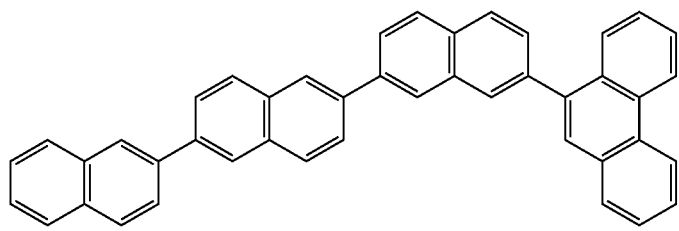
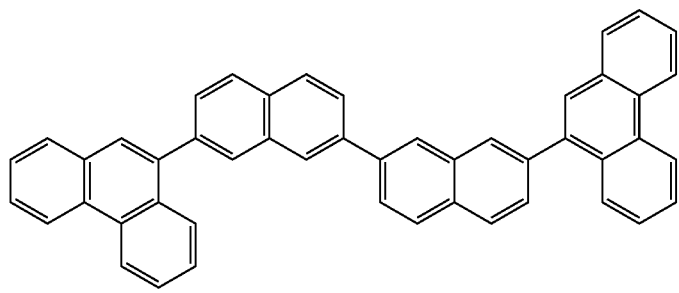
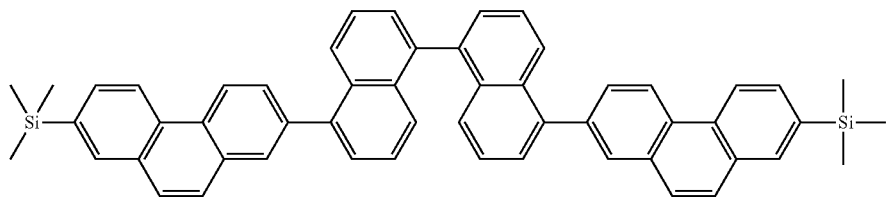
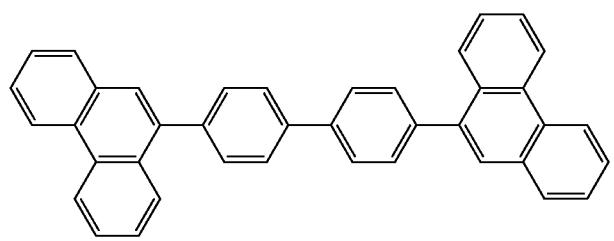
[Chemical Formula 12]
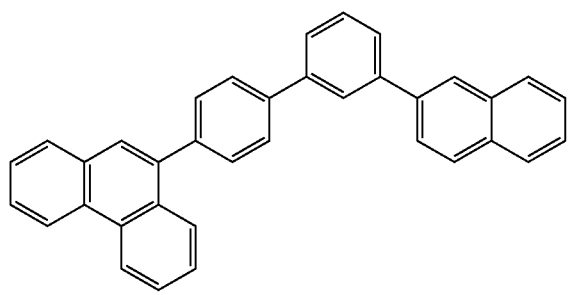

-continued
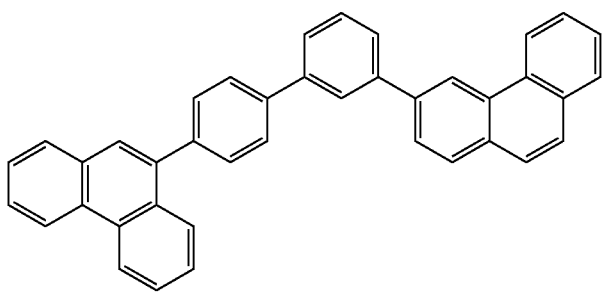
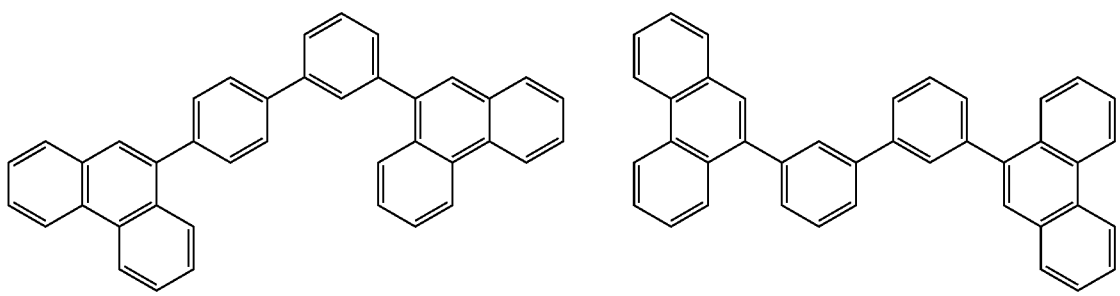
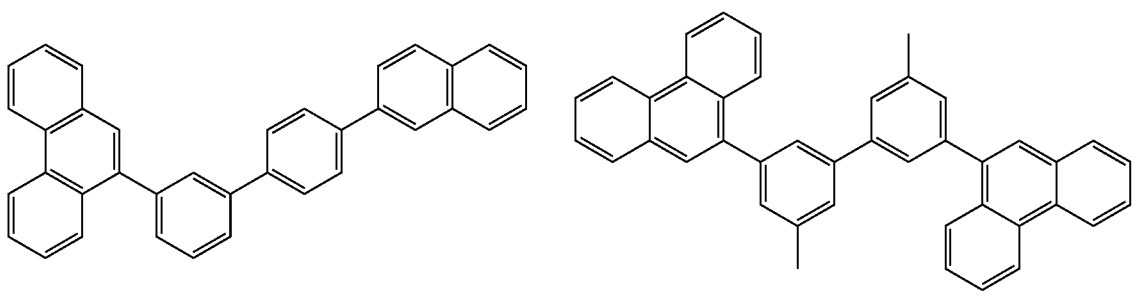
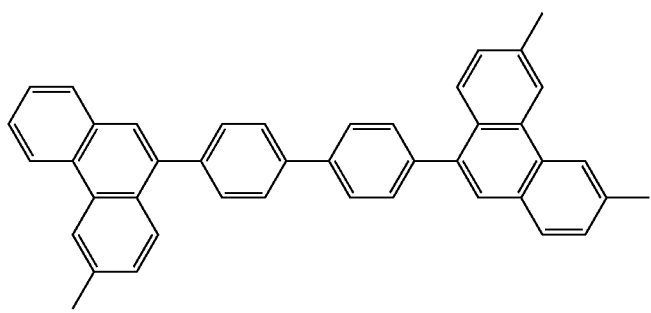
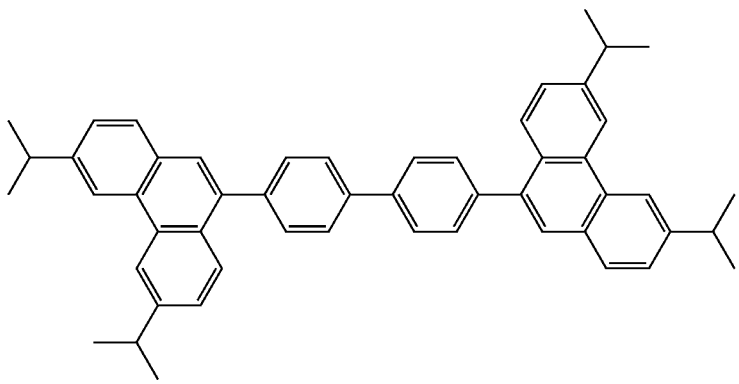

-continued
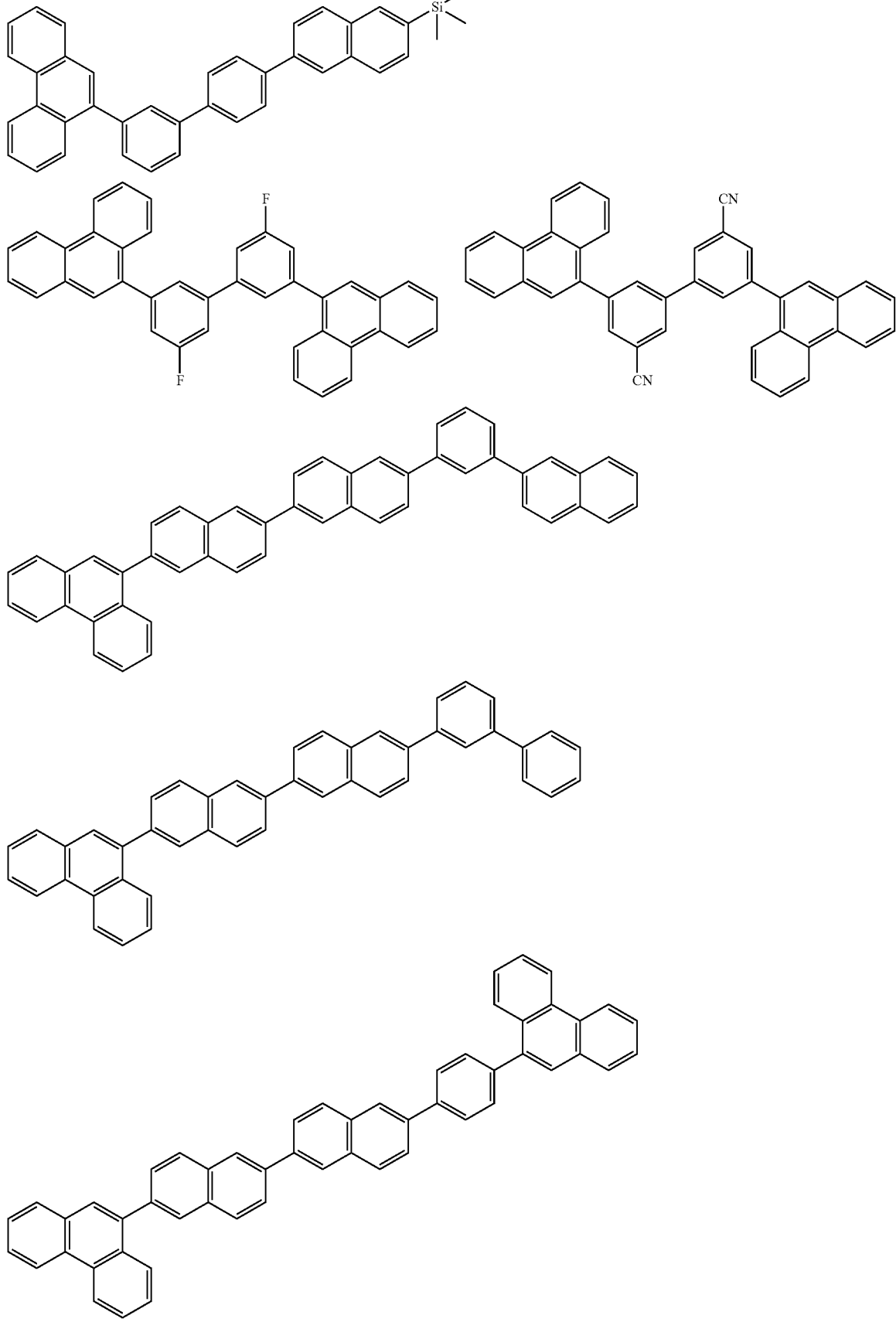

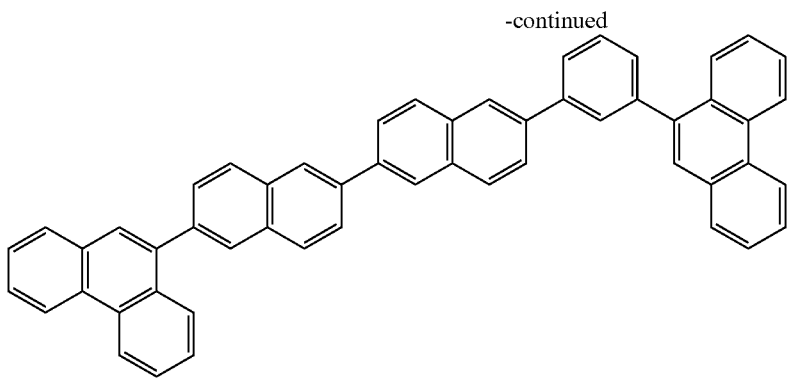

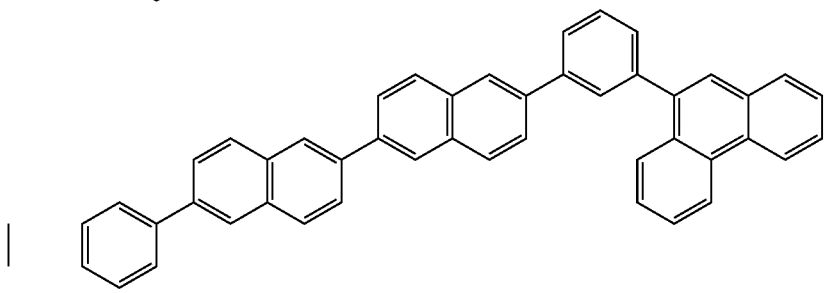

Preferably in the aspect of the invention, the polycyclic fused aromatic skeleton is chrysene represented by the following formula (51) or its derivative.

[Chemical Formula 13]

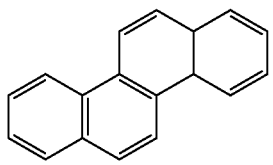
(51)

Examples of the chrysene derivative are those represented by the following formula (51A).

[Chemical Formula 14]

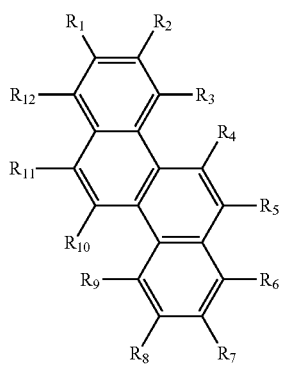
(51A)

In the formula (51A), $R_1$ to $R_{12}$ respectively independently represent: a hydrogen atom; a substituent including substituted or unsubstituted aryl group having 5 to 30 ring-forming carbon atoms (not counting carbon atom(s) of substituent(s)), branched or linear alkyl group having 1 to 30 carbon atoms or substituted or unsubstituted cycloalkyl group having 3 to 20 carbon atoms; or a combination of the substituents.

Examples of the chrysene derivative represented by the formula (51) are as follows.

[Chemical Formula 15]

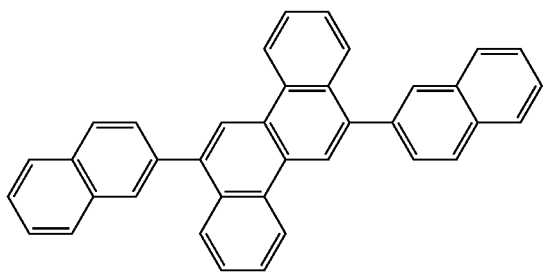 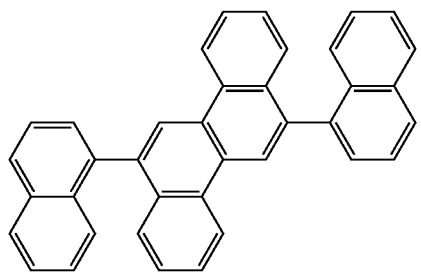

-continued
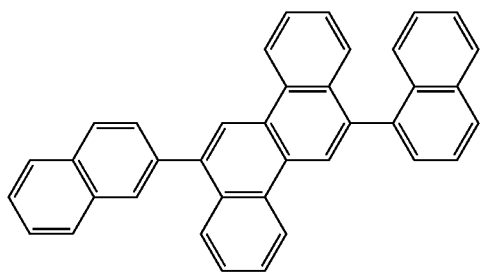
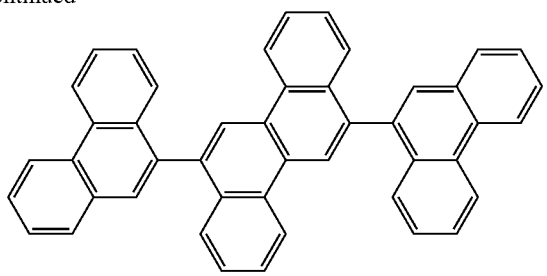
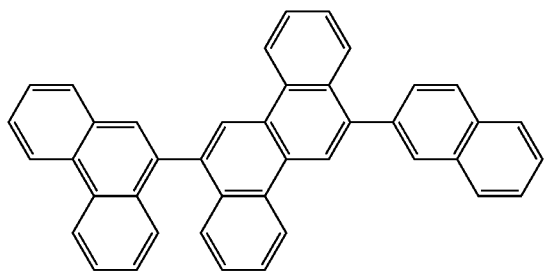
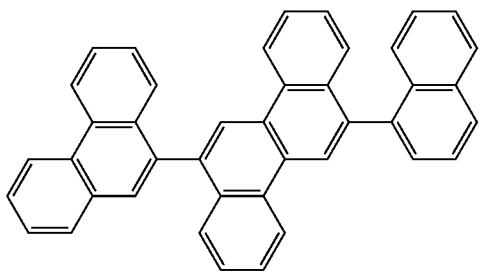
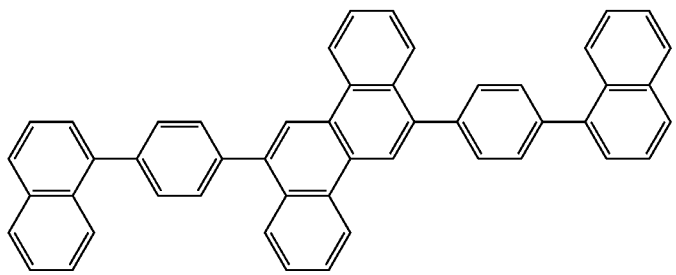
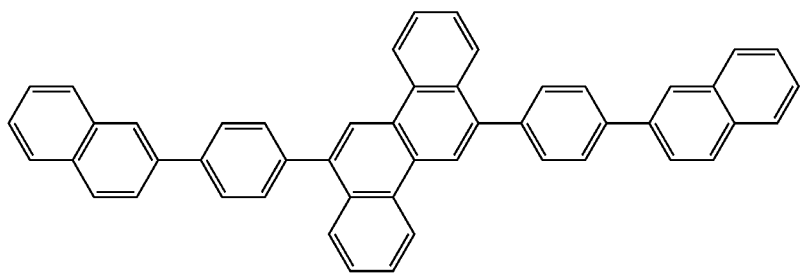
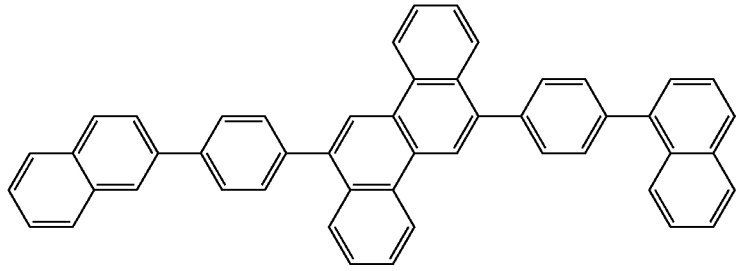
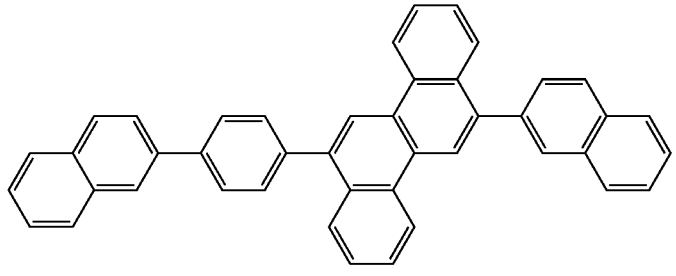

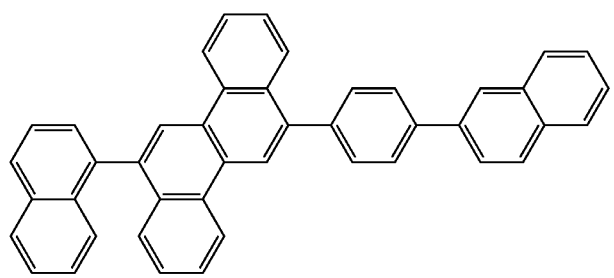
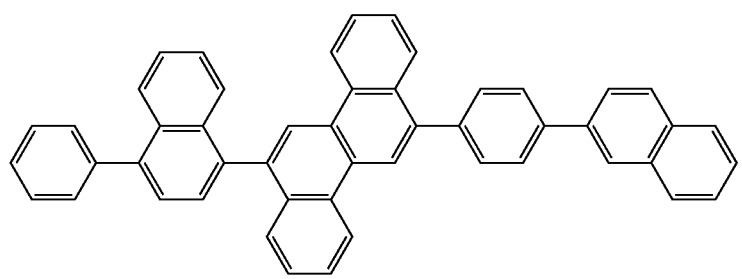
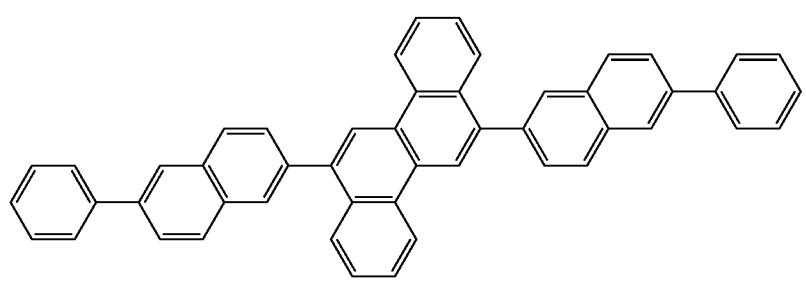
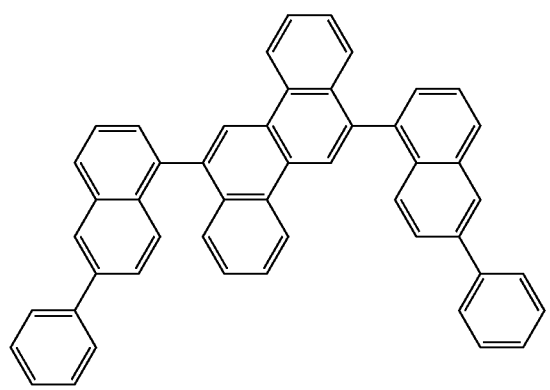
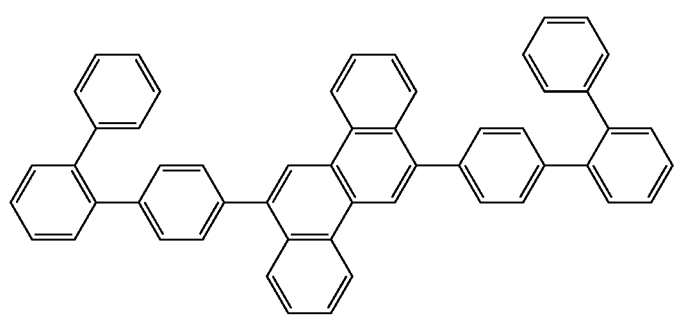

[Chemical Formula 16]
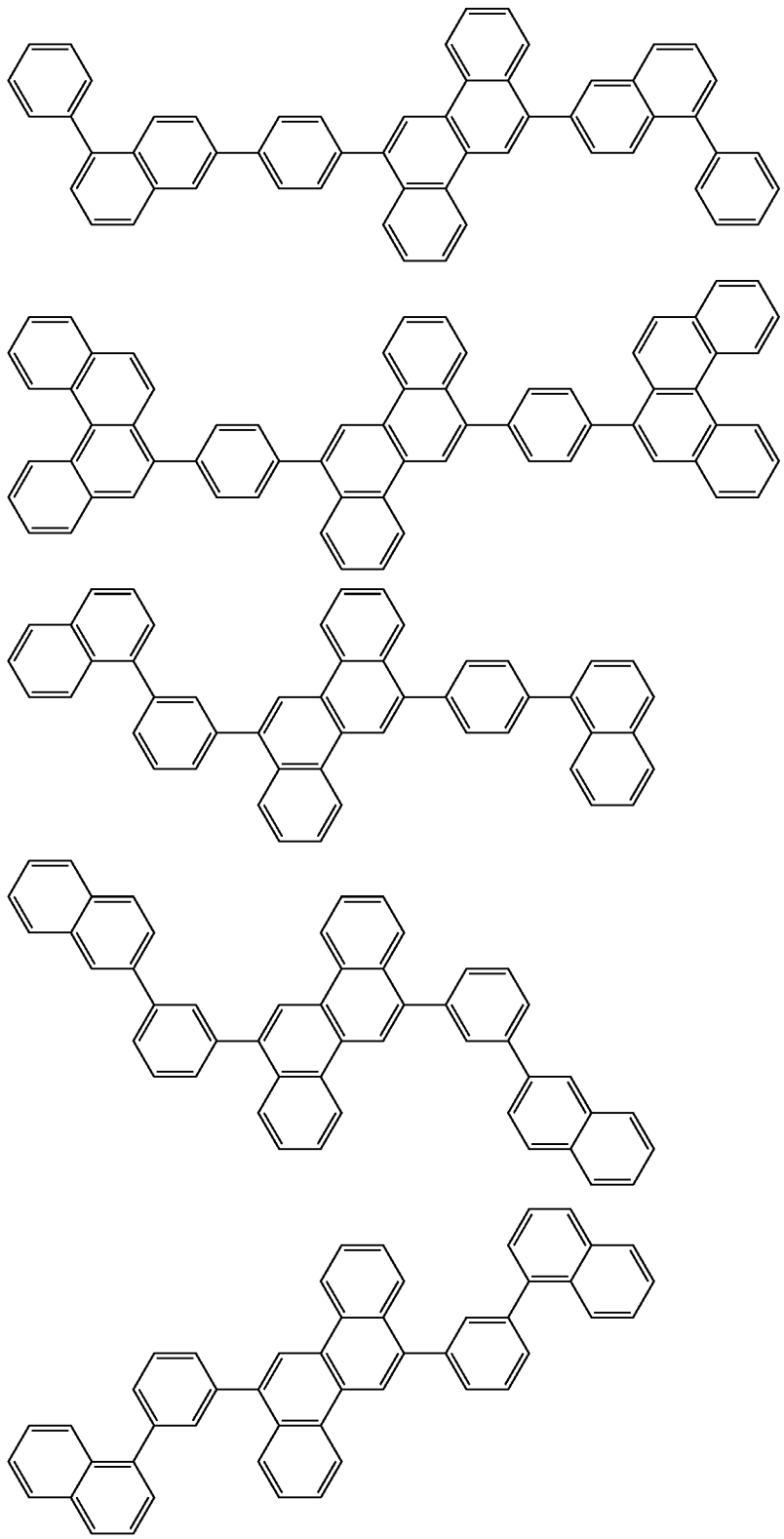

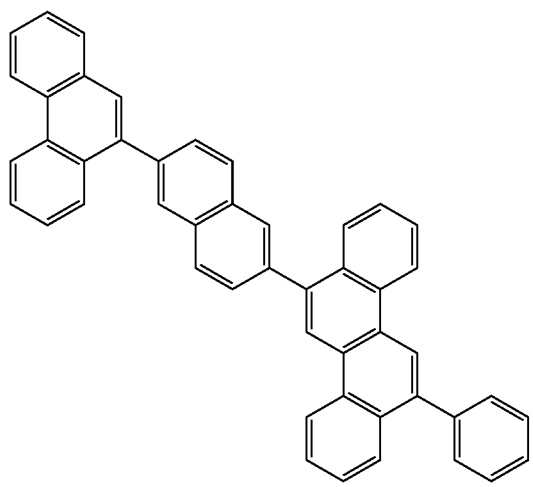
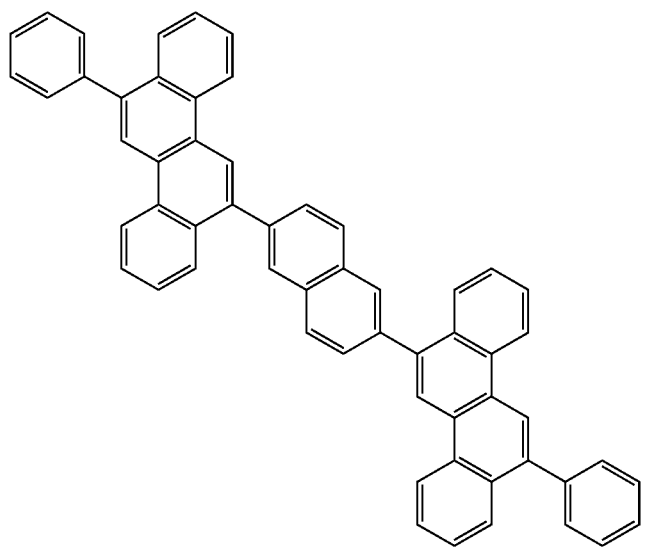
[Chemical Formula 17]
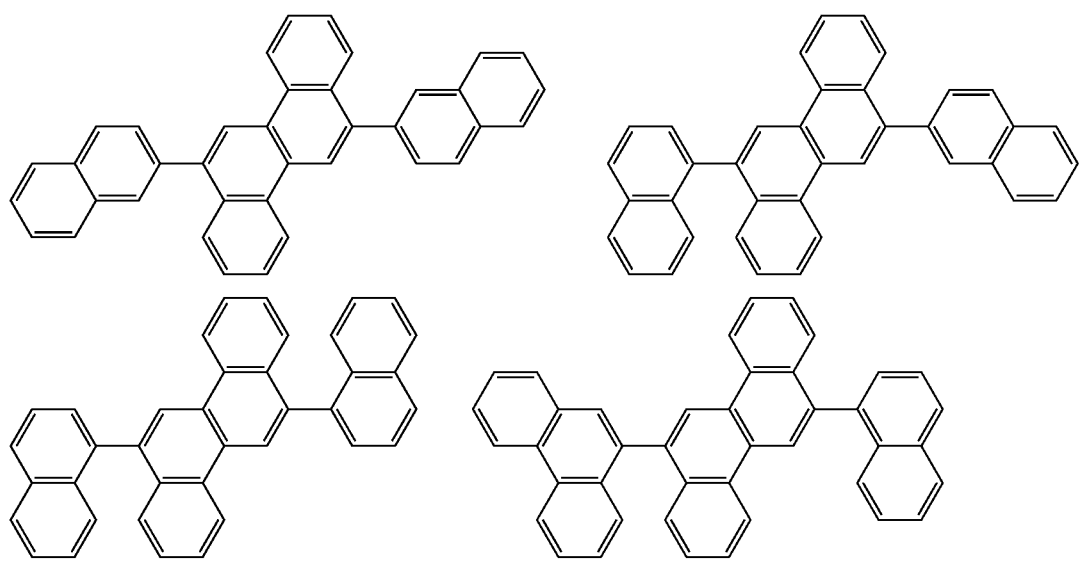

-continued
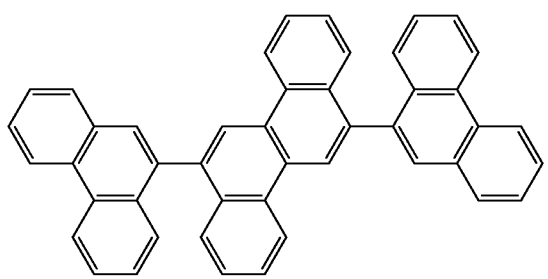

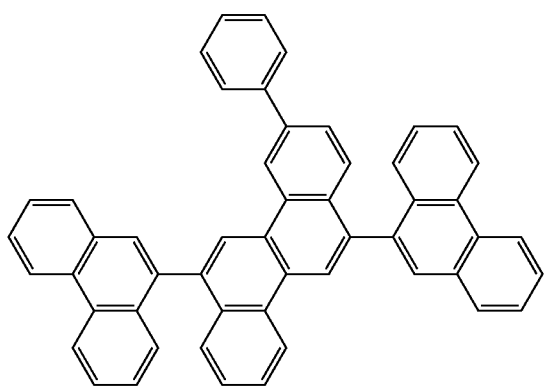
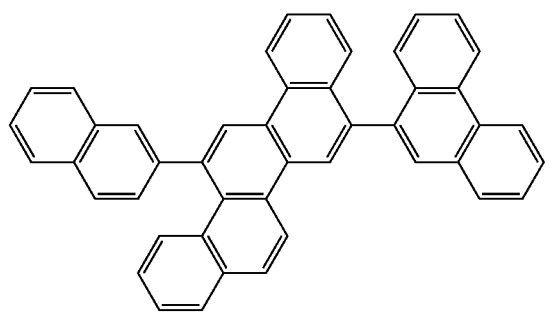
[Chemical Formula 18]
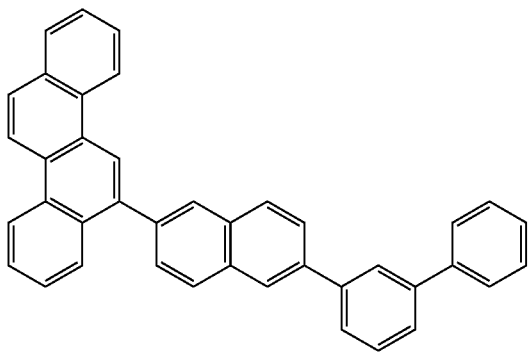
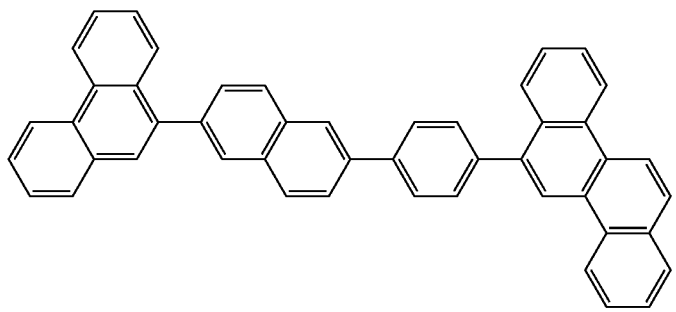
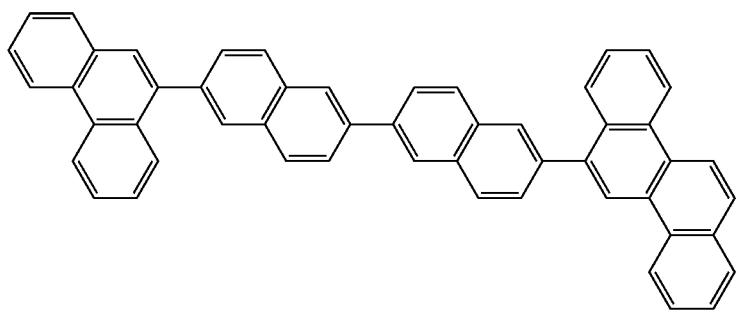

-continued
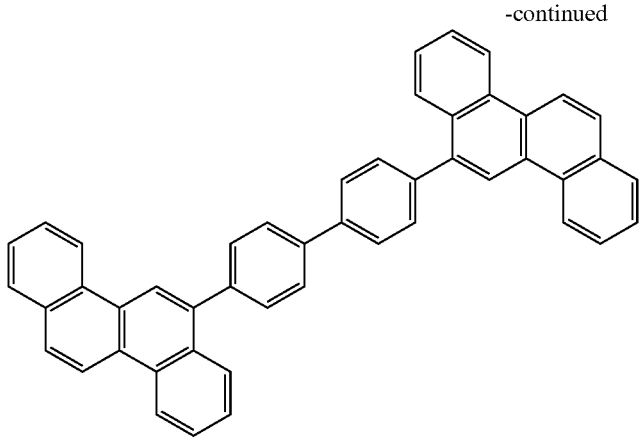
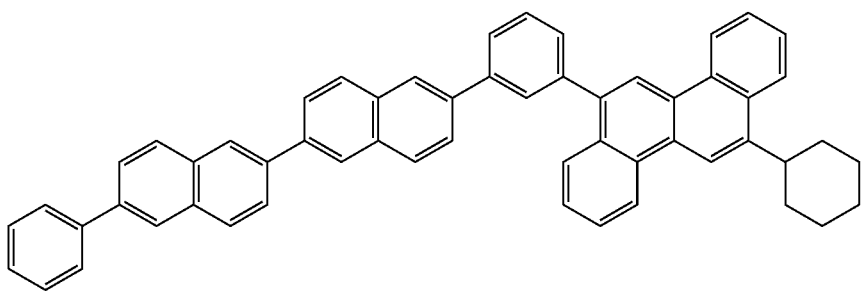
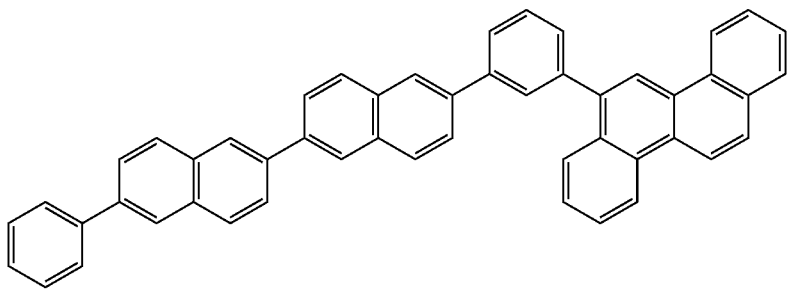
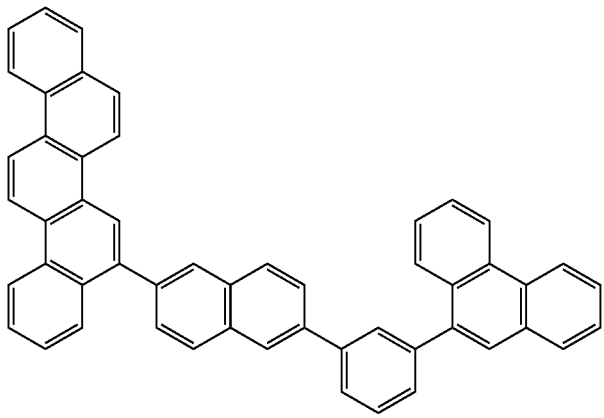

Preferably in the aspect of the invention, the polycyclic fused aromatic skeleton is a compound represented by the following formula (52) (benzo[c]phenanthrene) or its derivative.

[Chemical Formula 19]

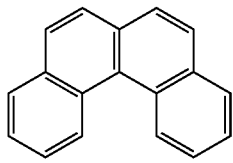

(52)

Examples of the benzo[c]phenanthrene derivative are those represented by the following formula (52A).

[Chemical Formula 20]

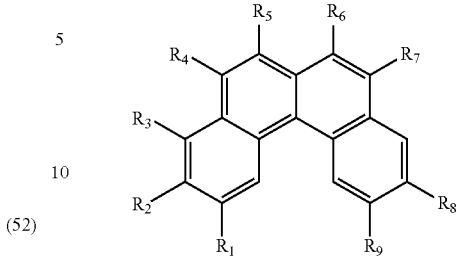

(52A)

In the formula (52A), $R_1$ to $R_9$ respectively independently represent: a hydrogen atom; a substituent including substituted or unsubstituted aryl group having 5 to 30 ring-forming carbon atoms (not counting carbon atom(s) of substituent(s)), branched or linear alkyl group having 1 to 30 carbon atoms or substituted or unsubstituted cycloalkyl group having 3 to 20 carbon atoms; or a combination of the substituents.

Examples of the benzo[c]phenanthrene derivative represented by the formula (52) are as follows.

[Chemical Formula 21]

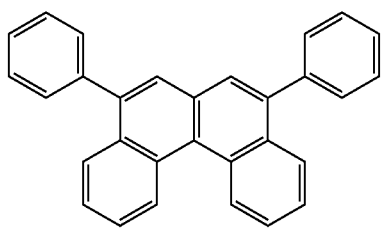

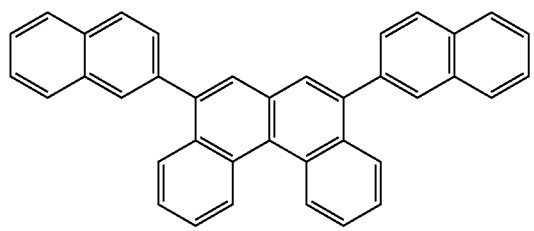

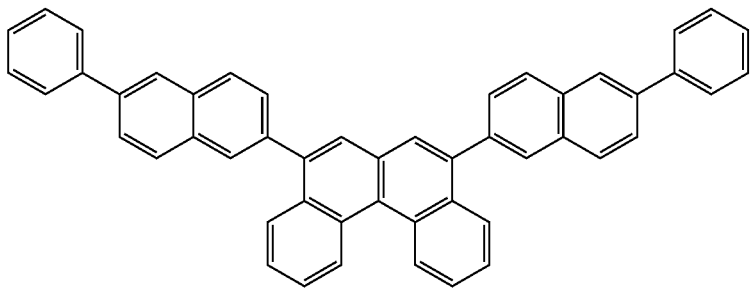

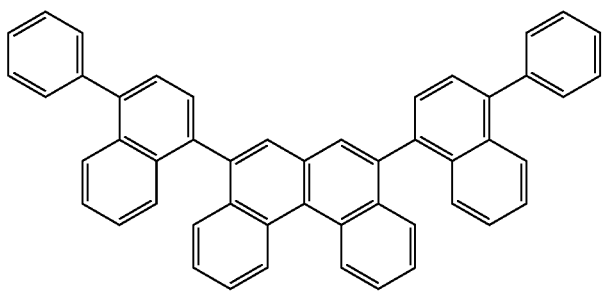

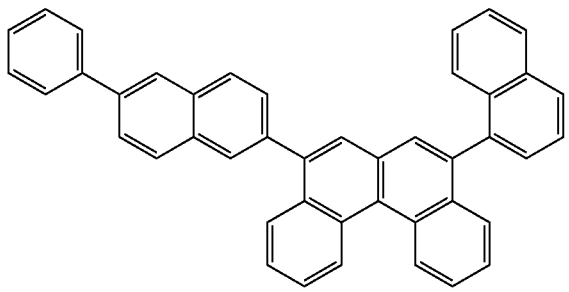
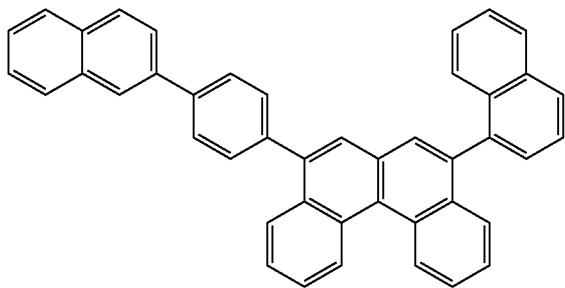
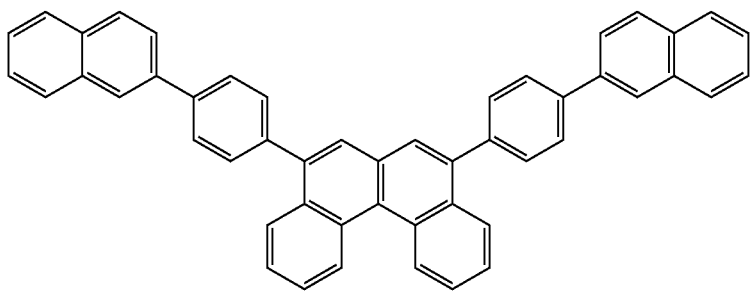
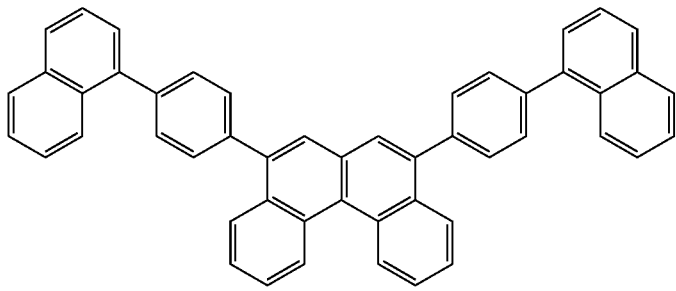
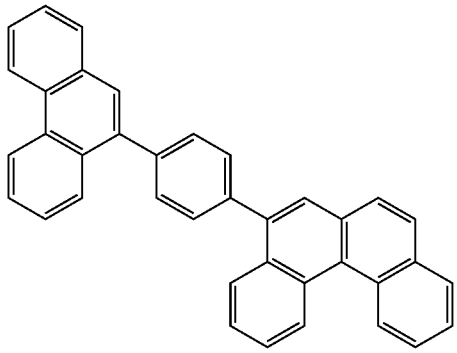

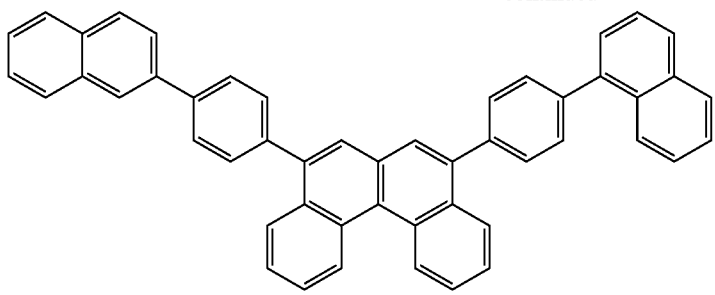
[Chemical Formula 22]
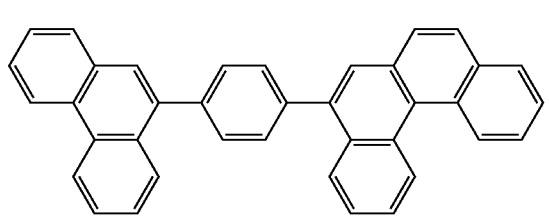
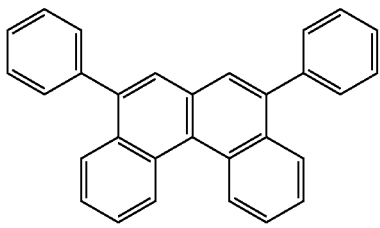
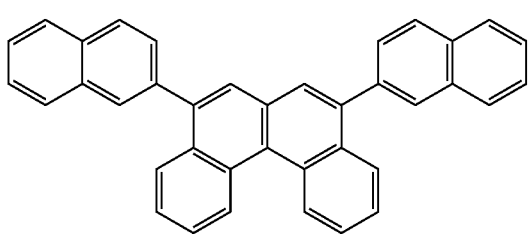
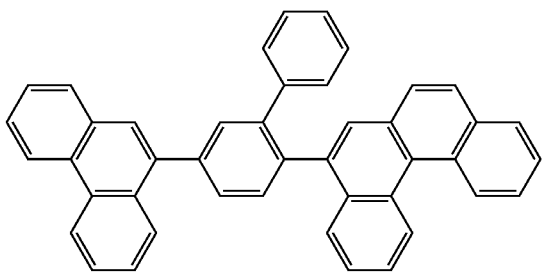
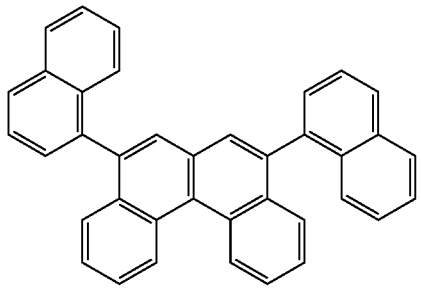
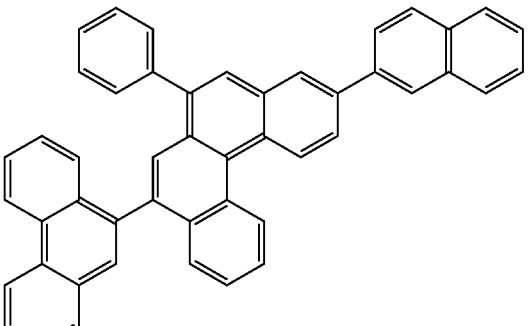
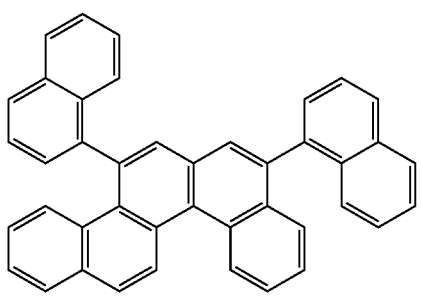
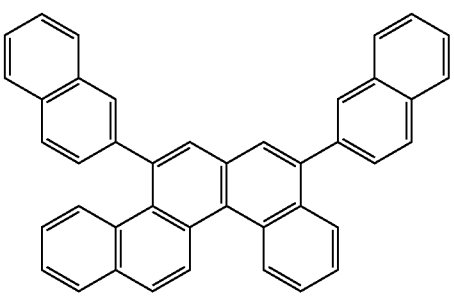
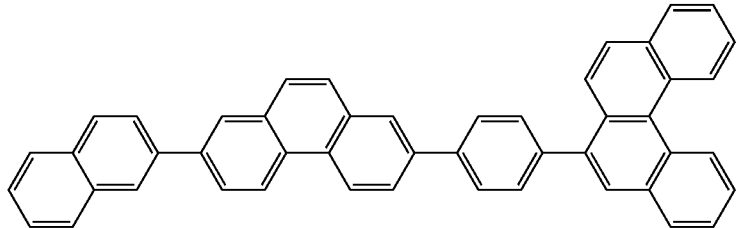

[Chemical Formula 23]
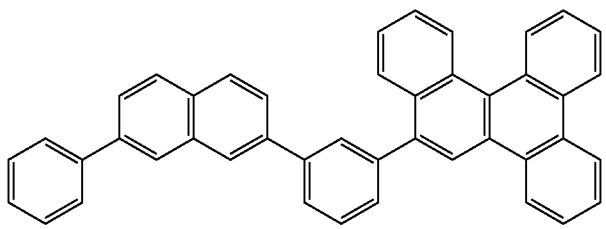

-continued

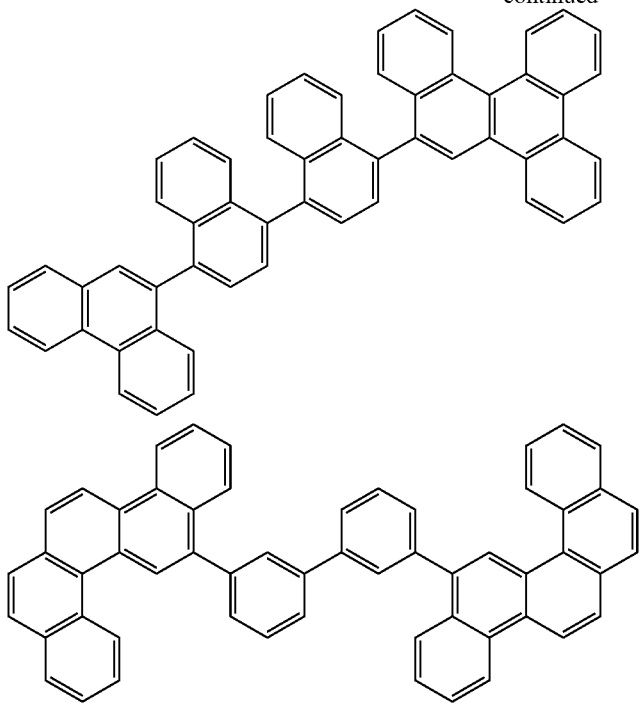

Preferably in the aspect of the invention, the polycyclic fused aromatic skeleton is a compound represented by the following formula (53) (benzo[c]chrysene) or its derivative.

[Chemical Formula 24]

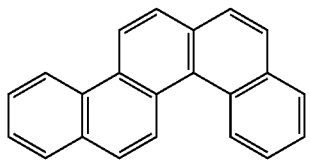
(53)

Examples of the benzo[c]chrysene derivative are those represented by the following formula (53A).

[Chemical Formula 25]

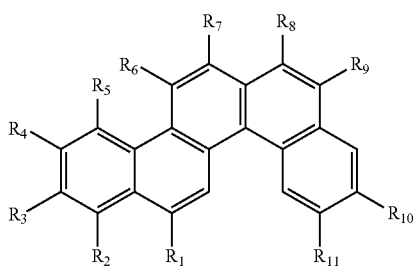
(53A)

In the formula (53A), $R_1$ to $R_{11}$ respectively independently represent: a hydrogen atom; a substituent including substituted or unsubstituted aryl group having 5 to 30 ring-forming carbon atoms (not counting carbon atom(s) of substituent(s)), branched or linear alkyl group having 1 to 30 carbon atoms or substituted or unsubstituted cycloalkyl group having 3 to 20 carbon atoms; or a combination of the substituents.

Examples of the benzo[c]chrysene derivative represented by the formula (53) are as follows.

[Chemical Formula 26]

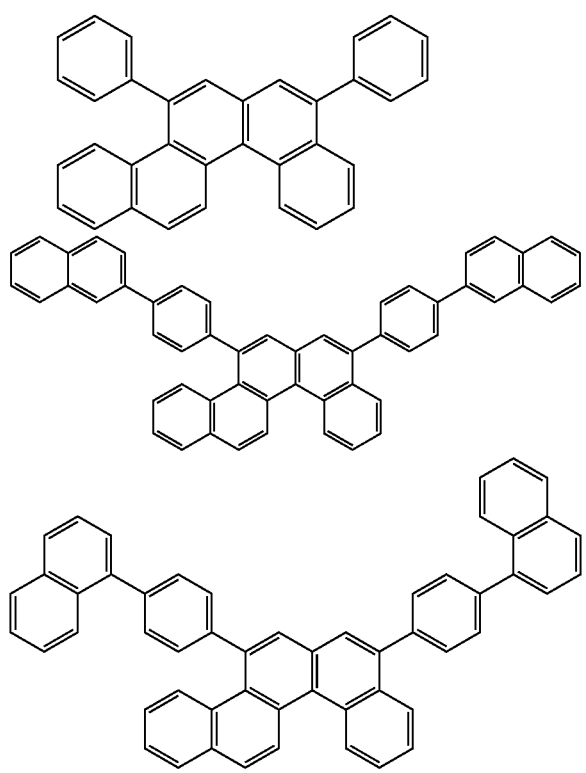

-continued

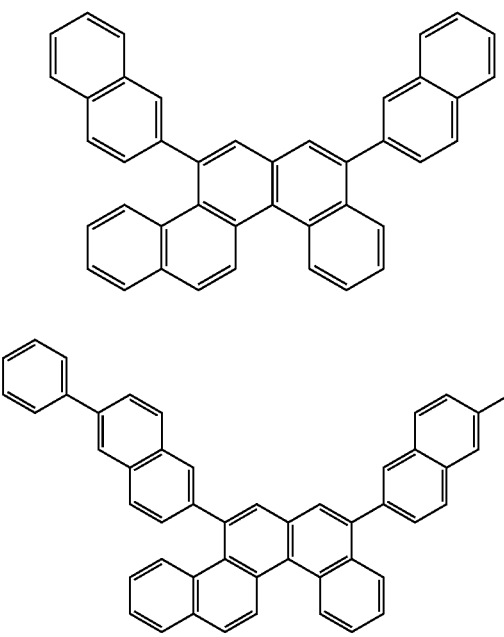

Preferably In the aspect of the invention, the polycyclic fused aromatic skeleton is a compound represented by the following formula (54) (benzo[c, g]phenanthrene) or its derivative.

[Chemical Formula 27]

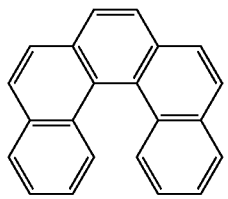

(54)

Examples of the derivative of such a compound are as follows.

[Chemical Formula 28]

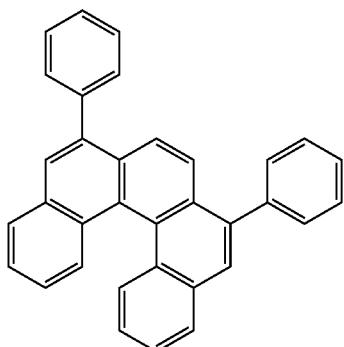

-continued

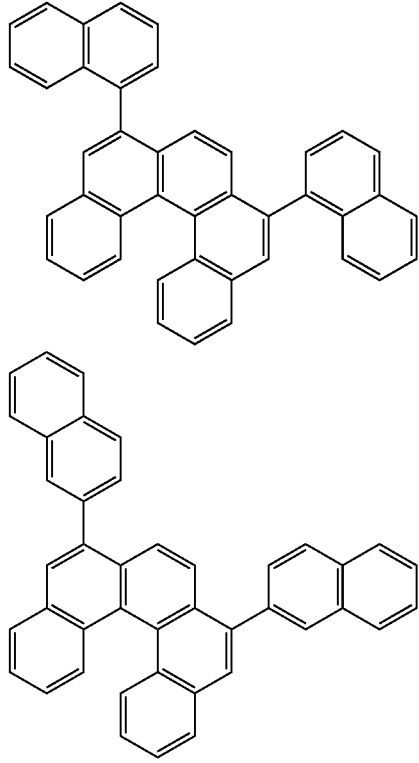

Preferably in the aspect of the invention, the polycyclic fused aromatic skeleton is fluoranthene represented by the following formula (55) or its derivative.

[Chemical Formula 29]

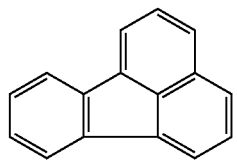

(55)

Examples of the fluoranthene derivative are those represented by the following formula (55A).

[Chemical Formula 30]

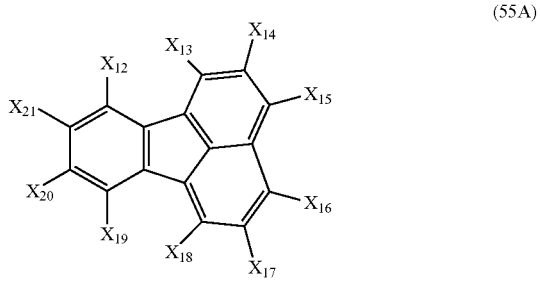

(55A)

In the formula (55A), $X_{12}$ to $X_{21}$ each represent a hydrogen atom, a halogen atom, a linear, branched or cyclic alkyl group, a linear, branched or cyclic alkoxy group, or a substituted or unsubstituted aryl group.

The aryl group represents a carbocyclic aromatic group such as a phenyl group and naphthyl group, or a heterocyclic aromatic group such as a furyl group, thienyl group and pyridyl group.

$X_{12}$ to $X_{21}$ each preferably represent hydrogen atom, halogen atom (such as fluorine atom, chlorine atom, or bromine atom), linear, branched or cyclic alkyl group having 1 to 16 carbon atoms (such as methyl group, ethyl group, n-propyl group, isopropyl group, n-butyl group, isobutyl group, sec-butyl group, tert-butyl group, n-pentyl group, isopentyl group, neopentyl group, tert-pentyl group, cyclopentyl group, n-hexyl group, 3,3-dimethylbutyl group, cyclohexyl group, n-heptyl group, cyclohexylmethyl group, n-octyl group, tert-octyl group, 2-ethylhexyl group, n-nonyl group, n-decyl group, n-dodecyl group, n-tetradecyl group, or n-hexadecyl group), linear, branched or cyclic alkoxy group having 1 to 16 carbon atoms (such as methoxy group, ethoxy group, n-propoxy group, isopropoxy group, n-butoxy group, isobutoxy group, sec-butoxy group, n-pentyloxy group, neopentyloxy group, cyclopentyloxy group, n-hexyloxy group, 3,3-dimethylbutyloxy group, cyclohexyloxy group, n-heptyloxy group, n-octyloxy group, 2-ethylhexyloxy group, n-nonyloxy group, n-decyloxy group, n-dodecyloxy group, n-tetradecyloxy group, or n-hexadecyloxy group), or substituted or unsubstituted aryl group having 4 to 16 carbon atoms (such as phenyl group, 2-methylphenyl group, 3-methylphenyl group, 4-methylphenyl group, 4-ethylphenyl group, 4-n-propylphenyl group, 4-isopropylphenyl group, 4-n-butylphenyl group, 4-tert-butylphenyl group, 4-isopentylphenyl group, 4-tert-pentylphenyl group, 4-n-hexylphenyl group, 4-cyclohexylphenyl group, 4-n-octylphenyl group, 4-n-decylphenyl group, 2,3-dimethylphenyl group, 2,4-dimethylphenyl group, 2,5-dimethylphenyl group, 3,4-dimethylphenyl group, 5-indanyl group, 1,2,3,4-tetrahydro-5-naphthyl group, 1,2,3,4-tetrahydro-6-naphthyl group, 2-methoxyphenyl group, 3-methoxyphenyl group, 4-methoxyphenyl group, 3-ethoxyphenyl group, 4-ethoxyphenyl group, 4-n-propoxyphenyl group, 4-isopropoxyphenyl group, 4-n-butoxyphenyl group, 4-n-pentyloxyphenyl group, 4-n-hexyloxyphenyl group, 4-cyclohexyloxyphenyl group, 4-n-heptyloxyphenyl group, 4-n-octyloxyphenyl group, 4-n-decyloxyphenyl group, 2,3-dimethoxyphenyl group, 2,5-dimethoxyphenyl group, 3,4-dimethoxyphenyl group, 2-methoxy-5-methylphenyl group, 3-methyl-4-methoxyphenyl group, 2-fluorophenyl group, 3-fluorophenyl group, 4-fluorophenyl group, 2-chlorophenyl group, 3-chlorophenyl group, 4-chlorophenyl group, 4-bromophenyl group, 4-trifluoromethylphenyl group, 3,4-dichlorophenyl group, 2-methyl-4-chlorophenyl group, 2-chloro-4-methylphenyl group, 3-chloro-4-methylphenyl group, 2-chloro-4-methoxyphenyl group, 4-phenylphenyl group, 3-phenylphenyl group, 4-(4'-methylphenyl)phenyl group, 4-(4'-methoxyphenyl)phenyl group, 1-naphthyl group, 2-naphthyl group, 4-ethoxy-1-naphthyl group, 6-methoxy-2-naphthyl group, 7-ethoxy-2-naphthyl group, 2-furyl group, 2-thienyl group, 3-thienyl group, 2-pyridyl group, 3-pyridyl group, or 4-pyridyl group), more preferably hydrogen atom, fluorine atom, chlorine atom, alkyl group having 1 to 10 carbon atoms, alkoxy group having 1 to 10 carbon atoms or aryl group having 6 to 12 carbon atoms, further more preferably hydrogen atom, fluorine atom, chlorine atom, alkyl group having 1 to 6 carbon atoms, alkoxy group having 1 to 6 carbon atoms or carbocyclic aromatic group having 6 to 10 carbon atoms.

Examples of the fluoranthene derivative represented by the formula (55) are as follows.

[Chemical Formula 31]

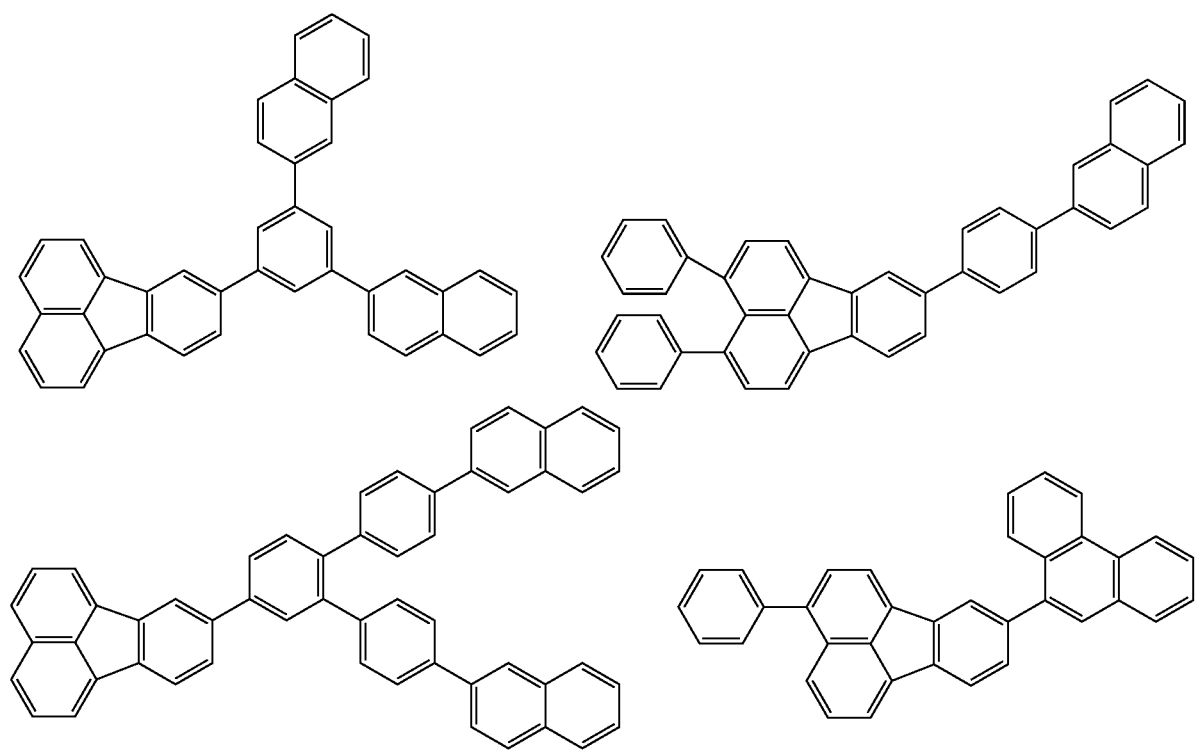

-continued
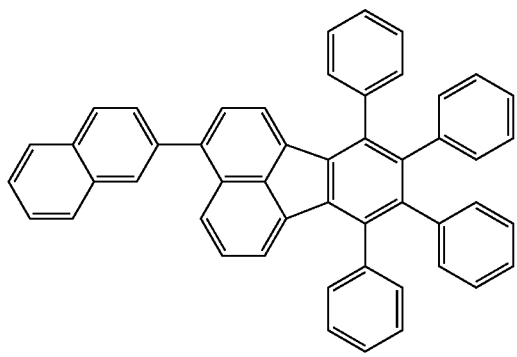
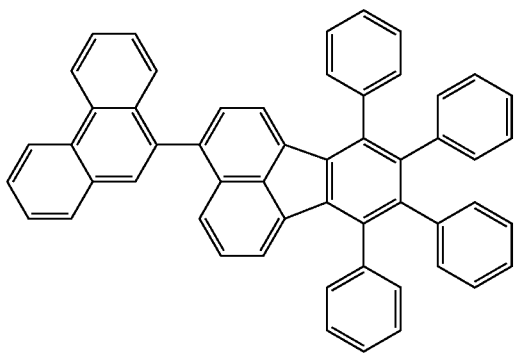
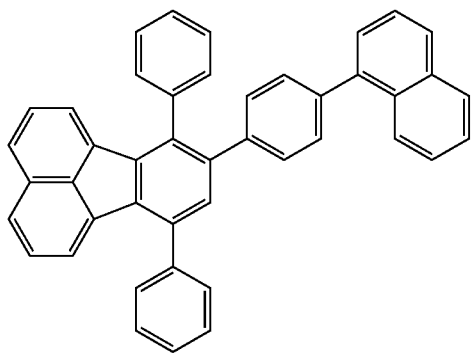
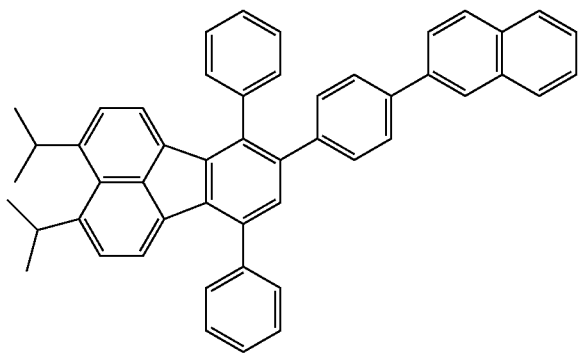
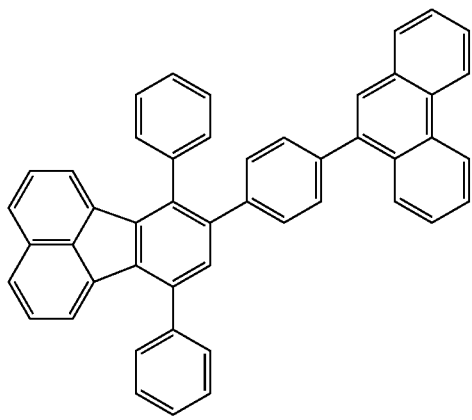
[Chemical Formula 32]
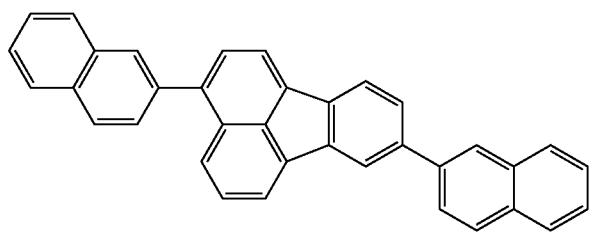

-continued
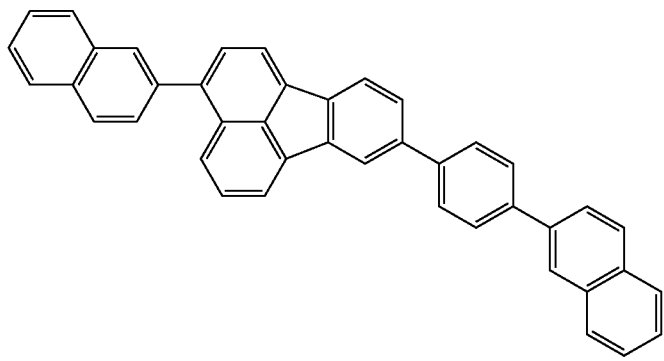
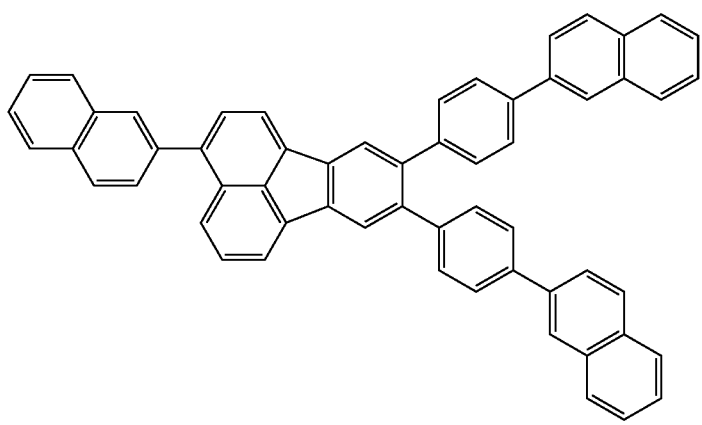
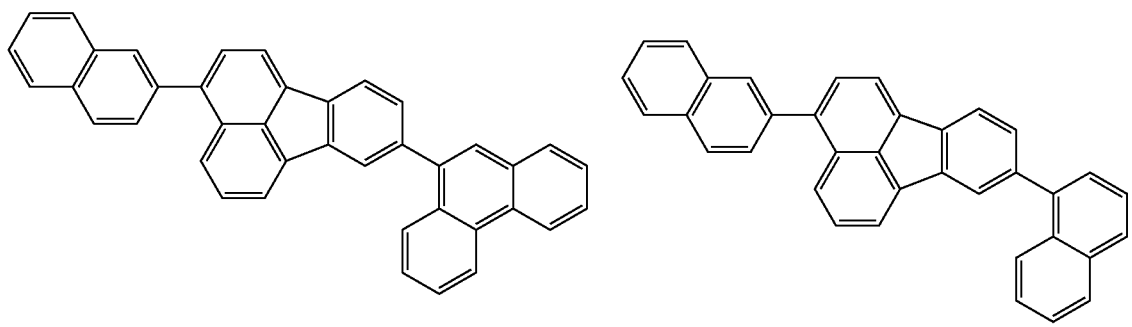
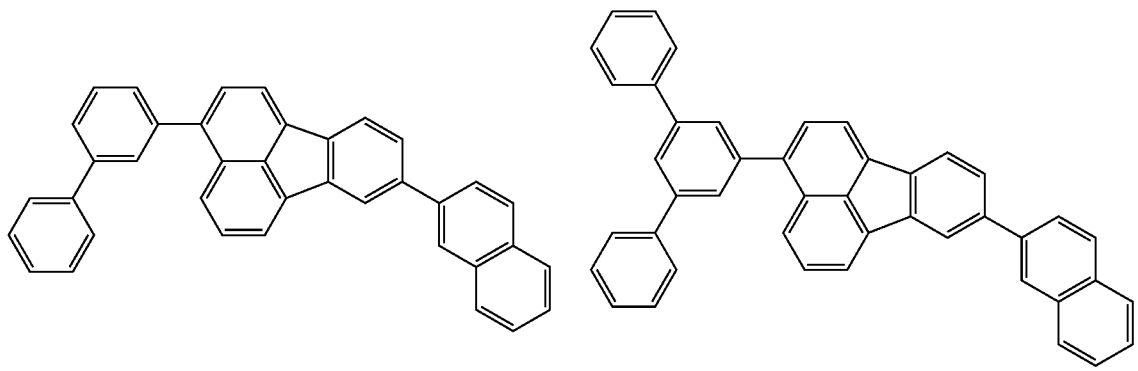

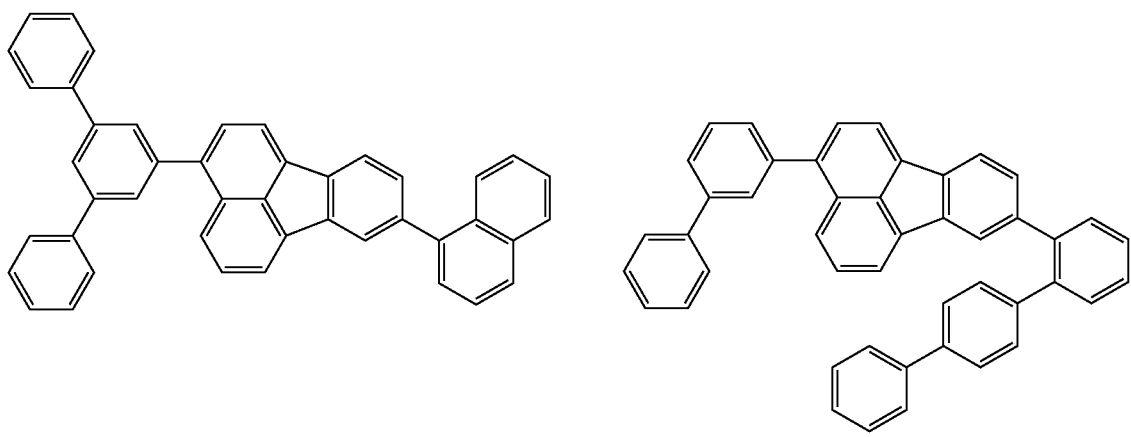
[Chemical Formula 33]
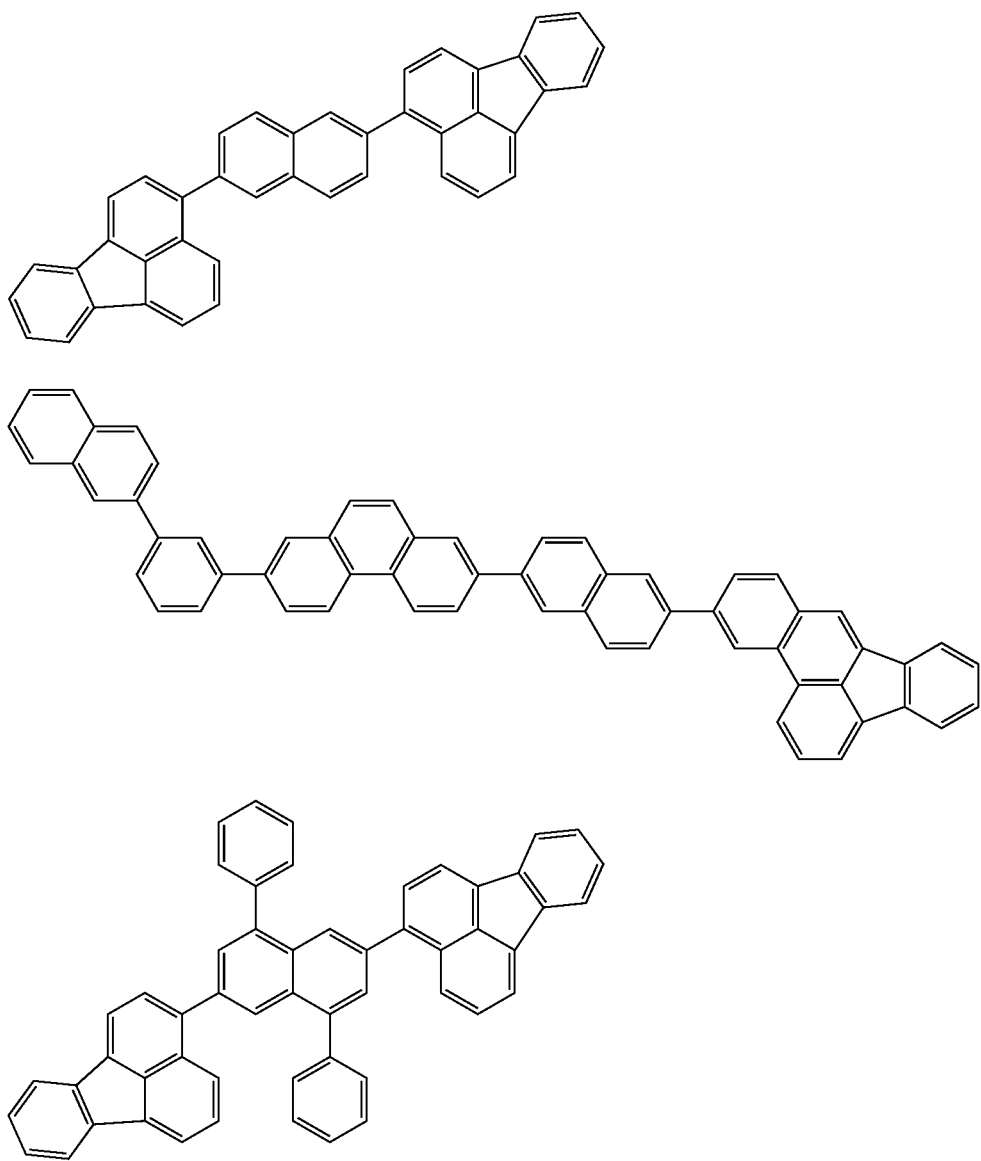

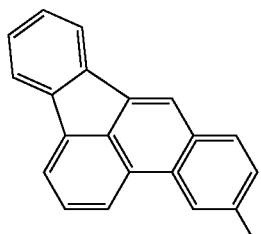
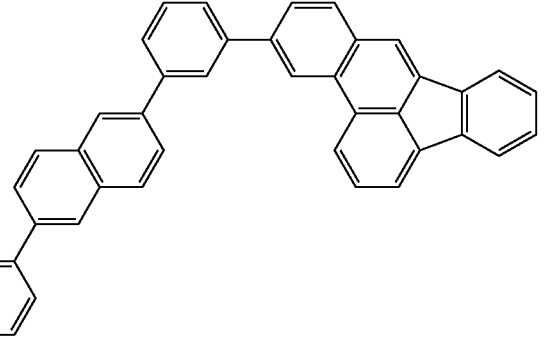
[Chemical Formula 34]
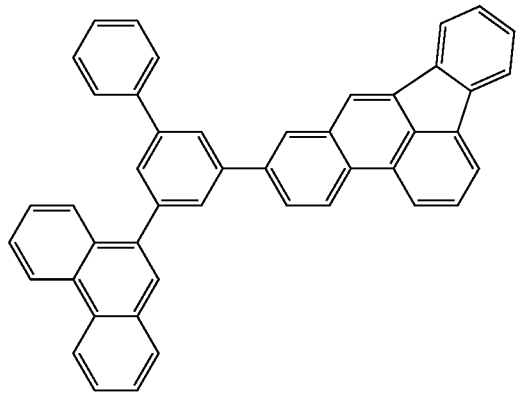
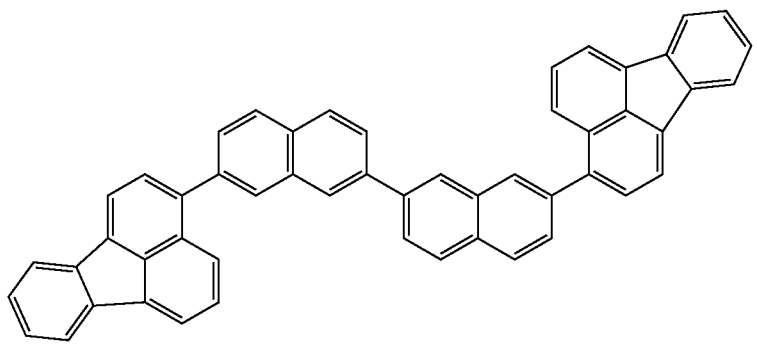
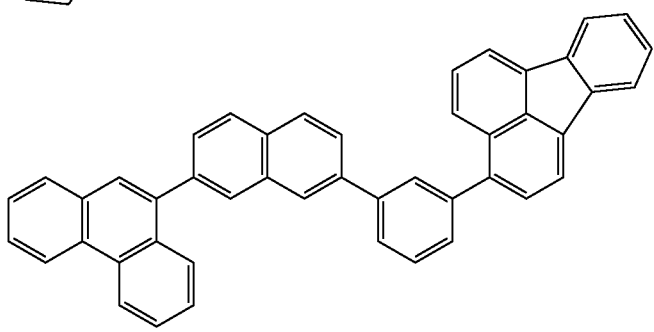
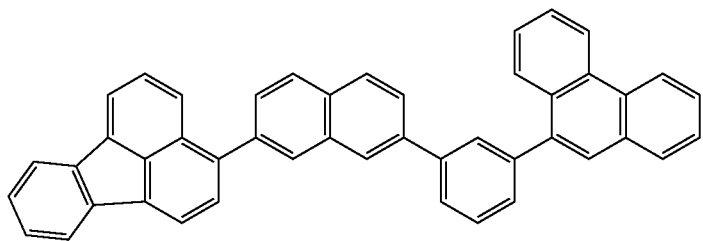

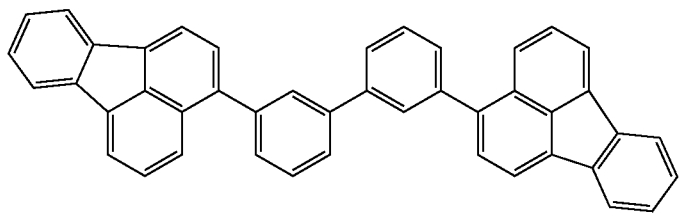
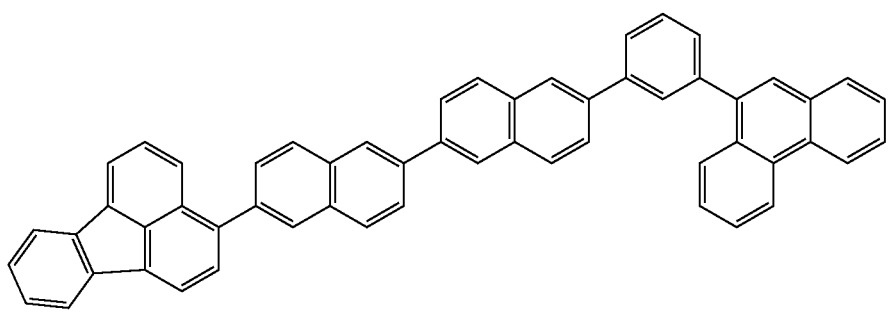
[Chemical Formula 35]
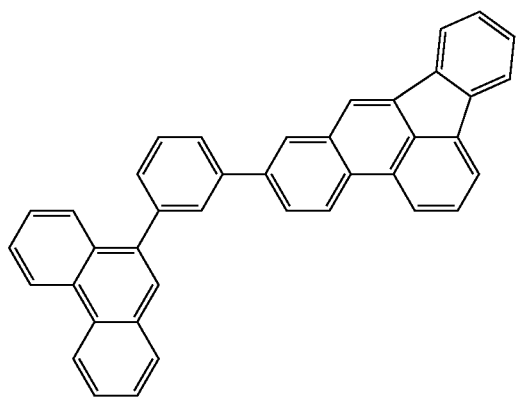
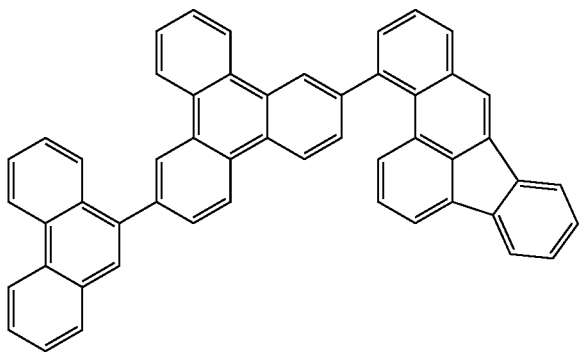

Examples of the substituted or unsubstituted benzofluoranthene are benzo[b]fluoranthene represented by the following formula (551) or its derivative and benzo[k]fluoranthene represented by a formula (552) or its derivative.

[Chemical Formula 36]

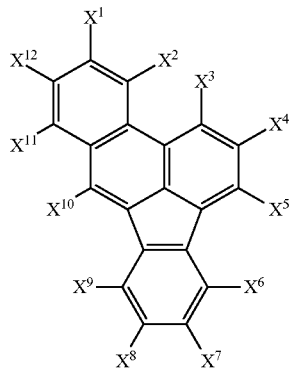

(551)

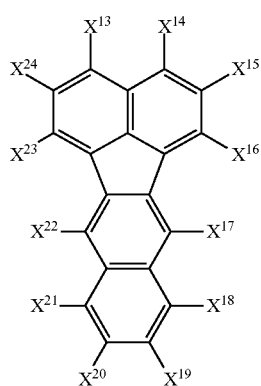

(552)

In the formulae (551) and (552), $X^1$ to $X^{24}$ each represent a hydrogen atom, a halogen atom, a linear, branched or cyclic alkyl group, a linear, branched or cyclic alkoxy group, or a substituted or unsubstituted aryl group.

The aryl group represents a carbocyclic aromatic group such as a phenyl group and naphthyl group, or a heterocyclic aromatic group such as a furyl group, thienyl group and pyridyl group.

$X^1$ to $X^{24}$ each preferably represent hydrogen atom, halogen atom (such as fluorine atom, chlorine atom, or bromine atom), linear, branched or cyclic alkyl group having 1 to 16 carbon atoms (such as methyl group, ethyl group, n-propyl group, isopropyl group, n-butyl group, isobutyl group, sec-butyl group, tert-butyl group, n-pentyl group, isopentyl group, neopentyl group, tert-pentyl group, cyclopentyl group, n-hexyl group, 3,3-dimethylbutyl group, cyclohexyl group, n-heptyl group, cyclohexylmethyl group, n-octyl group, tert-octyl group, 2-ethylhexyl group, n-nonyl group, n-decyl group, n-dodecyl group, n-tetradecyl group, or n-hexadecyl group), linear, branched or cyclic alkoxy group having 1 to 16 carbon atoms (such as methoxy group, ethoxy group, n-propoxy group, isopropoxy group, n-butoxy group, isobutoxy group, sec-butoxy group, n-pentyloxy group, neopentyloxy group, cyclopentyloxy group, n-hexyloxy group, 3,3-dimethylbutyloxy group, cyclohexyloxy group, n-heptyloxy group, n-octyloxy group, 2-ethylhexyloxy group, n-nonyloxy group, n-decyloxy group, n-dodecyloxy group, n-tetradecyloxy group, or n-hexadecyloxy group), or substituted or unsubstituted aryl group having 4 to 16 carbon atoms (such as phenyl group, 2-methylphenyl group, 3-methylphenyl group, 4-methylphenyl group, 4-ethylphenyl group, 4-n-propylphenyl group, 4-isopropylphenyl group, 4-n-butylphenyl group, 4-tert-butylphenyl group, 4-isopentylphenyl group, 4-tert-pentylphenyl group, 4-n-hexylphenyl group, 4-cyclohexylphenyl group, 4-n-octylphenyl group, 4-n-decylphenyl group, 2,3-dimethylphenyl group, 2,4-dimethylphenyl group, 2,5-dimethylphenyl group, 3,4-dimethylphenyl group, 5-indanyl group, 1,2,3,4-tetrahydro-5-naphthyl group, 1,2,3,4-tetrahydro-6-naphthyl group, 2-methoxyphenyl group, 3-methoxyphenyl group, 4-methoxyphenyl group, 3-ethoxyphenyl group, 4-ethoxyphenyl group, 4-n-propoxyphenyl group, 4-isopropoxyphenyl group, 4-n-butoxyphenyl group, 4-n-pentyloxyphenyl group, 4-n-hexyloxyphenyl group, 4-cyclohexyloxyphenyl group, 4-n-heptyloxyphenyl group, 4-n-octyloxyphenyl group, 4-n-decyloxyphenyl group, 2,3-dimethoxyphenyl group, 2,5-dimethoxyphenyl group, 3,4-dimethoxyphenyl group, 2-methoxy-5-methylphenyl group, 3-methyl-4-methoxyphenyl group, 2-fluorophenyl group, 3-fluorophenyl group, 4-fluorophenyl group, 2-chlorophenyl group, 3-chlorophenyl group, 4-chlorophenyl group, 4-bromophenyl group, 4-trifluoromethylphenyl group, 3,4-dichlorophenyl group, 2-methyl-4-chlorophenyl group, 2-chloro-4-methylphenyl group, 3-chloro-4-methylphenyl group, 2-chloro-4-methoxyphenyl group, 4-phenylphenyl group, 3-phenylphenyl group, 4-(4'-methylphenyl)phenyl group, 4-(4'-methoxyphenyl)phenyl group, 1-naphthyl group, 2-naphthyl group, 4-ethoxy-1-naphthyl group, 6-methoxy-2-naphthyl group, 7-ethoxy-2-naphthyl group, 2-furyl group, 2-thienyl group, 3-thienyl group, 2-pyridyl group, 3-pyridyl group, or 4-pyridyl group), more preferably hydrogen atom, fluorine atom, chlorine atom, alkyl group having 1 to 10 carbon atoms, alkoxy group having 1 to 10 carbon atoms or aryl group having 6 to 12 carbon atoms, further more preferably hydrogen atom, fluorine atom, chlorine atom, alkyl group having 1 to 6 carbon atoms, alkoxy group having 1 to 6 carbon atoms or carbocyclic aromatic group having 6 to 10 carbon atoms.

Examples of the benzo[b]fluoranthene derivative represented by the formula (551) are as follows.

[Chemical Formula 37]

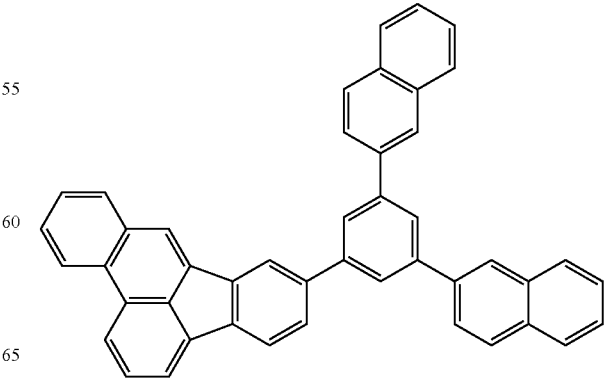

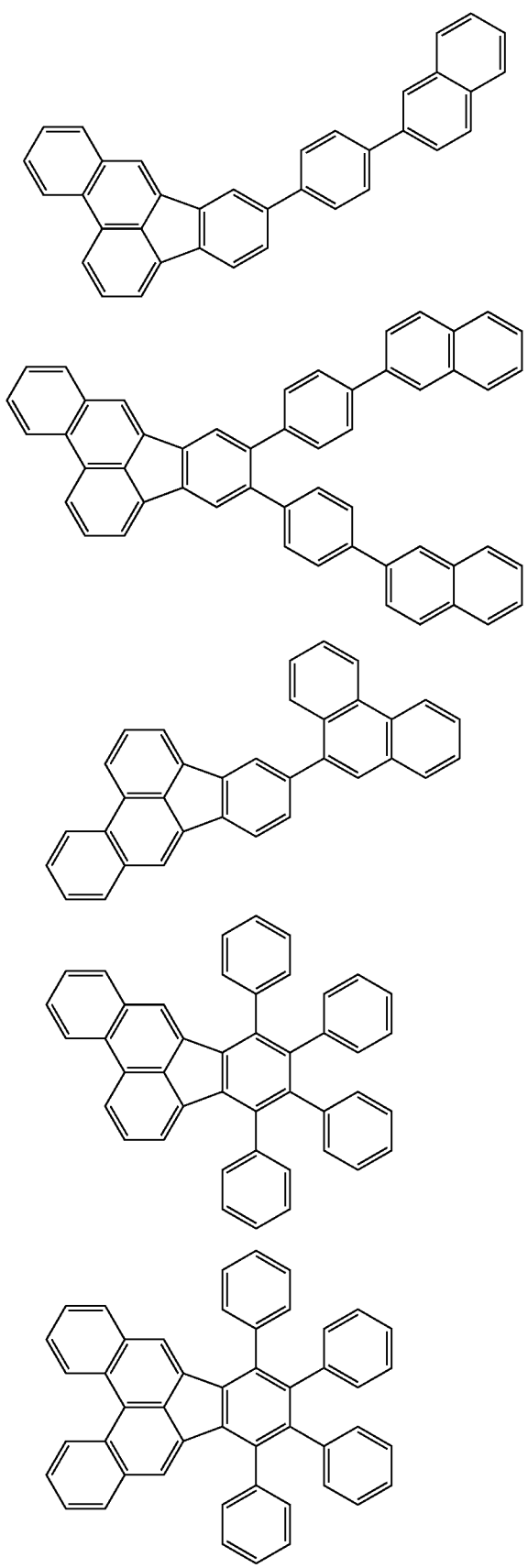
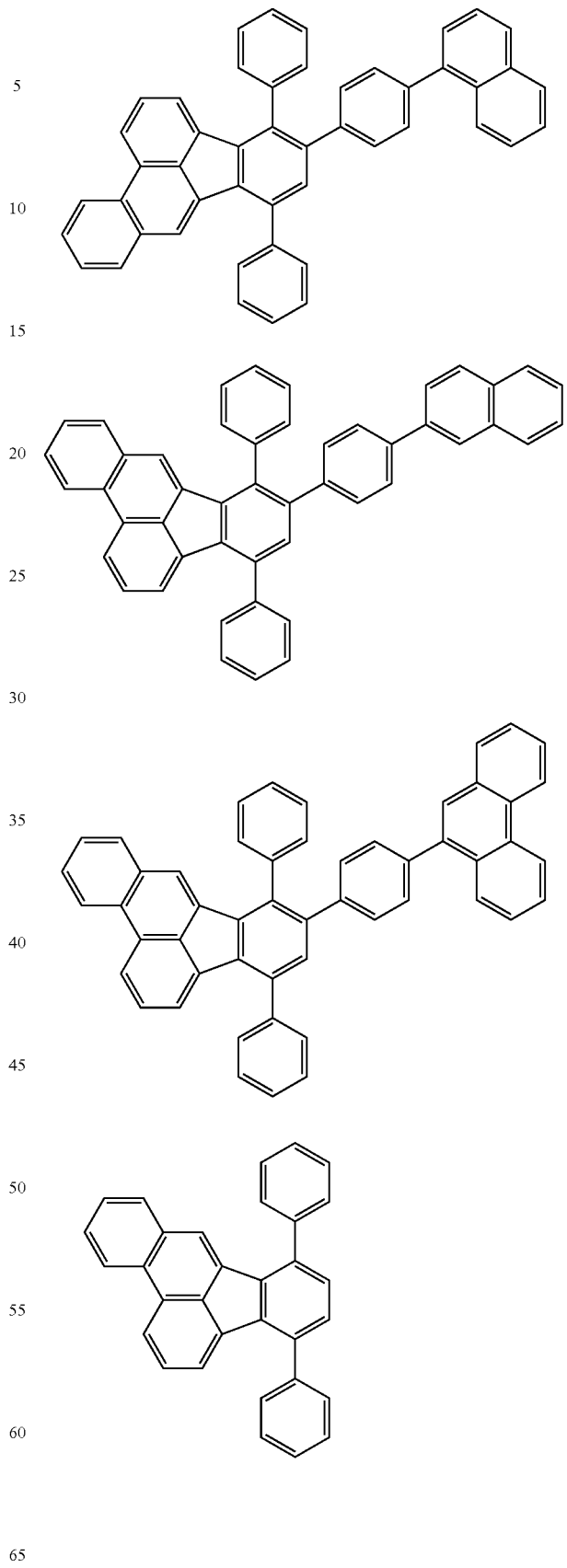
Examples of the benzo[k]fluoranthene derivative represented by the formula (552) are as follows.

[Chemical Formula 38]

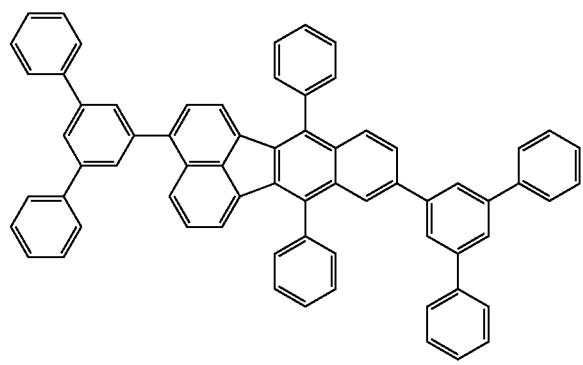

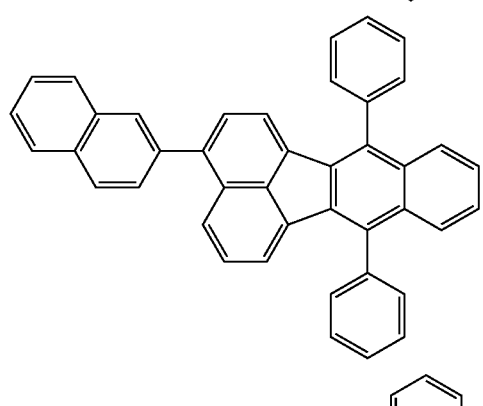

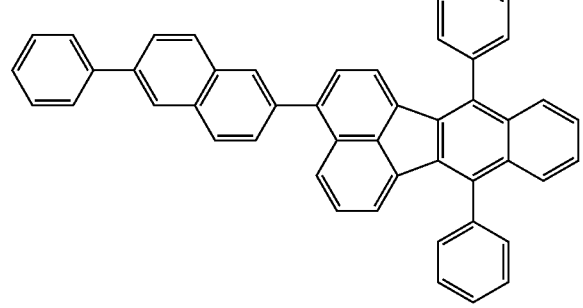

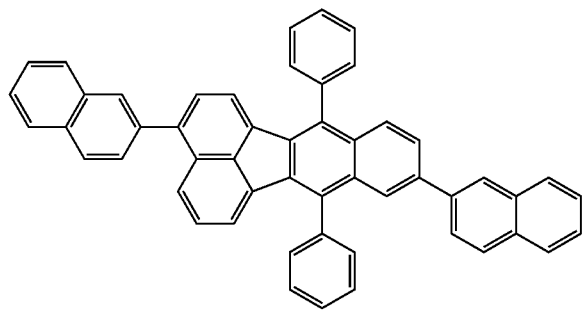

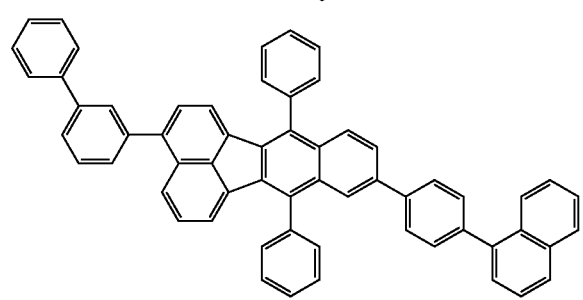

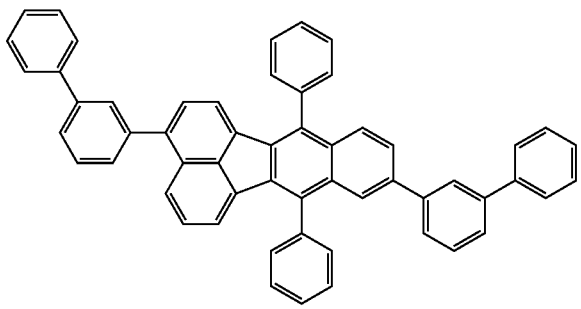 [SMILES: c1ccc(-c2cccc(-c3ccc4c(-c5ccccc5)c5c(c(-c6ccccc6)c4c3)-c3cccc4c(-c6cccc(-c7ccccc7)c6)ccc-5c34)c2)cc1]

Preferably in the aspect of the invention, the polycyclic fused aromatic skeleton is triphenylene represented by the following formula (56) or its derivative.

[Chemical Formula 39]

(56)

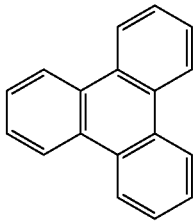

Examples of the triphenylene derivative are those represented by the following formula (56A).

[Chemical Formula 40]

(56A)

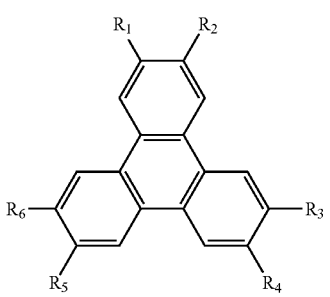

In the formula (56A), $R_1$ to $R_6$ respectively independently represent: a hydrogen atom; a substituent including substituted or unsubstituted aryl group having 5 to 30 ring-forming carbon atoms (not counting carbon atom(s) of substituent(s)), branched or linear alkyl group having 1 to 30 carbon atoms or substituted or unsubstituted cycloalkyl group having 3 to 20 carbon atoms; or a combination of the substituents.

Examples of the triphenylene derivative represented by the formula (56) are as follows.

[Chemical Formula 41]
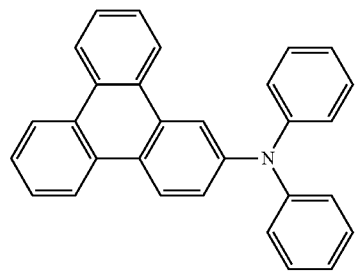
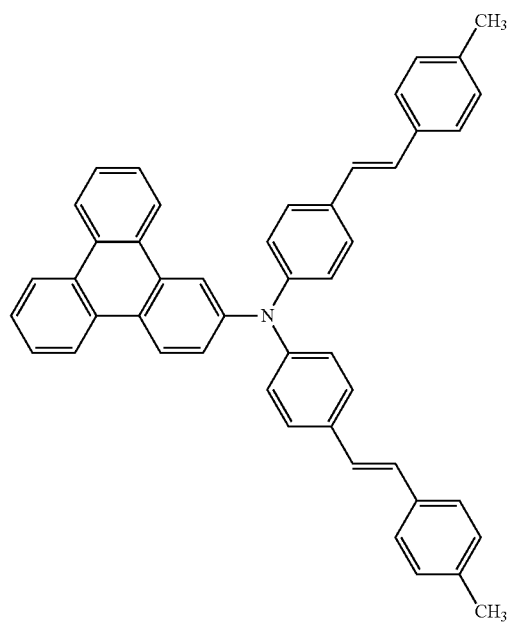
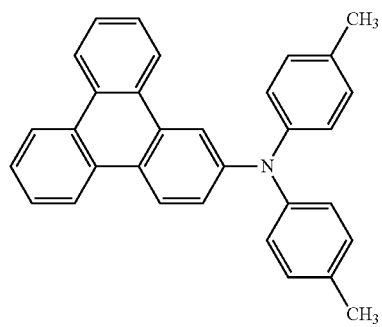
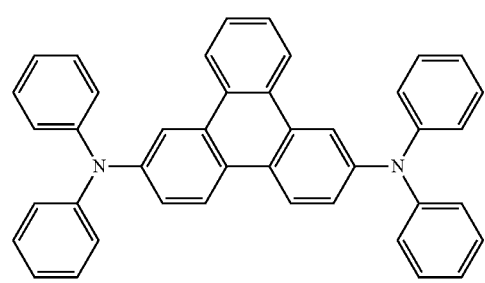
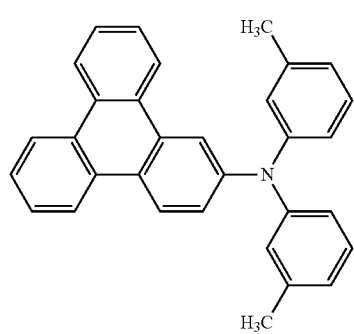
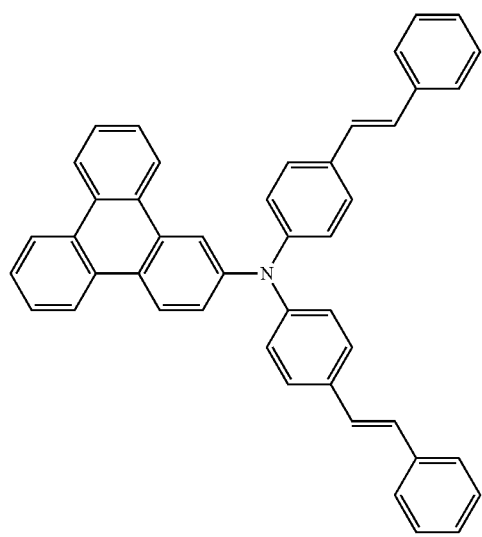

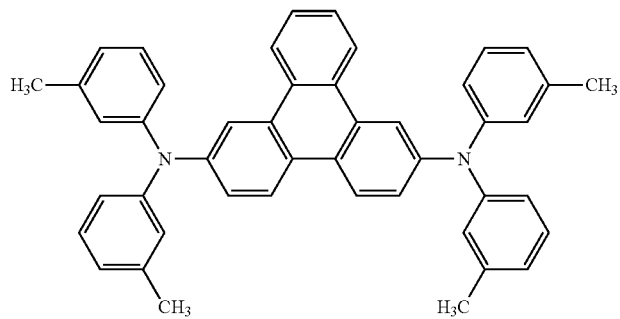
[Chemical Formula 42]
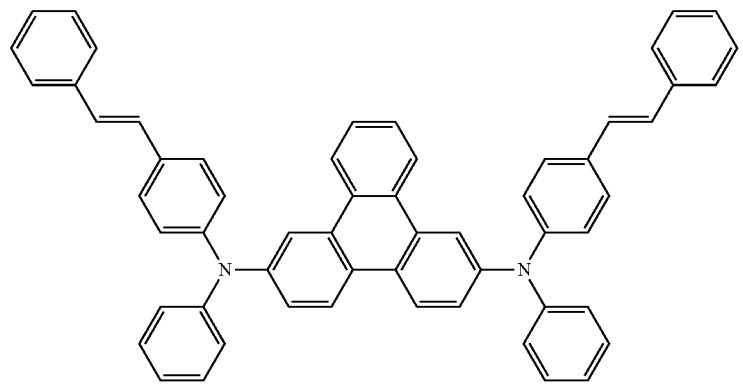
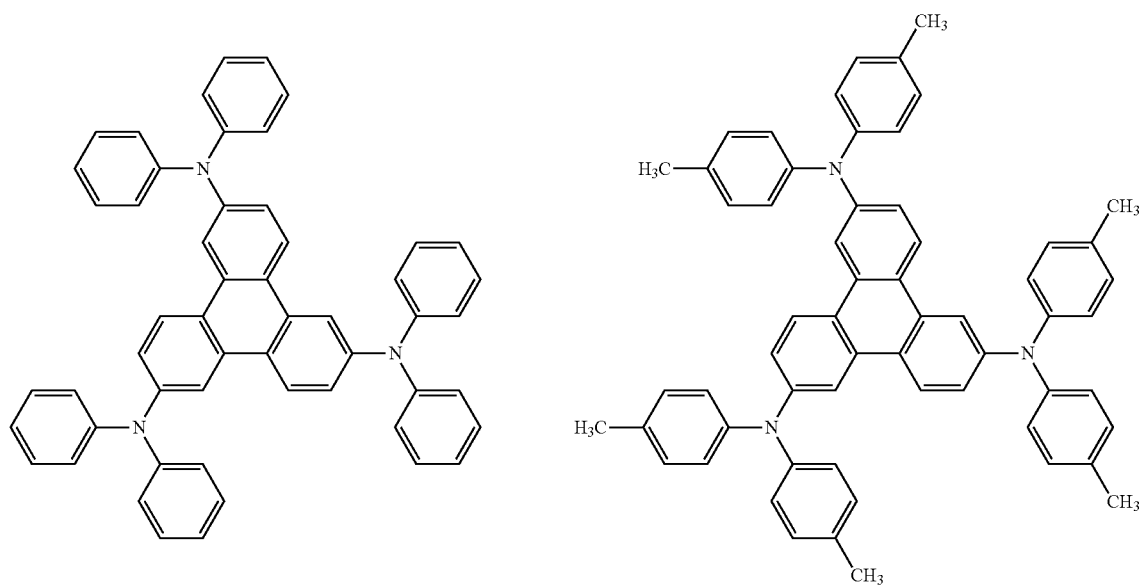

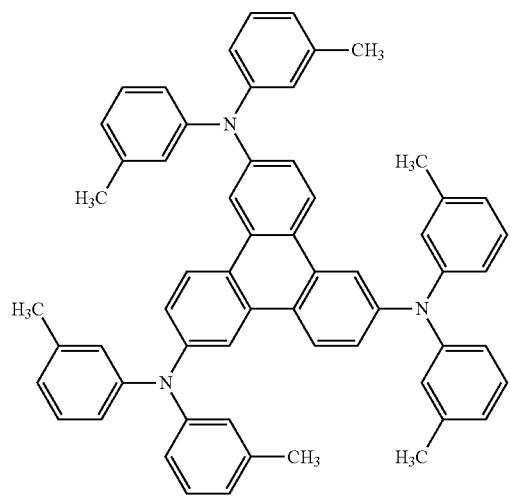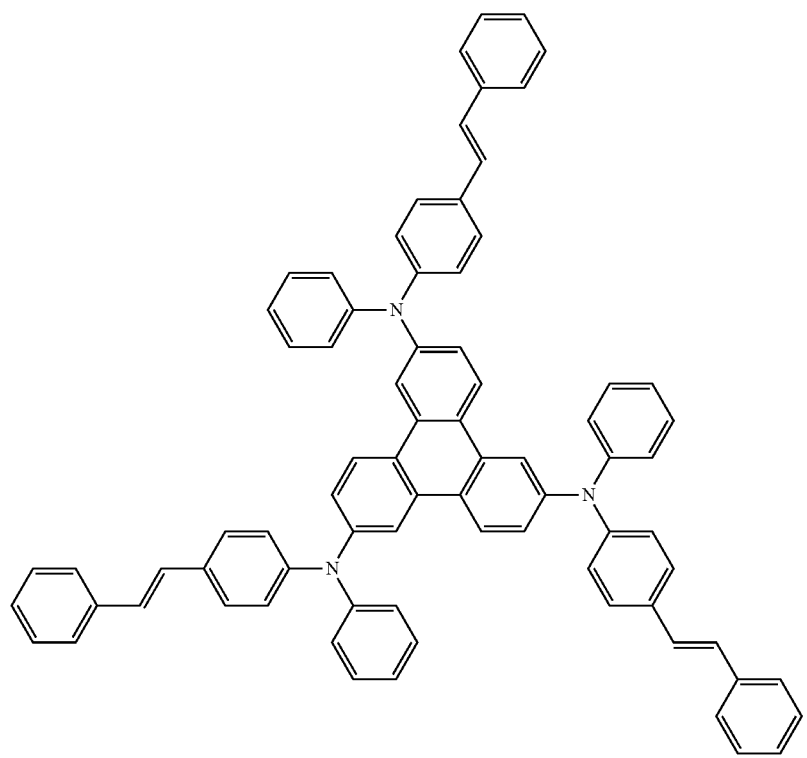

[Chemical Formula 43]
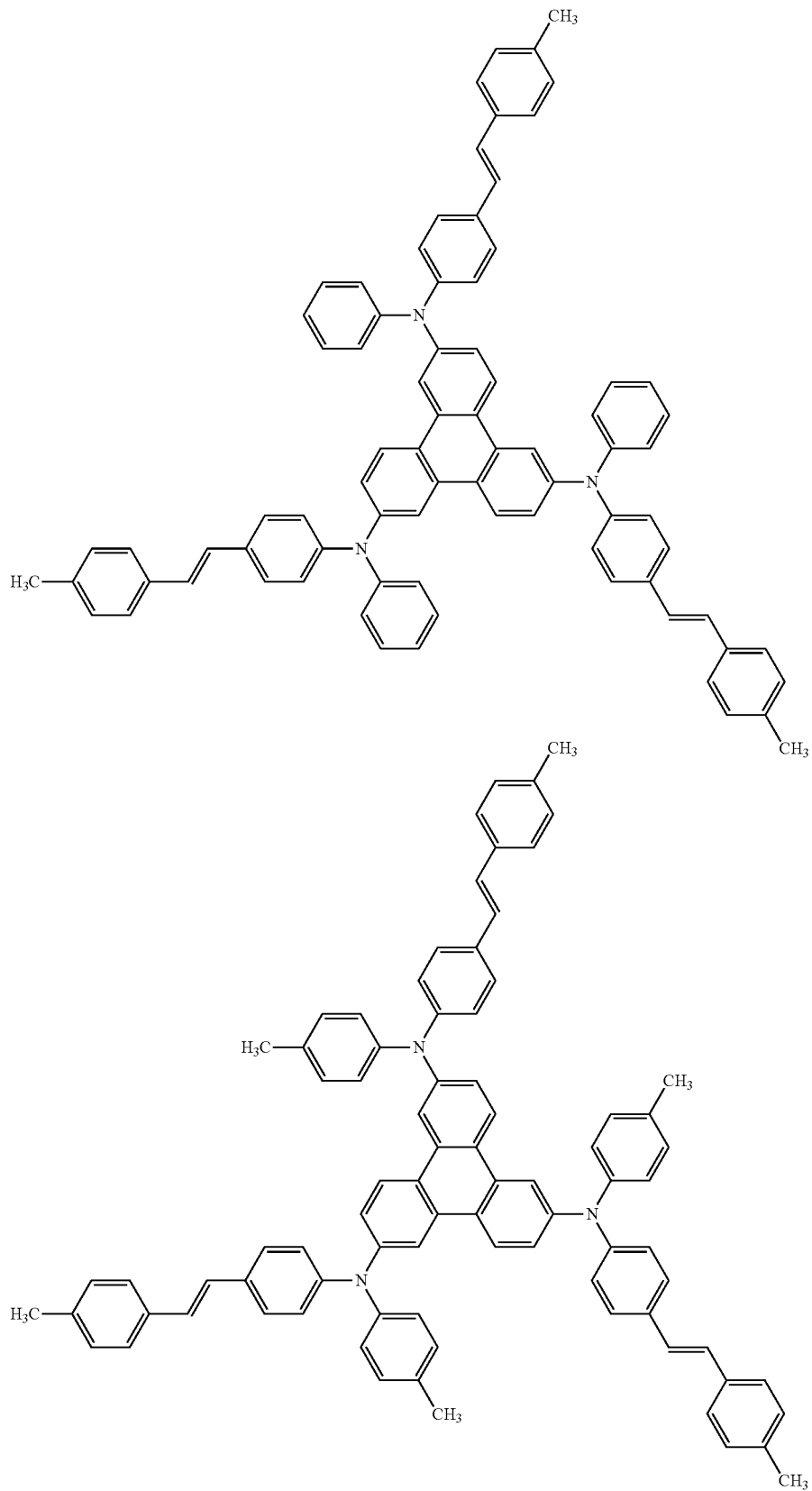

[Chemical Formula 44]
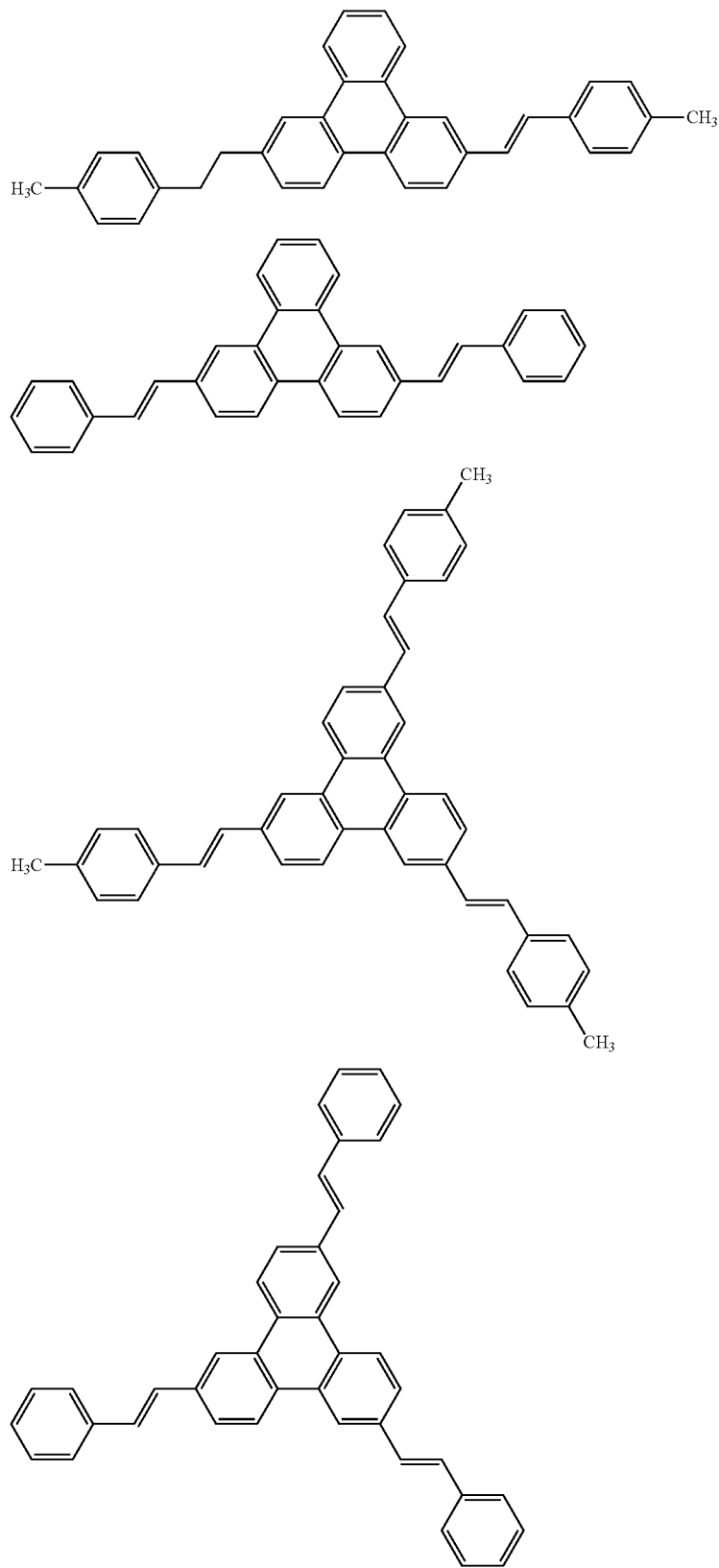

[Chemical Formula 45]
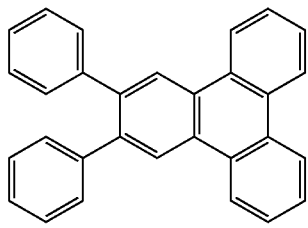
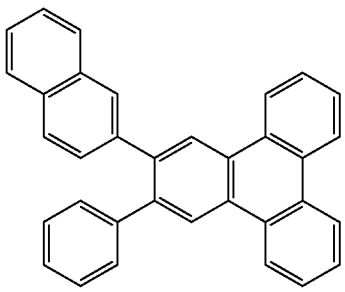
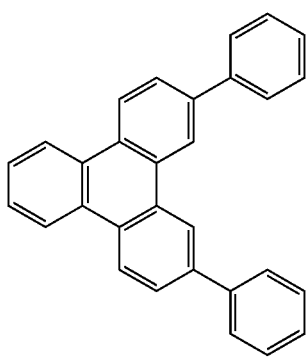
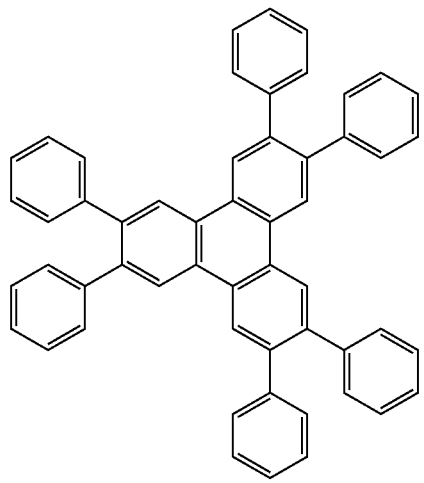
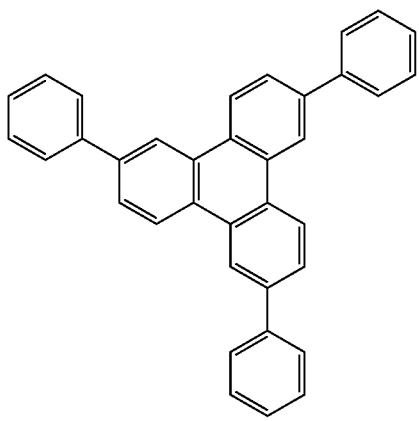
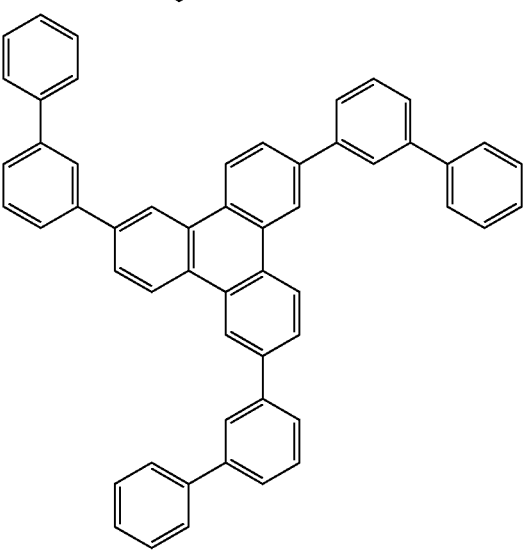
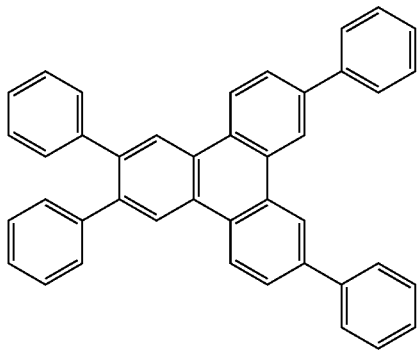

[Chemical Formula 46]
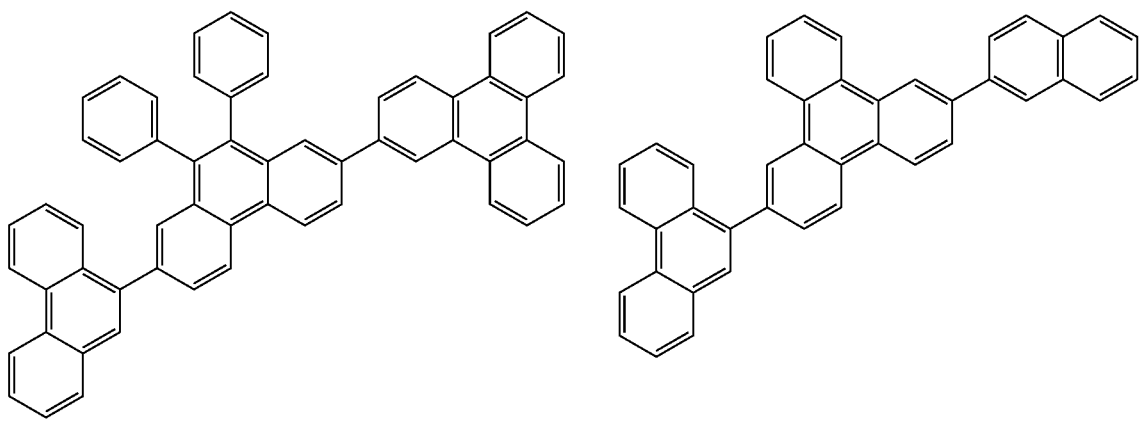
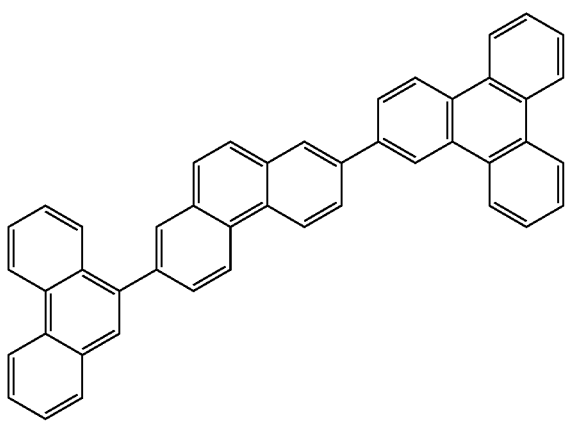
[Chemical Formula 47]
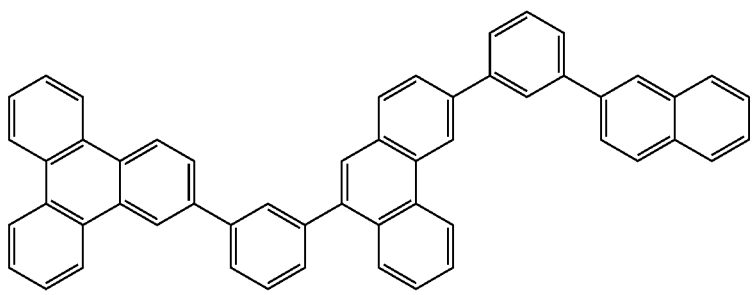
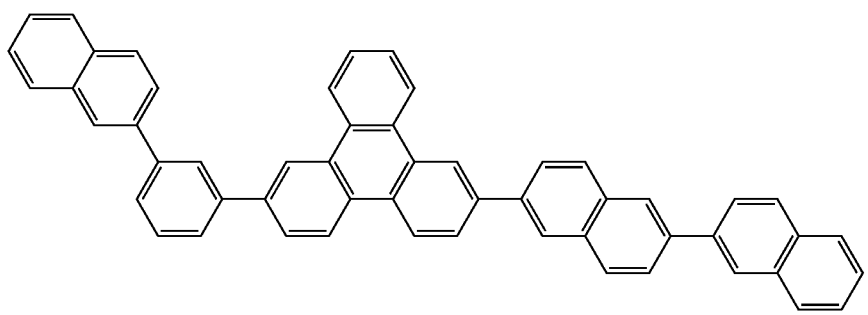

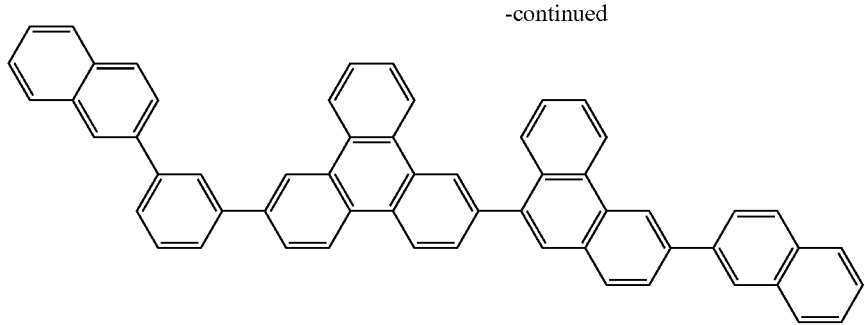
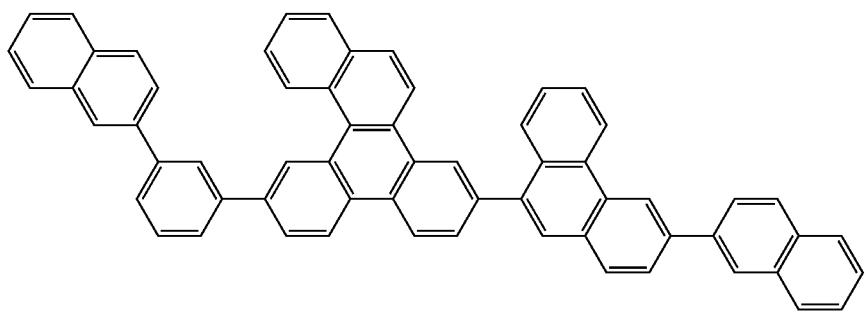
[Chemical Formula 48]
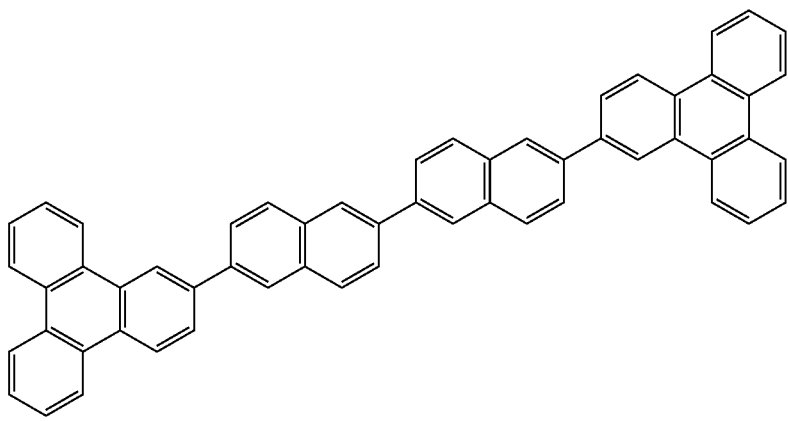
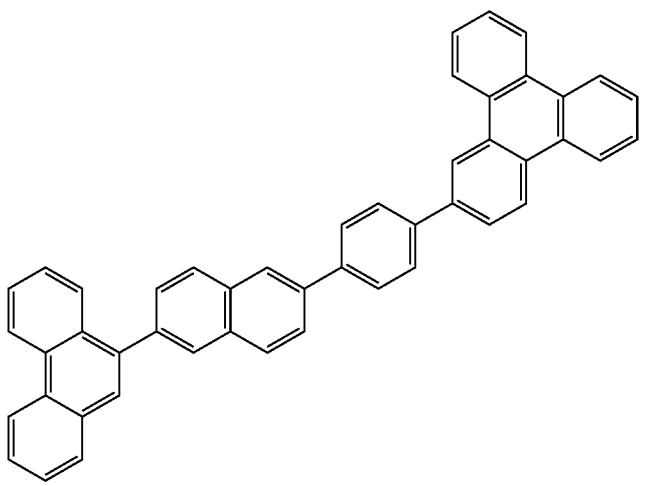

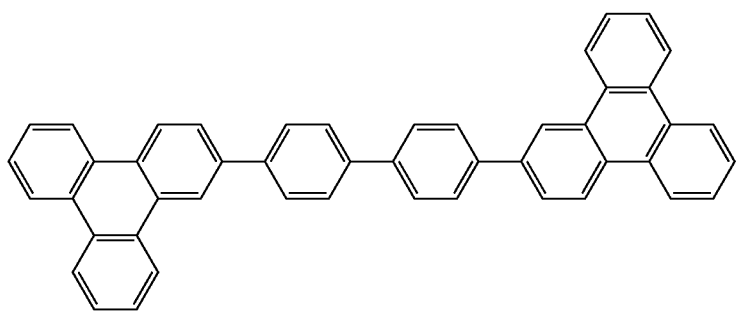

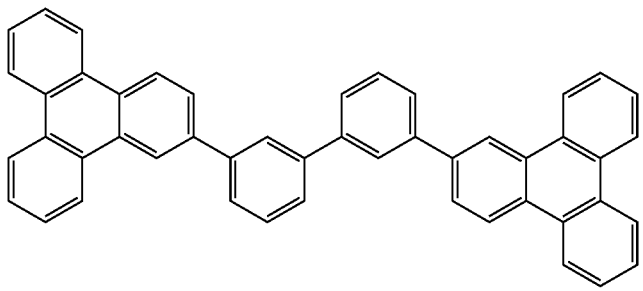

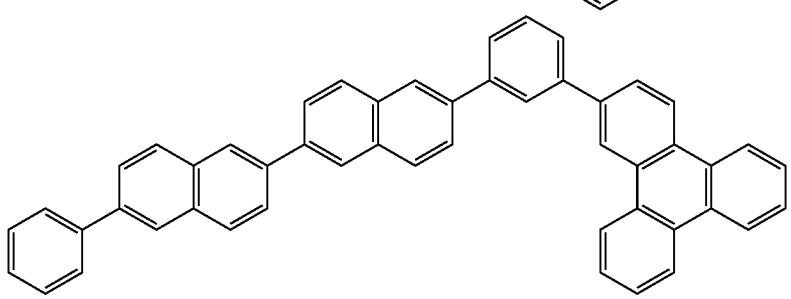

Preferably in the aspect of the invention, the polycyclic fused aromatic skeleton is naphthalene or its derivative.

Examples of the naphthalene derivative are those represented by the following formula (57A).

[Chemical Formula 49]

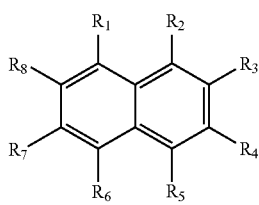

(57A)

In the formula (57A), $R_1$ to $R_8$ respectively independently represent: a hydrogen atom; a substituent including substituted or unsubstituted aryl group having 5 to 30 ring-forming carbon atoms (not counting carbon atom(s) of substituent(s)), branched or linear alkyl group having 1 to 30 carbon atoms or substituted or unsubstituted cycloalkyl group having 3 to 20 carbon atoms; or a combination of the substituents.

Specific examples of the naphthalene derivative are those represented by the following formulae.

[Chemical Formula 50]

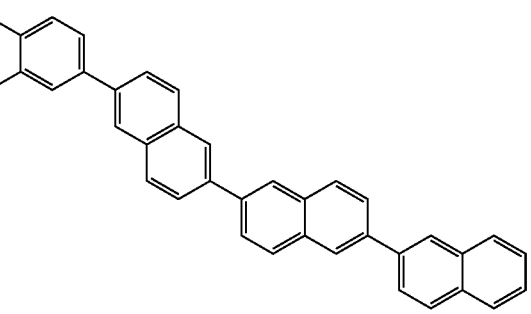

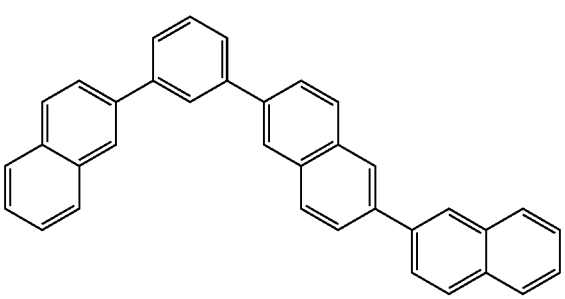

111
-continued
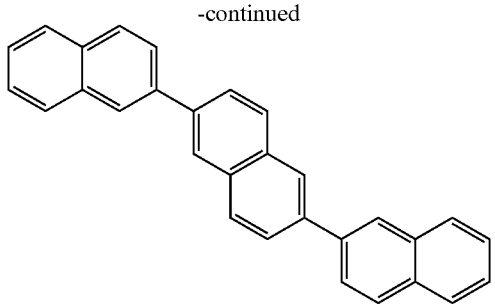
The polycyclic fused aromatic skeleton may contain a nitrogen atom, examples of which are shown below.
[Chemical Formula 51]
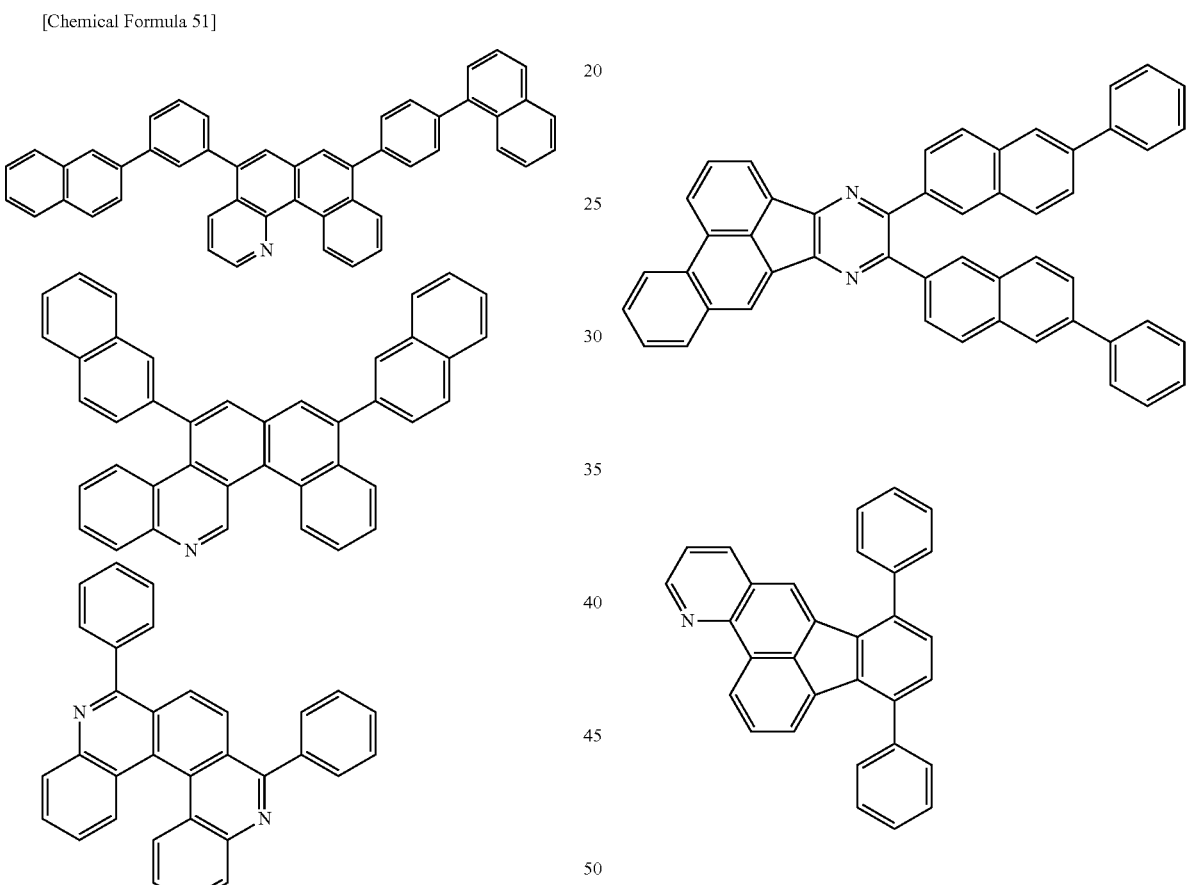
112
-continued
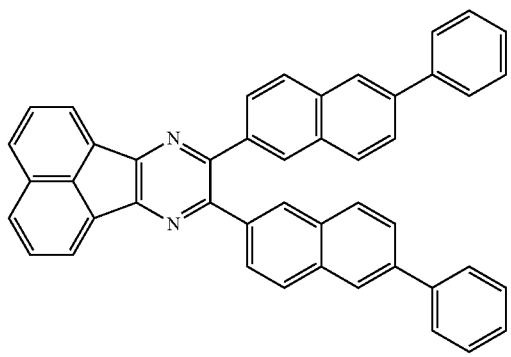
Further, for instance, the fluorene compounds shown below are usable as the host of the invention.
[Chemical Formula 52]
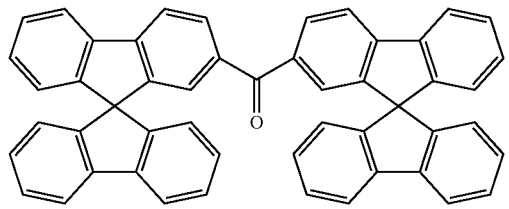
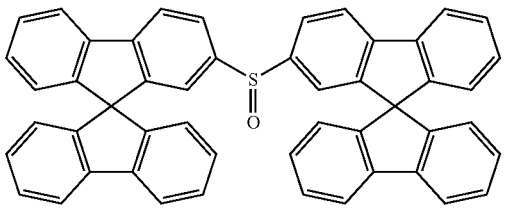

-continued

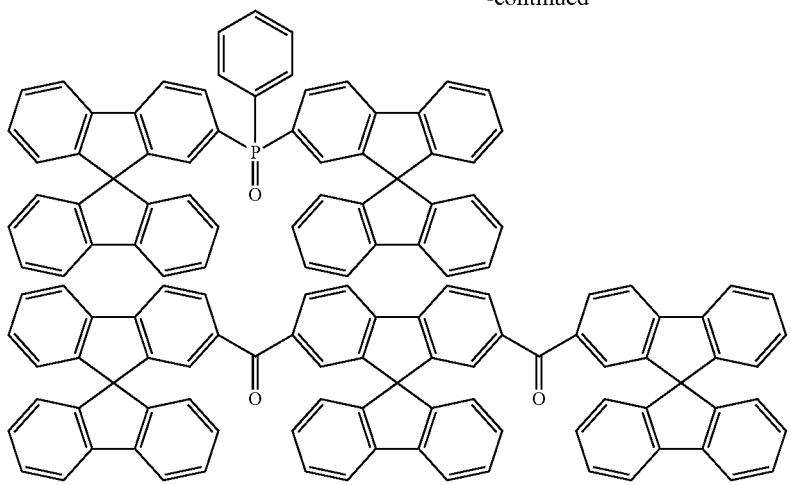

In the above aspect of the invention, the first host is preferably a substituted or unsubstituted phenanthrene, chrysene, triphenylene, naphthalene or fluoranthene.

Examples of the phenanthrene, chrysene, triphenylene, naphthalene and fluoranthene are those represented above.

When the first host is provided by the substituted or unsubstituted phenanthrene, chrysene, triphenylene, naphthalene or fluoranthene, since the first host is provided by a polycyclic fused aromatic compound and exhibits the Eg(T) in a range from 2.1 to 2.7 eV, efficiency and lifetime of a red or green-emitting phosphorescent organic electroluminescence device can be enhanced.

In the above aspect of the invention, the first host is preferably a substituted or unsubstituted phenanthrene or chrysene.

In the above aspect of the invention, the second host preferably includes the substituted or unsubstituted polycyclic fused aromatic skeleton having 10 to 30 ring-forming atoms (not counting atom(s) of substituent(s)).

In the above aspect of the invention, the second host is preferably a substituted or unsubstituted phenanthrene or chrysene.

Examples of the phenanthrene or chrysene are those represented above.

In the above aspect of the invention, the first host preferably has the polycyclic fused aromatic skeleton, an affinity level of the second host is preferably higher than the affinity level of the first host, and a content of the second host in the host is preferably in a range from 1 mass % to 50 mass %.

When the content of the second host is less than 1 mass % of the entire host, the production of the device becomes unfavorably difficult. On the other hand, when the content of the second host exceed 50 mass % of the entire host, the shortage of the content of the first host may result in deterioration in luminous efficiency and decrease in emission lifetime.

Incidentally, the content of the second host in the entire host is more preferably in a range from 5 mass % to 49 mass %.

Preferably in the aspect of the invention, the phosphorescent dopant contains a metal complex having: a metal selected from Ir, Pt, Os, Au, Cu, Re and Ru; and a ligand.

Examples of the dopants are PQIr (iridium(III)bis(2-phenyl quinolyl-N,C$^{2'}$) acetylacetonate) and Ir(ppy)$_3$ (fac-tris(2-phenylpyridine)iridium). Further examples are compounds shown below.

[Chemical Formula 53]

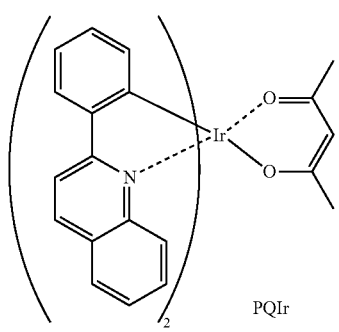

PQIr

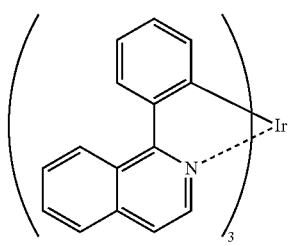

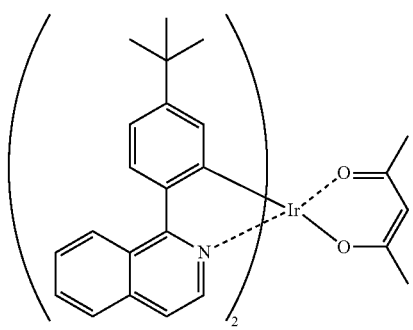

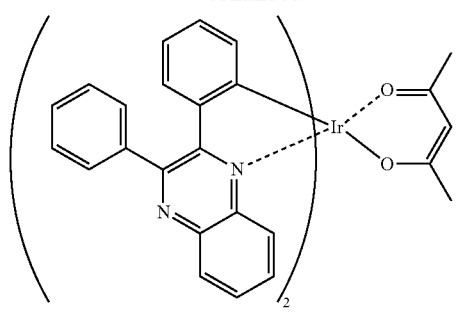
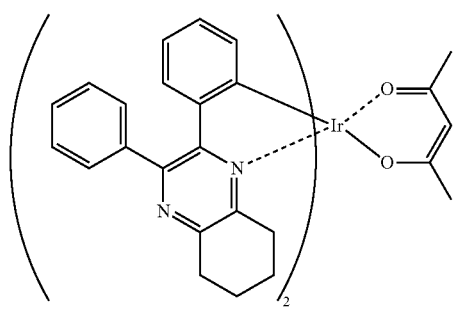
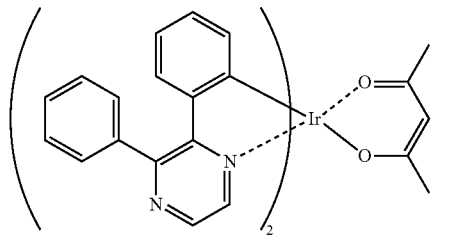
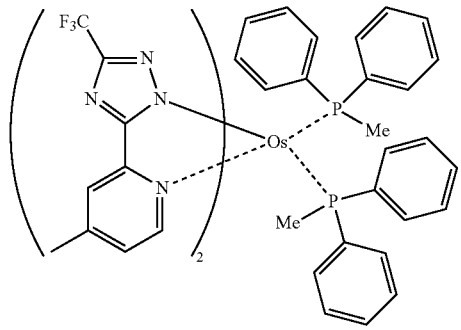
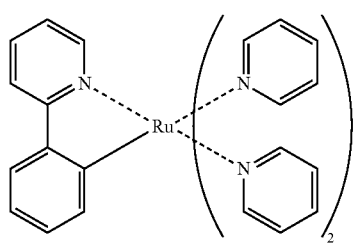
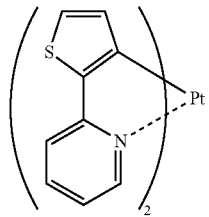
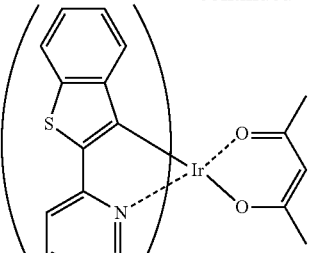
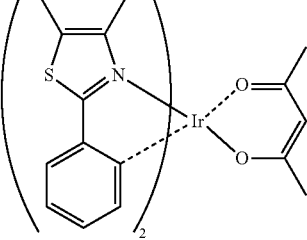
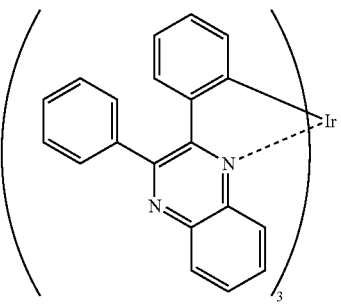
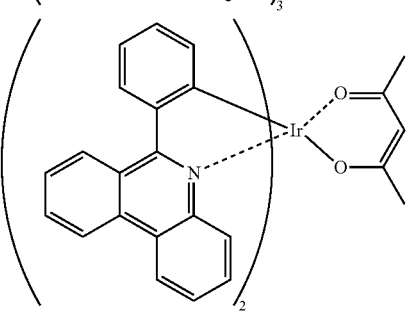
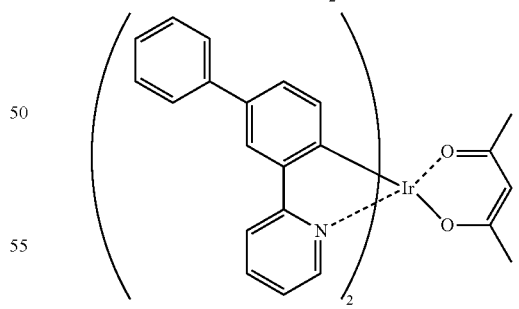
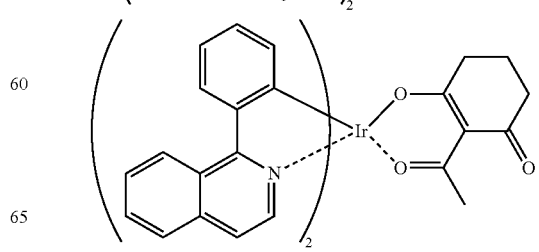

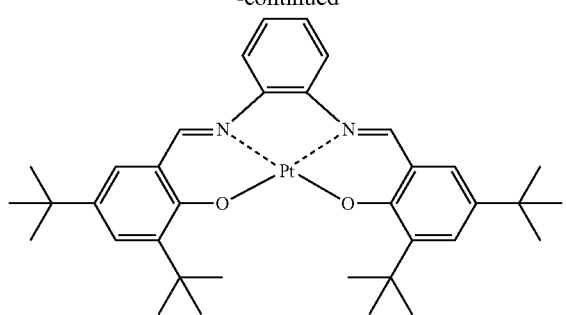
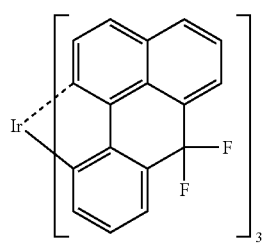
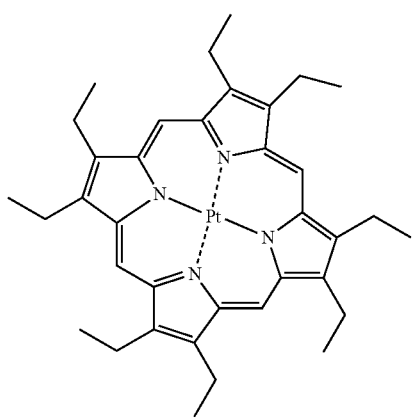
[Chemical Formula 54]
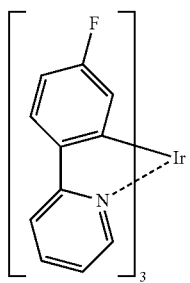
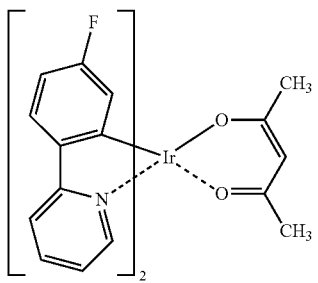
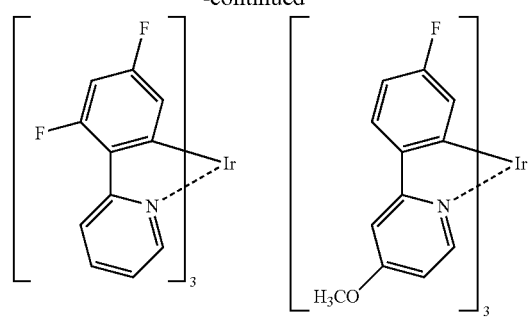
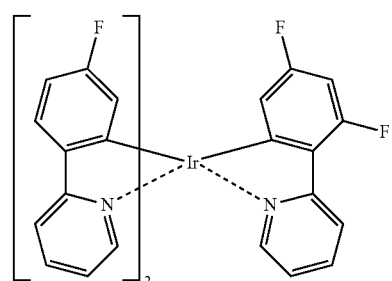
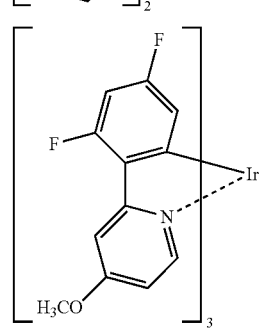
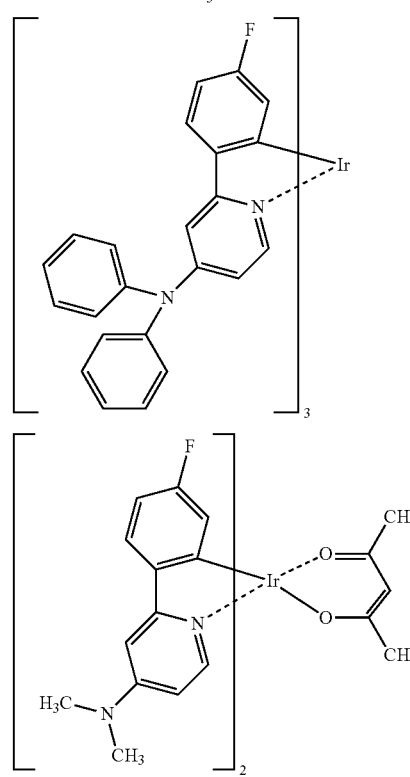

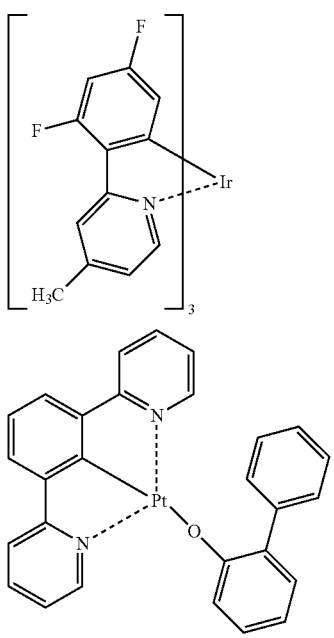
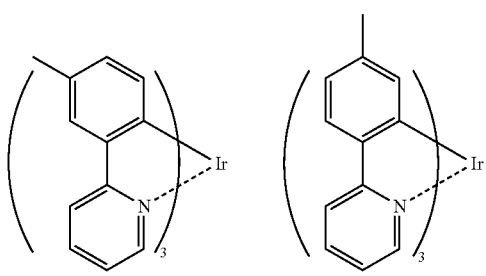
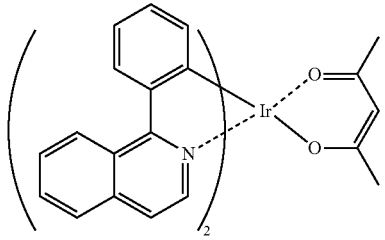
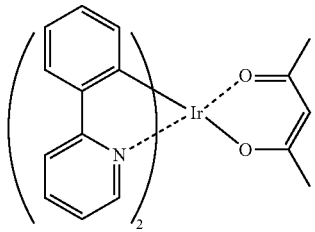
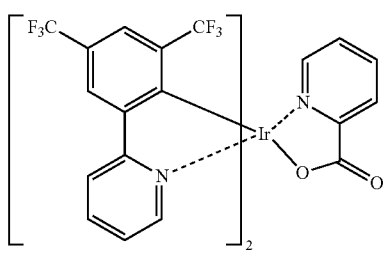
[Chemical Formula 55]
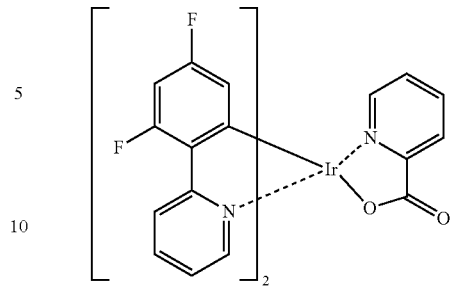
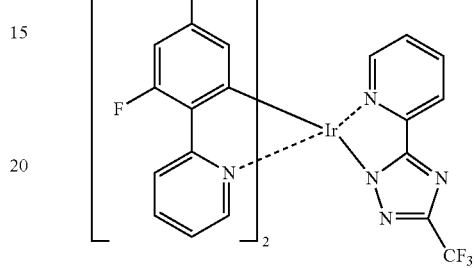
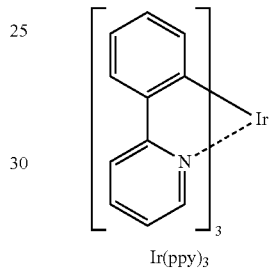
Ir(ppy)₃
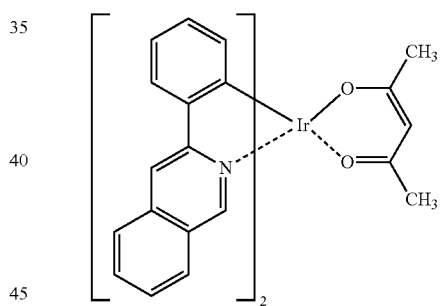
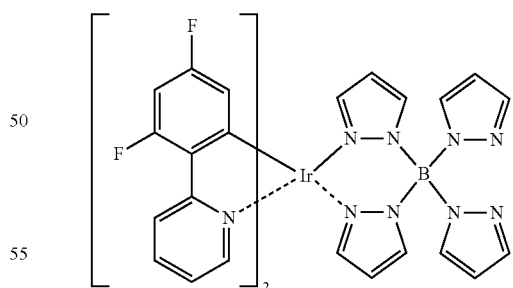
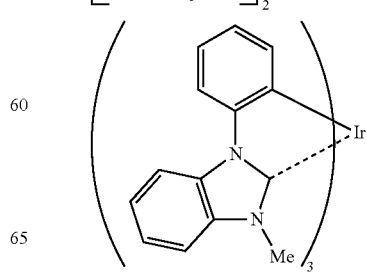

121
-continued
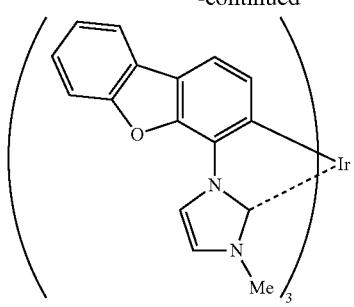
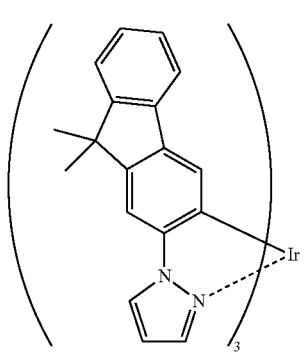
[Chemical Formula 56]
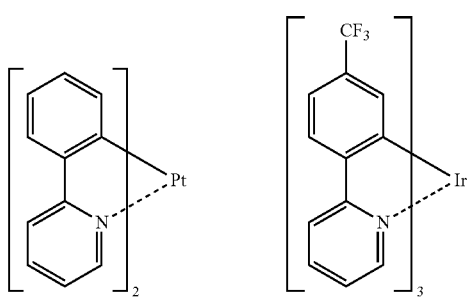
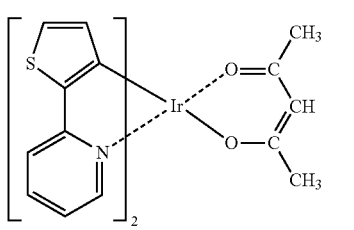
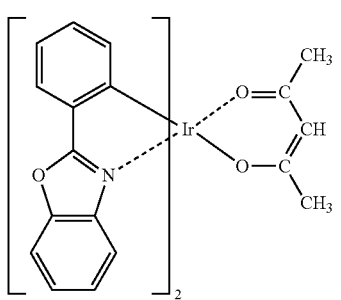
122
-continued
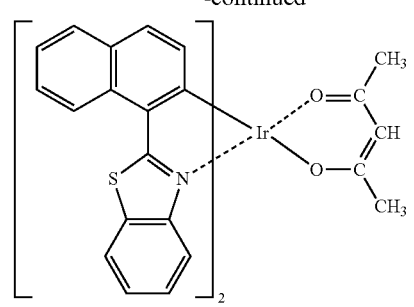
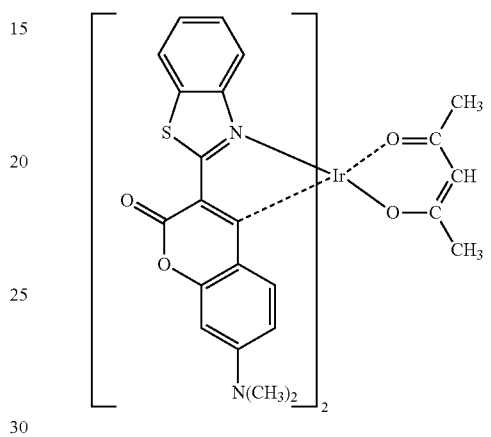
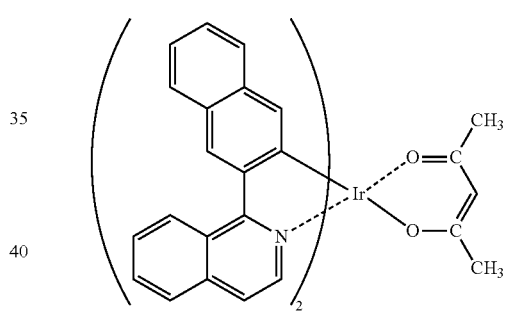
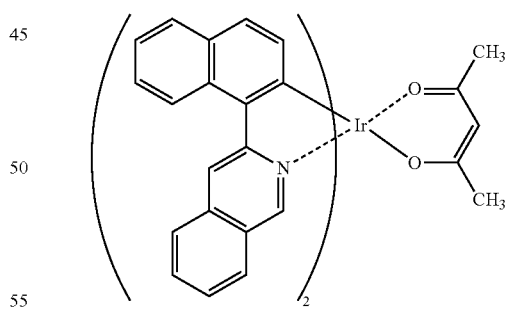
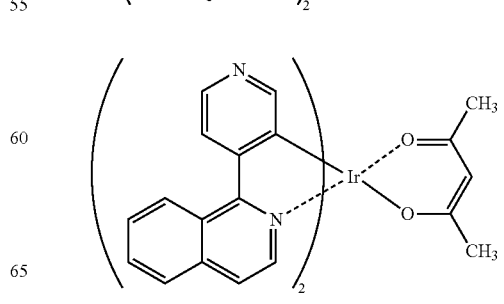

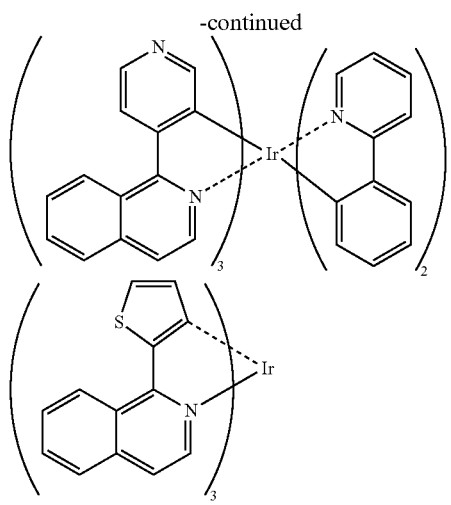

In the above aspect of the invention, a wavelength of a light of a maximum luminance of the phosphorescent dopant is preferably in a range from 500 nm to 700 nm.

The wavelength at the maximum luminance is preferably in a range from 580 nm to 680 nm, further preferably in a range from 600 nm to 660 nm.

By doping the phosphorescent dopant having such an emission wavelength to the host material usable for the invention so as to form the emitting layer, an organic electroluminescence device with a high efficiency can be provided.

In the above aspect of the invention, the organic thin-film layer comprises an electron injecting layer between the cathode and the phosphorescent-emitting layer, and the electron injecting layer preferably contains a nitrogen-containing heterocyclic derivative.

The electron injecting layer or the electron transporting layer, which aids injection of the electrons into the emitting layer, has a high electron mobility. The electron injecting layer is provided for adjusting energy level, by which, for instance, sudden changes in the energy level can be reduced. As a material for the electron injecting layer or the electron transporting layer, 8-hydroxyquinoline or a metal complex of its derivative, an oxadiazole derivative and a nitrogen-containing heterocyclic derivative are preferable. An example of the 8-hydroxyquinoline or the metal complex of its derivative is a metal chelate oxinoid compound containing a chelate of oxine (typically 8-quinolinol or 8-hydroxyquinoline). For instance, tris(8-quinolinol) aluminum can be used. Examples of the oxadiazole derivative are as follows.

[Chemical Formula 57]

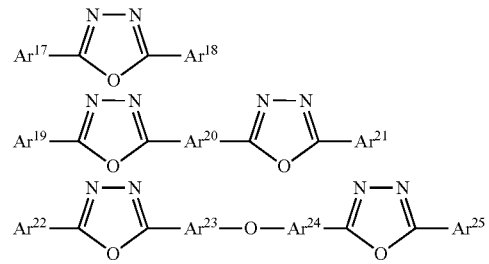

In the formula, $Ar^{17}$, $Ar^{18}$, $Ar^{19}$, $Ar^{21}$, $Ar^{22}$ and $Ar^{25}$ each represent a substituted or unsubstituted aryl group. $Ar^{17}$, $Ar^{19}$ and $Ar^{22}$ may be the same as or different from $Ar^{18}$, $Ar^{21}$ and $Ar^{25}$ respectively. $Ar^{20}$, $Ar^{23}$ and $Ar^{24}$ each represent a substituted or unsubstituted arylene group. $Ar^{23}$ and $Ar^{24}$ may be mutually the same or different.

Examples of the arylene group are a phenylene group, naphthylene group, biphenylene group, anthranylene group, perylenylene group and pyrenylene group. Examples of the substituent therefor are an alkyl group having 1 to 10 carbon atoms, alkoxy group having 1 to 10 carbon atoms and cyano group. Such an electron transport compound is preferably an electron transport compound that can be favorably formed into a thin film(s). Examples of the electron transport compounds are as follows.

[Chemical Formula 58]

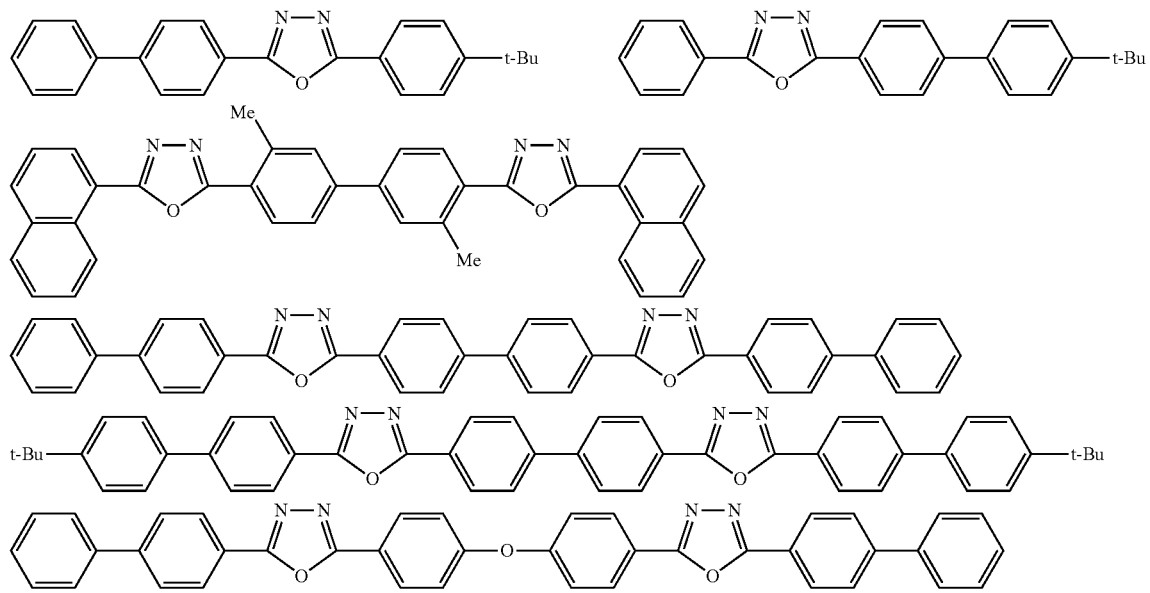

An example of the nitrogen-containing heterocyclic derivative is a nitrogen-containing compound that is not a metal complex, the derivative being formed of an organic compound represented by one of the following general formulae. Examples of the nitrogen-containing heterocyclic derivative are five-membered ring or six-membered ring derivative having a skeleton represented by the formula (A) and a derivative having a structure represented by the formula (B).

[Chemical Formula 59]

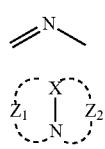

(A)

(B)

In the formula (B), X represents a carbon atom or nitrogen atom. $Z_1$ and $Z_2$ each independently represent an atom group capable of forming a nitrogen-containing heterocycle.

[Chemical Formula 60]

(C)

Preferably, the nitrogen-containing heterocyclic derivative is an organic compound having a nitrogen-containing aromatic polycyclic group having a five-membered ring or six-membered ring. When the nitrogen-containing heterocyclic derivative includes such nitrogen-containing aromatic polycyclic series having plural nitrogen atoms, the nitrogen-containing heterocyclic derivative may be a nitrogen-containing aromatic polycyclic organic compound having a skeleton formed by a combination of the skeletons respectively represented by the formulae (A) and (B), or by a combination of the skeletons respectively represented by the formulae (A) and (C).

A nitrogen-containing group of the nitrogen-containing organic compound is selected from nitrogen-containing heterocyclic groups respectively represented by the following general formulae.

[Chemical Formula 61]

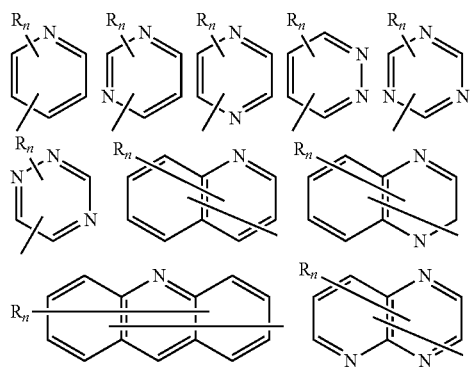

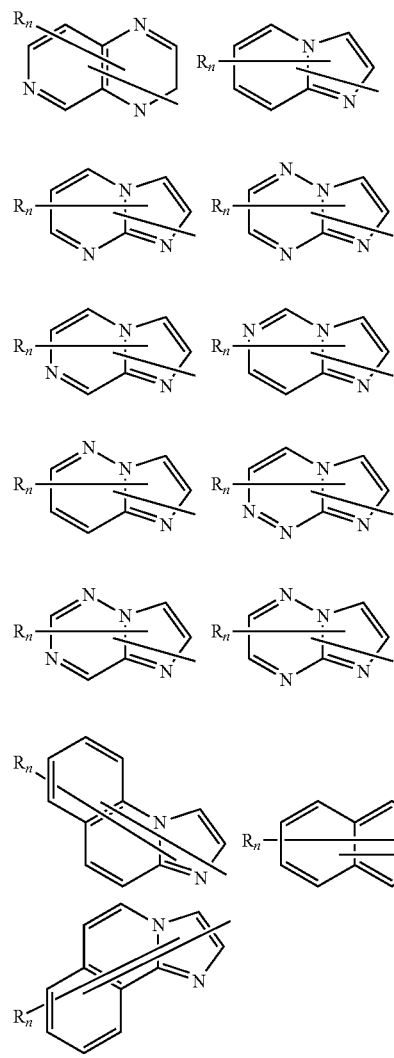

In the respective formulae: R represents an aryl group having 6 to 40 carbon atoms, a heteroaryl group having 3 to 40 carbon atoms, an alkyl group having 1 to 20 carbon atoms or an alkoxy group having 1 to 20 carbon atoms; and n represents an integer in a range of 0 to 5. When n is an integer of 2 or more, the plurality of R may be mutually the same or different.

A preferable specific compound is a nitrogen-containing heterocyclic derivative represented by the following formula.

$HAr-L^1-Ar^1-Ar^2$ [Chemical Formula 62]

In the formula, HAr represents a substituted or unsubstituted nitrogen-containing heterocycle having 3 to 40 carbon atoms; $L^1$ represents a single bond, a substituted or unsubstituted arylene group having 6 to 40 carbon atoms, or a substituted or unsubstituted heteroarylene group having 3 to 40 carbon atoms; $Ar^1$ represents a substituted or unsubstituted divalent aromatic hydrocarbon group having 6 to 40 carbon atoms; and $Ar^2$ represents a substituted or unsubstituted aryl group having 6 to 40 carbon atoms, or a substituted or unsubstituted heteroaryl group having 3 to 40 carbon atoms.

HAr is exemplarily selected from the following group.

[Chemical Formula 63]
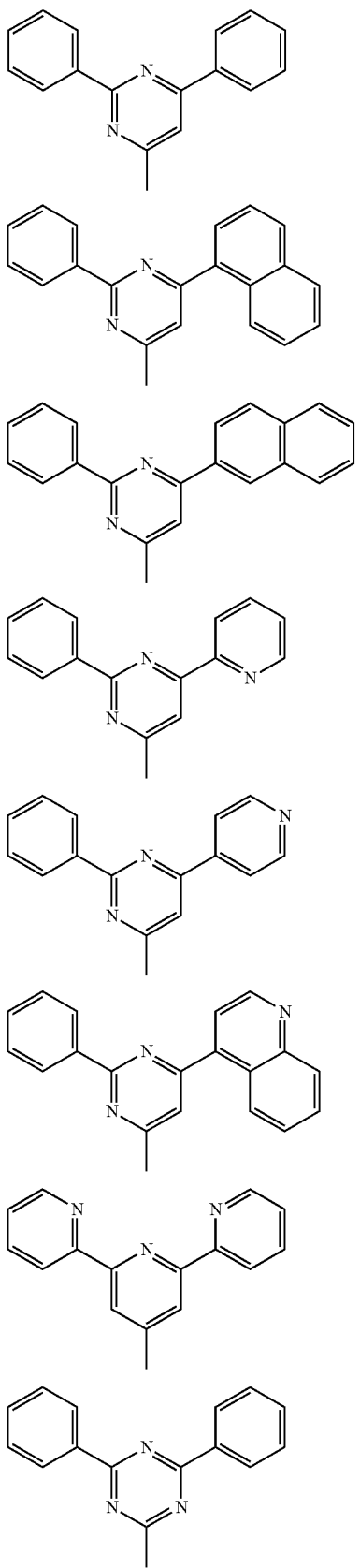
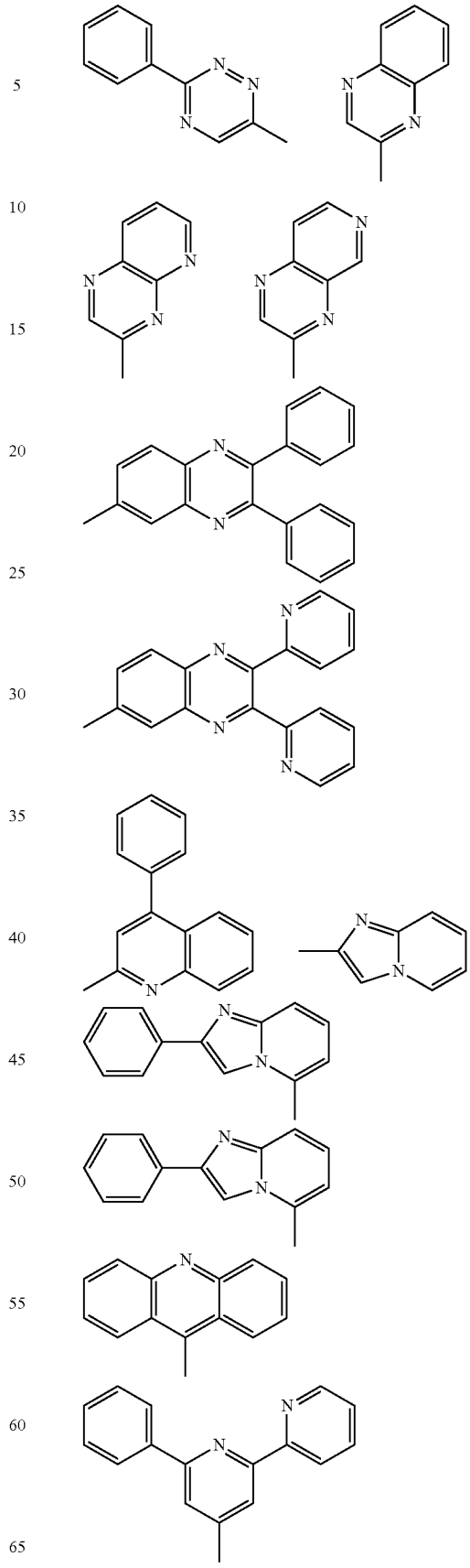
-continued $L^1$ is exemplarily selected from the following groups.

[Chemical Formula 64]

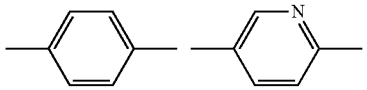

$Ar^2$ is exemplarily selected from the following groups.

[Chemical Formula 65]

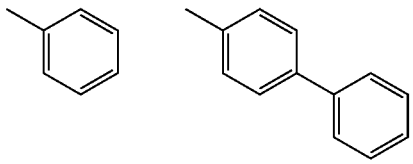

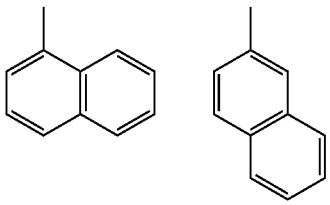

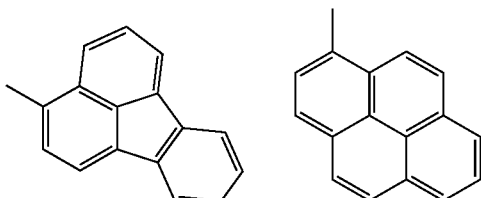

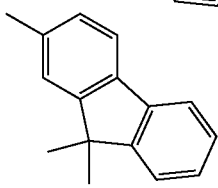

$Ar^1$ is exemplarily selected from the following arylanthranil groups.

[Chemical Formula 66]

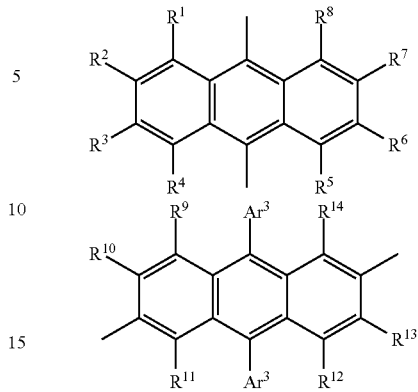

In the formula, $R^1$ to $R^{14}$ each independently represent a hydrogen atom, halogen atom, alkyl group having 1 to 20 carbon atoms, alkoxy group having 1 to 20 carbon atoms, aryloxy group having 6 to 40 carbon atoms, substituted or unsubstituted aryl group having 6 to 40 carbon atoms or heteroaryl group having 3 to 40 carbon atoms. $Ar^3$ represents a substituted or unsubstituted aryl group having 6 to 40 carbon atoms or heteroaryl group having 3 to 40 carbon atoms.

The nitrogen-containing heterocyclic derivative is also preferably a nitrogen-containing heterocyclic derivative in which $R^1$ to $R^8$ in the structure of $Ar^1$ represented by the above formula each represent a hydrogen atom.

Other than the above, the following compound (see JP-A-9-3448) can be favorably used.

[Chemical Formula 67]

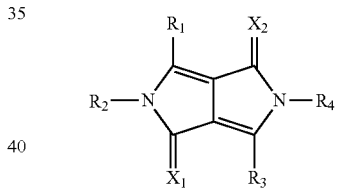

In the formula, $R_1$ to $R_4$ each independently represent a hydrogen atom, a substituted or unsubstituted aliphatic group, a substituted or unsubstituted alicyclic group, a substituted or unsubstituted carbocyclic aromatic ring group, or substituted or unsubstituted heterocyclic group. $X_1$ and $X_2$ each independently represent an oxygen atom, a sulfur atom or a dicyanomethylene group.)

Alternatively, the following compound (see JP-A-2000-173774) can also be favorably used.

[Chemical Formula 68]

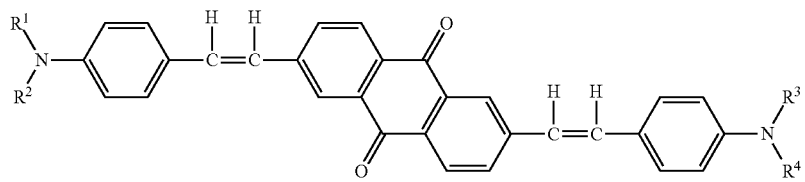

In the formula, $R^1$, $R^2$, $R^3$ and $R^4$, which may be mutually the same or different, each represent an aryl group represented by the following formula.

[Chemical Formula 69]

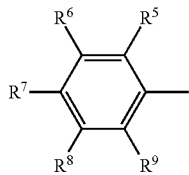

In the formula, $R^5$, $R^6$, $R^7$, $R^8$ and $R^9$, which may be mutually the same or different, each represent a hydrogen atom, a saturated or unsaturated alkoxyl group, an alkyl group, an amino group or an alkylamino group. At least one of $R^5$, $R^6$, $R^7$, $R^8$ and $R^9$ represents a saturated or unsaturated alkoxyl group, an alkyl group, an amino group or an alkylamino group.

A polymer compound containing the nitrogen-containing heterocyclic group or a nitrogen-containing heterocyclic derivative may be used.

The electron transporting layer preferably contains at least one of nitrogen-containing heterocycle derivatives respectively represented by the following formulae (201) to (203).

[Chemical Formula 70]

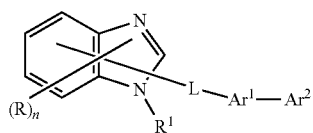 (201)

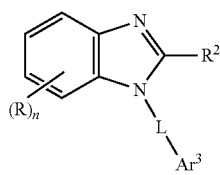 (202)

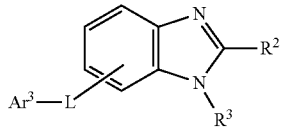 (203)

In the formulae (201) to (203), R represents a hydrogen atom, a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or a substituted or unsubstituted alkoxy group having 1 to 20 carbon atoms. n represents an integer of 0 to 4.

$R^1$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or an alkoxy group having 1 to 20 carbon atoms.

$R^2$ and $R^3$ respectively independently represent a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or a substituted or unsubstituted alkoxy group having 1 to 20 carbon atoms.

L represents a substituted or unsubstituted arylene group having 6 to 60 carbon atoms, a substituted or unsubstituted pyridinylene group, a substituted or unsubstituted quinolinylene group, or a substituted or unsubstituted fluorenylene group.

$Ar^1$ represents a substituted or unsubstituted arylene group having 6 to 60 carbon atoms, a substituted or unsubstituted pyridinylene group, or a substituted or unsubstituted quinolinylene group.

$Ar^2$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or a substituted or unsubstituted alkoxy group having 1 to 20 carbon atoms.

$Ar^3$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a group represented by -$Ar^1$-$Ar^2$ ($Ar^1$ and $Ar^2$ may be the same as the above (-$Ar^3$=-$Ar^1$-$Ar^2$)).

Examples of the substituents of -$Ar^1$, -$Ar^2$ and -$Ar^3$ are a substituted or unsubstituted aryl group, a pyridyl group, a quinolyl group and an alkyl group having 6 to 20 carbon atoms.

When L and $Ar^1$ are not symmetrical, either of the substitution sites of $Ar^1$ and $Ar^2$ jointed to L and $Ar^1$ may be selected.

In the formulae (201) to (203), R represents a hydrogen atom, a substituted or unsubstituted aryl group having 6 to 60 carbon atoms, a substituted or unsubstituted pyridyl group, substituted or unsubstituted quinolyl group, a substituted or unsubstituted alkyl group having 1 to 20 carbon atoms, or a substituted or unsubstituted alkoxy group having 1 to 20 carbon atoms.

The aryl group having 6 to 60 carbon atom is preferably an aryl group having 6 to 40 carbon atoms, more preferably an aryl group having 6 to 20 carbon atoms. Examples of such an aryl group are a phenyl group, naphthyl group, anthryl group, phenanthryl group, naphthacenyl group, chrysenyl group, pyrenyl group, biphenyl group, terphenyl group, tolyl group, t-butylphenyl group, (2-phenylpropyl)phenyl group, fluoranthenyl group, fluorenyl group, a monovalent group formed of spirobifluorene, perfluorophenyl group, perfluoronaphthyl group, perfluoroanthryl group, perfluorobiphenyl group, a monovalent group formed of 9-phenylanthracene, a monovalent group formed of 9-(1'naphthyl) anthracene, a monovalent group formed of 9-(2'-naphthyl)anthracene, a monovalent group formed of 6-phenylchrysene, and a monovalent group formed of 9-[4-(diphenylamine)phenyl]anthracene, among which a phenyl group, naphthyl group, biphenyl group, terphenyl group, 9-(10-phenyl)anthryl group, 9-[10-(1'-naphthyl)]anthryl group and 9-[10-(2'-naphthyl)]anthryl group are preferable.

The alkyl group having 1 to 20 carbon atoms is preferably an alkyl group having 1 to 6 carbon atoms. Examples of such an alkyl group are a methyl group, ethyl group, propyl group, butyl group, pentyl group, hexyl group, and a haloalkyl group such as trifluoromethyl group. When such an alkyl group has 3 or more carbon atoms, the alkyl group may be linear, cyclic or branched.

The alkoxy group having 1 to 20 carbon atoms is preferably an alkoxy group having 1 to 6 carbon atoms. Examples of such an alkoxy group are a methoxy group, ethoxy group, propoxy group, butoxy group, pentyloxy group, and hexyloxy group. When such an alkoxy group has 3 or more carbon atoms, the alkoxy group may be linear, cyclic or branched.

Examples of a substituent for the group represented by R are a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms, or a substituted or unsubstituted heteroaryl group having 3 to 40 carbon atoms.

Examples of the halogen atom are fluorine, chlorine, bromine, iodine and the like.

Examples for each of the alkyl group having 1 to 20 carbon atoms, the alkoxy group having 1 to 20 carbon atoms, and an aryl group having 6 to 40 carbon atoms may be the same as the above examples.

Examples of the aryloxy group having 6 to 40 carbon atoms are a phenoxy group and a biphenyloxy group.

Examples of the heteroaryl group having 3 to 40 carbon atoms are a pyroryl group, furyl group, thienyl group, silolyl group, pyridyl group, quinolyl group, isoquinolyl group, benzofuryl group, imidazolyl group, pyrimidyl group, carbazolyl group, selenophenyl group, oxadiazolyl group and triazolyl group.

n is an integer in a range of 0 to 4, preferably 0 to 2.

In the formulae (201), $R^1$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, or an alkoxy group having 1 to 20 carbon atoms.

Examples for each of the groups, the preferable number of carbon atoms contained in each of the groups, and preferable examples of the substituent for each of the groups are the same as those described in relation to R.

In the formulae (202) and (203), $R^2$ and $R^3$ each independently represent a hydrogen atom, a substituted or unsubstituted aryl group having 6 to 60 carbon atoms, a substituted or unsubstituted pyridyl group, substituted or unsubstituted quinolyl group, a substituted or unsubstituted alkyl group having 1 to 20 carbon atoms, or a substituted or unsubstituted alkoxy group having 1 to 20 carbon atoms.

Examples for each of the groups, the preferable number of carbon atoms contained in each of the groups, and preferable examples of the substituent for each of the groups are the same as those described in relation to R.

In the formulae (201) to (203), L represents a substituted or unsubstituted arylene group having 6 to 60 carbon atoms, a substituted or unsubstituted pyridinylene group, a substituted or unsubstituted quinolinylene group, or a substituted or unsubstituted fluorenylene group.

The arylene group having 6 to 60 carbon atoms is preferably an arylene group having 6 to 40 carbon atoms, more preferably an arylene group having 6 to 20 carbon atoms. An example of such an arylene group is a divalent group formed by removing one hydrogen atom from the aryl group having been described in relation to R. Examples of a substituent for the group represented by L are the same as those described in relation to R.

Further, L may preferably be a group selected from groups represented by the following formulae.

[Chemical Formula 71]

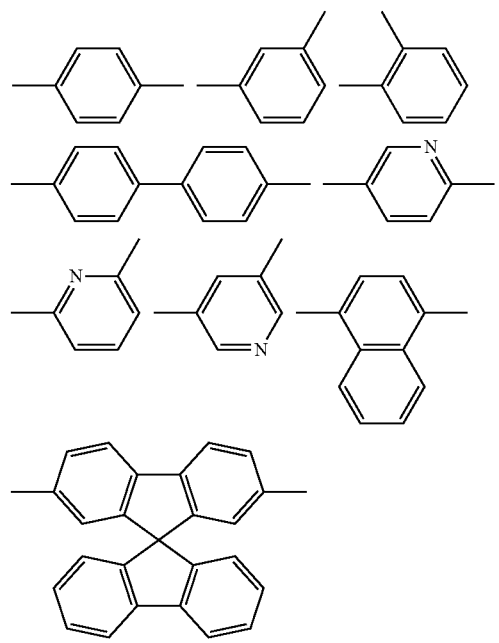

In the formula (201), $Ar^1$ represents a substituted or unsubstituted arylene group having 6 to 60 carbon atoms, a substituted or unsubstituted pyridinylene group, or a substituted or unsubstituted quinolinylene group. Examples of a substituent for the group represented by $Ar^1$ and $Ar^3$ are the same as those described in relation to R.

Alternatively, $Ar^1$ is preferably selected from a group consisting of fused ring groups respectively represented by the following formulae (101) to (110).

[Chemical Formula 72]

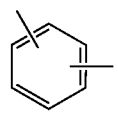
(101)

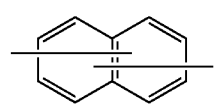
(102)

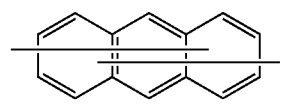
(103)

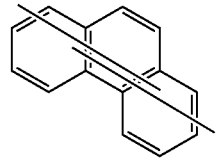
(104)

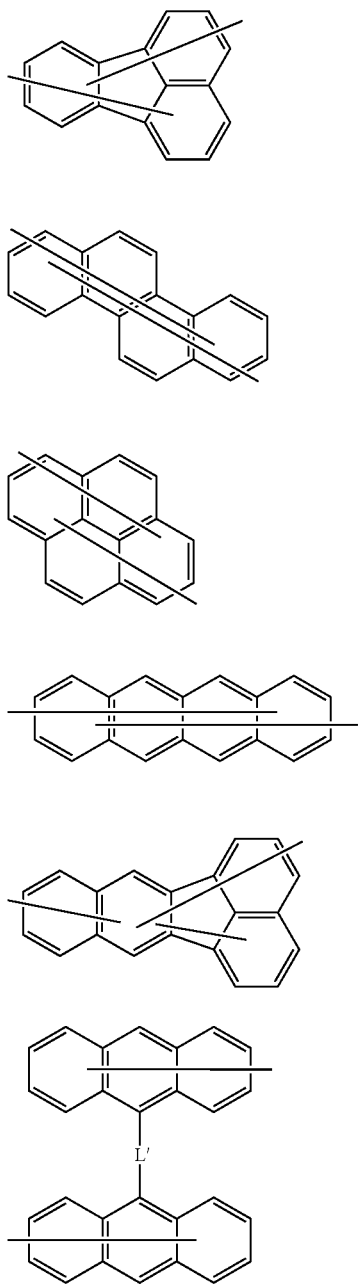

(105)
(106)
(107)
(108)
(109)
(110)

In the formulae (101) to (110), the fused ring groups each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above.

In the formula (110), L' represents a group selected from the groups represented by the following formulae.

[Chemical Formula 73]

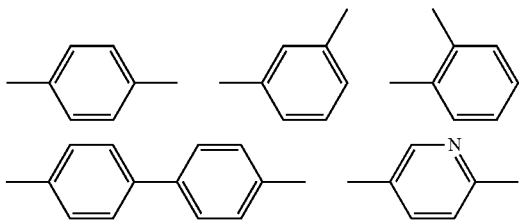

The structure of $Ar^1$ represented by the formula (103) is preferably a fused ring group represented by any one of the following formulae (111) to (125).

[Chemical Formula 74]

(111)

(112)

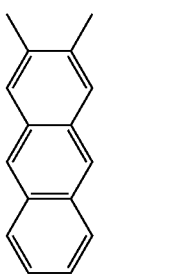

(113)

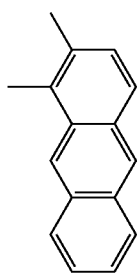 (114)
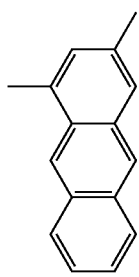 (115)
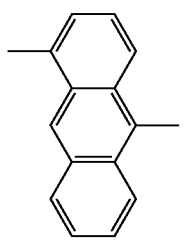 (116)
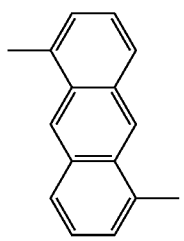 (117)
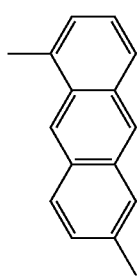 (118)
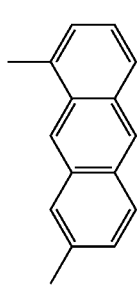 (119)
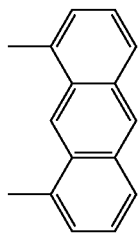 (120)
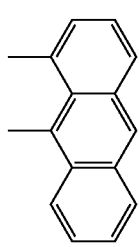 (121)
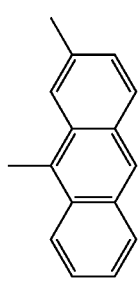 (122)
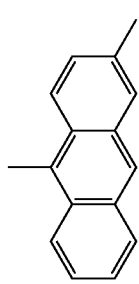 (123)
 (124)

(125)

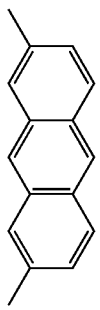

In the formulae (111) to (125), the fused rings each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above.

In the formula (201), $Ar^2$ represents a substituted or unsubstituted aryl group having 6 to 60 carbon atoms, a substituted or unsubstituted pyridyl group, substituted or unsubstituted quinolyl group, a substituted or unsubstituted alkyl group having 1 to 20 carbon atoms, or a substituted or unsubstituted alkoxy group having 1 to 20 carbon atoms.

Examples for each of the groups, the preferable number of carbon atoms contained in each of the groups, and preferable examples of the substituent for each of the groups are the same as those described in relation to R.

In the above formulae (202) and (203), $Ar^3$ represents a substituted or unsubstituted aryl group having 6 to 60 carbon atoms, a substituted or unsubstituted pyridyl group, a substituted or unsubstituted quinolyl group, a substituted or unsubstituted alkyl group having 1 to 20 carbon atoms, a substituted or unsubstituted alkoxy group having 1 to 20 carbon atoms, or a group represented by $-Ar^1-Ar^2$ ($Ar^1$ and $Ar^2$ may be the same as the above).

Examples for each of the groups, the preferable number of carbon atoms contained in each of the groups, and preferable examples of the substituent for each of the groups are the same as those described in relation to R.

Alternatively, $Ar^3$ is preferably selected from a group consisting of fused ring groups respectively represented by the following formulae (126) to (135).

[Chemical Formula 75]

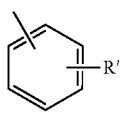
(126)

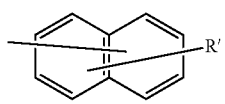
(127)

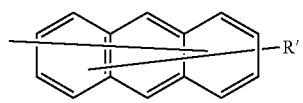
(128)

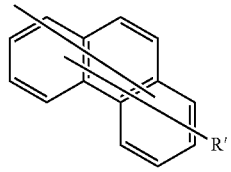
(129)

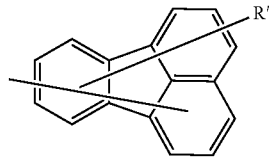
(130)

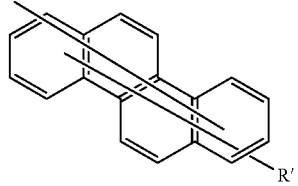
(131)

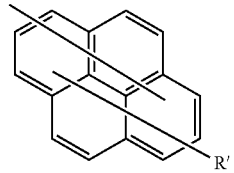
(132)

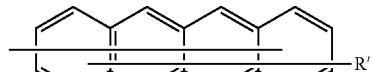
(133)

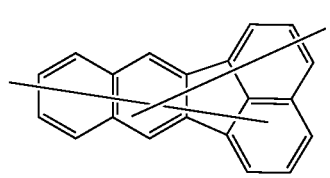
(134)

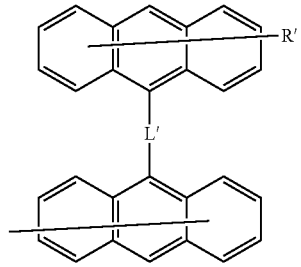
(135)

In the formulae (126) to (135), the fused ring groups each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above.

In the formula (135), L' represents the same as the above.

In the formulae (126) to (135), R' represents a hydrogen atom, a substituted or unsubstituted alkyl group having 1 to 20 carbon atoms, a substituted or unsubstituted aryl group having 6 to 40 carbon atoms, or a substituted or unsubstituted heteroaryl group having 3 to 40 carbon atoms. Examples for each of the groups are the same as those described above.

The structure of $Ar^3$ represented by the formula (128) is preferably a fused ring group represented by any one of the following formulae (136) to (158).

[Chemical Formula 76]

(136)

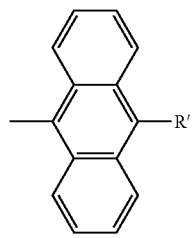

(137)

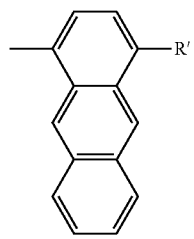

(138)

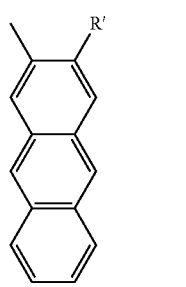

(139)

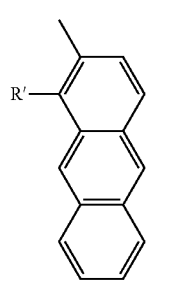

-continued (140)

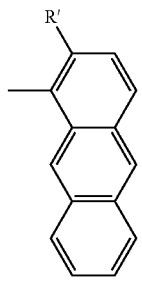

(141)

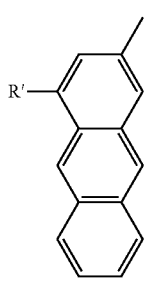

(142)

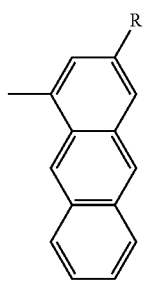

(143)

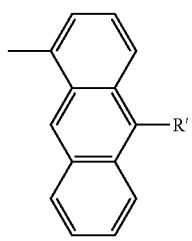

(144)

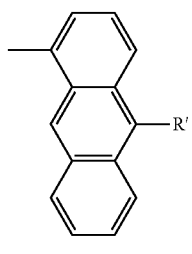

(145)

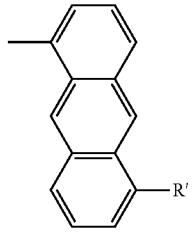

(146) 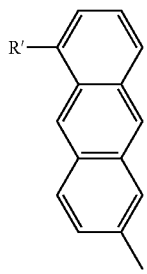
(147) 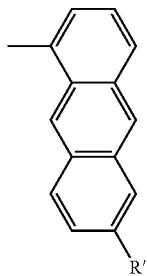
(148) 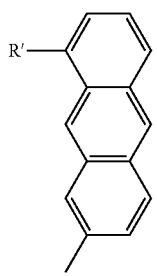
(149) 
(150) 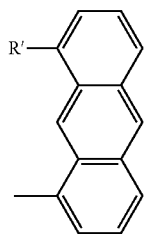
(151) 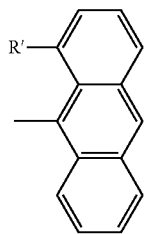
(152) 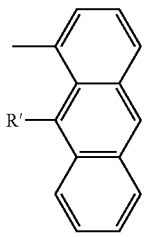
(153) 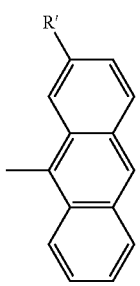
(154) 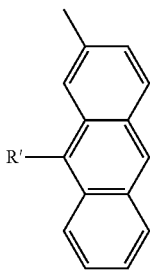
(155) 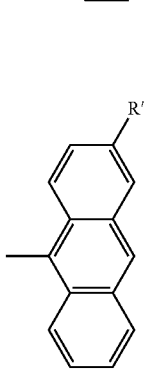
(156) 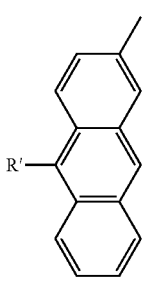

145
-continued (157)

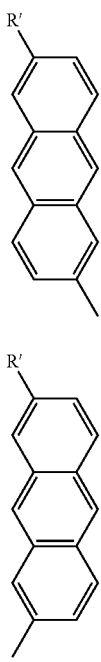

(158)

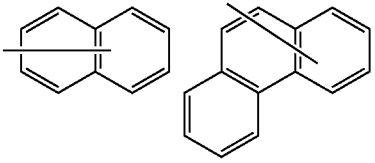

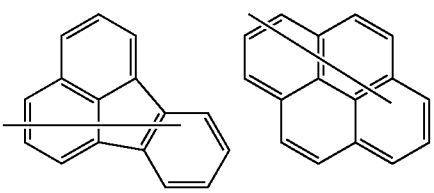

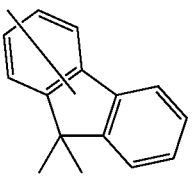

In the formulae (136) to (158), the fused ring groups each may be linked with a link group formed of a halogen atom, a substituted or unsubstituted alkyl group having 1 to 20 carbon atoms, a substituted or unsubstituted alkoxy group having 1 to 20 carbon atoms, a substituted or unsubstituted aryloxy group having 6 to 40 carbon atoms, a substituted or unsubstituted aryl group having 6 to 40 carbon atoms or a substituted or unsubstituted heteroaryl group having 3 to 40 carbon atoms. When the rings each are linked with plural link groups, the plural link groups may be mutually the same or different. Examples for each of the groups are the same as those described above. R' is the same as the above.

Preferably, $Ar^2$ and $Ar^3$ may respectively independently be a group selected from the groups represented by the following formulae.

[Chemical Formula 77]

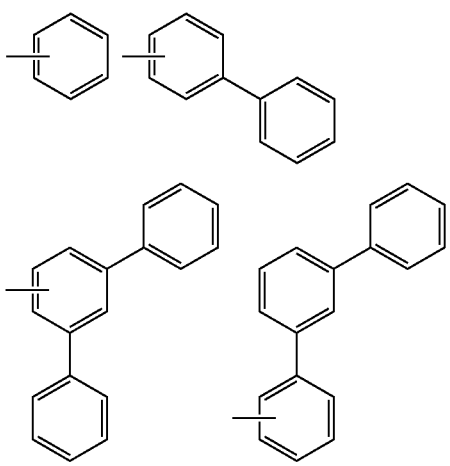

146
-continued

Examples of the nitrogen-containing heterocyclic derivative represented by any one of the general formulae (201) to (203) according to the present invention will be shown below. However, the present invention is not limited to the exemplary compounds shown below.

In the chart shown below, HAr represents any one of structures represented by the formulae (201) to (203).

[Chemical Formula 78]

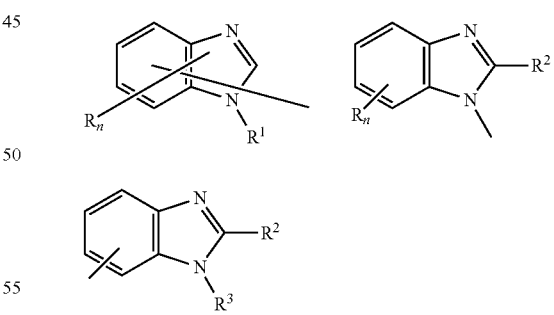

In the following exemplary compounds, the exemplary compounds 1-1 to 1-17, 2-1 to 2-9, 3-1 to 3-6, 4-1 to 4-12, 5-1 to 5-6, 6-1 to 6-5 and 8-1 to 8-13 correspond to the formula (201). The exemplary compounds 9-1 to 9-17, 10-1 to 10-9, 11-1 to 11-6, 12-1 to 12-11, 13-1 to 13-6 and 14-1 to 14-5 correspond to the formula (202). The exemplary compounds 7-1 to 7-10, 15-1 to 15-13, 16-1 to 16-8 and 17-1 to 17-8 correspond to the formula (203).

[Chemical Formula 79]
| | HAr | L | HAr—L—Ar¹—Ar² Ar¹ | Ar² |
|---|---|---|---|---|
| 1-1 | 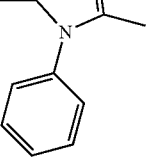 | 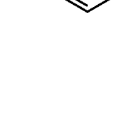 | 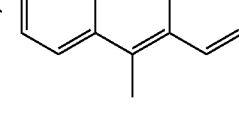 |  |
| 2 | 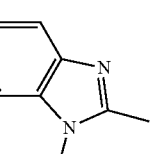 | 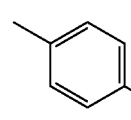 | 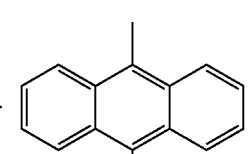 | 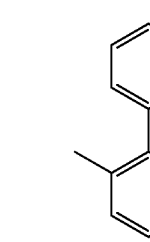 |
| 3 | 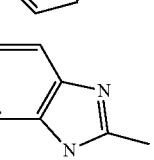 | 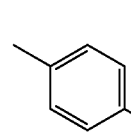 | 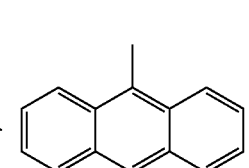 | 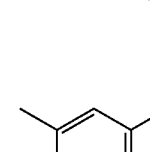 |
| 4 | 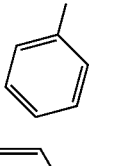 |  | 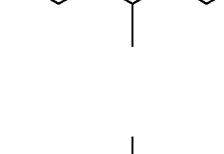 | 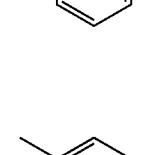 |
| 5 | 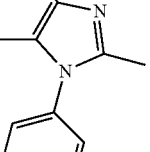 | 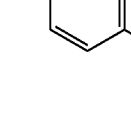 | 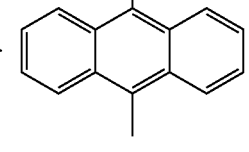 | 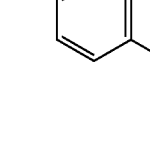 |
| 6 | 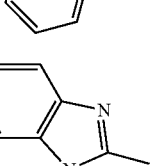 | 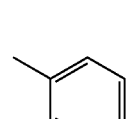 | 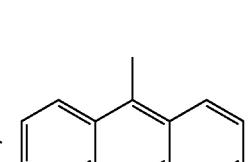 | 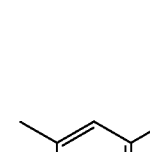 |

US 8,574,725 B2
149                                                                                                             150
-continued
|    | HAr | L | Ar¹ | Ar² [Chemical Formula 79] |
|----|-----|---|-----|-----|
| 7  | 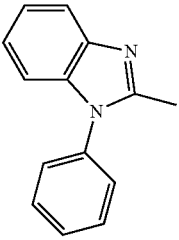 |  | 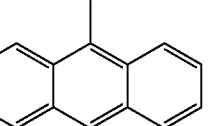 | 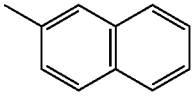 |
| 8  |  | 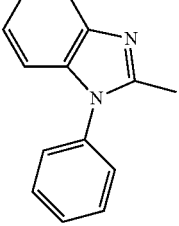 |  | 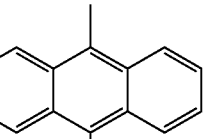 |
| 9  | 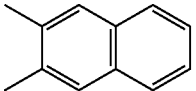 |  | 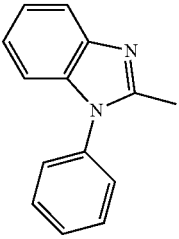 |  |
| 10 | 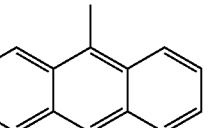 | 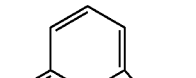 |  | 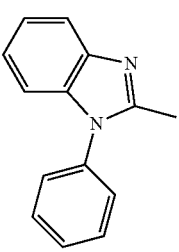 [SMILES: Cc1nc2ccccc2n1-c1ccccc1] |
| 11 |  | 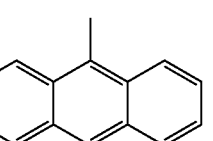 | 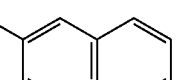 |  |
| 12 | 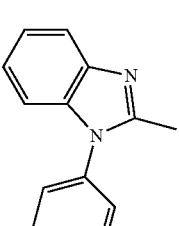 |  | 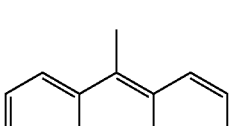 | 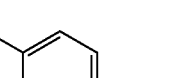 |

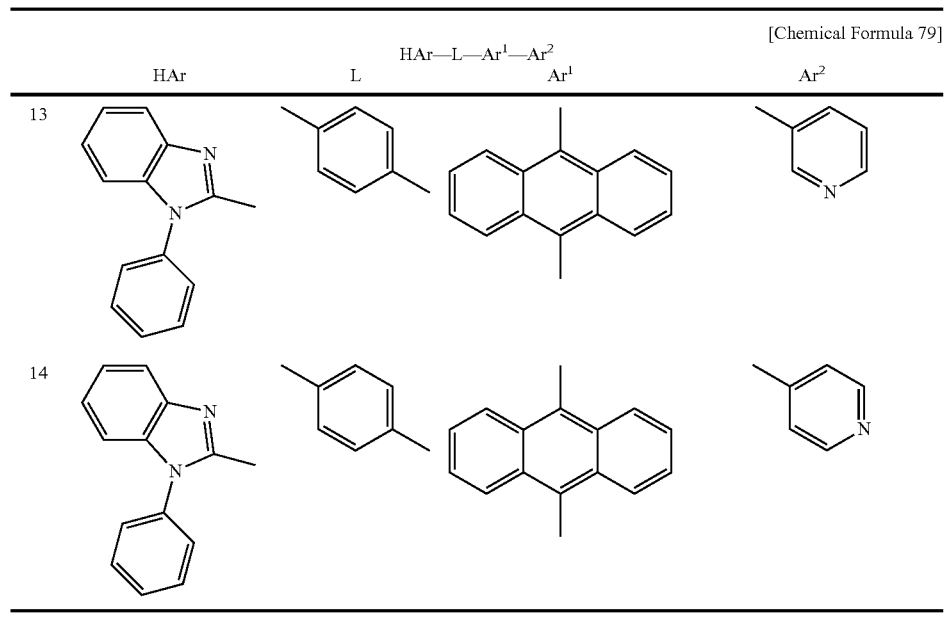
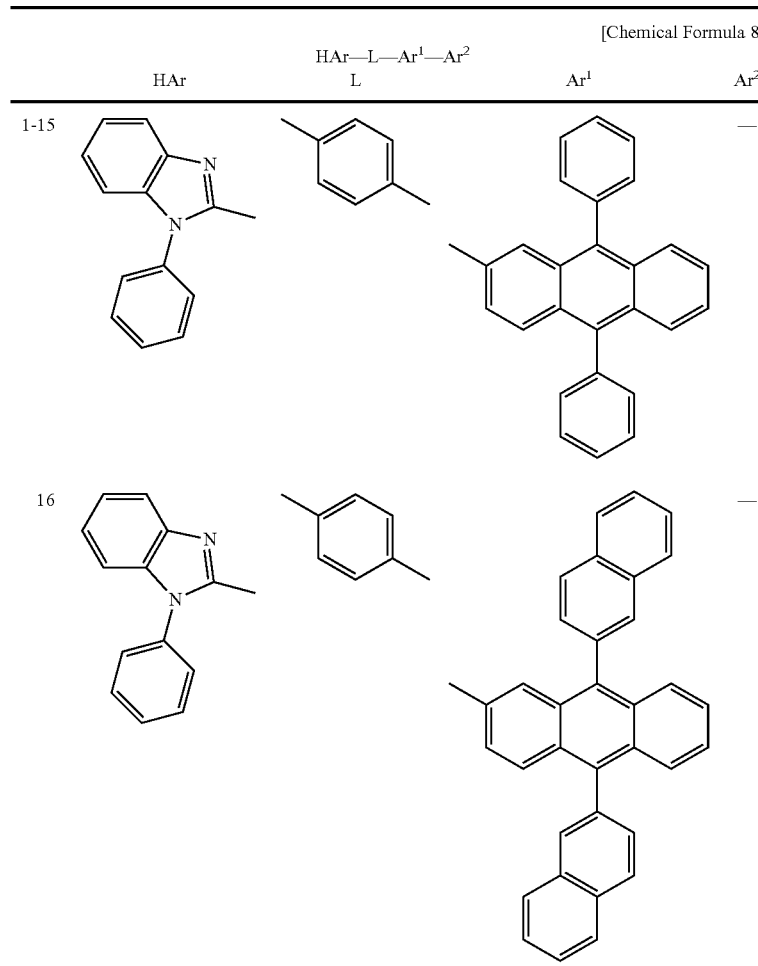

[Chemical Formula 80]
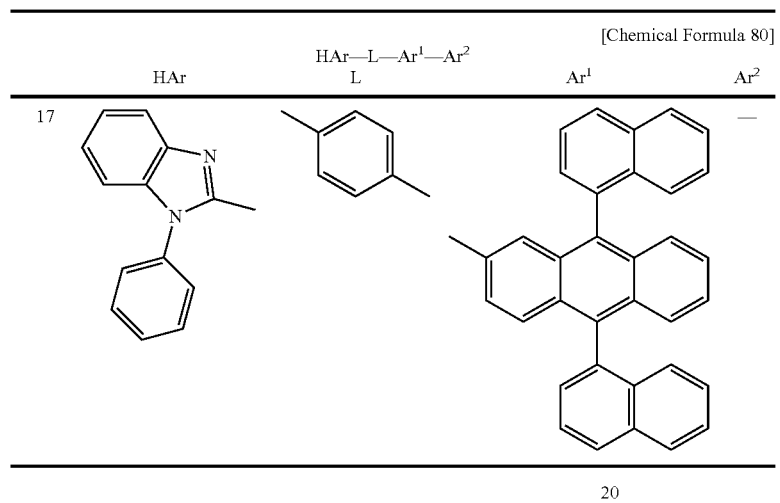
[Chemical Formula 81]
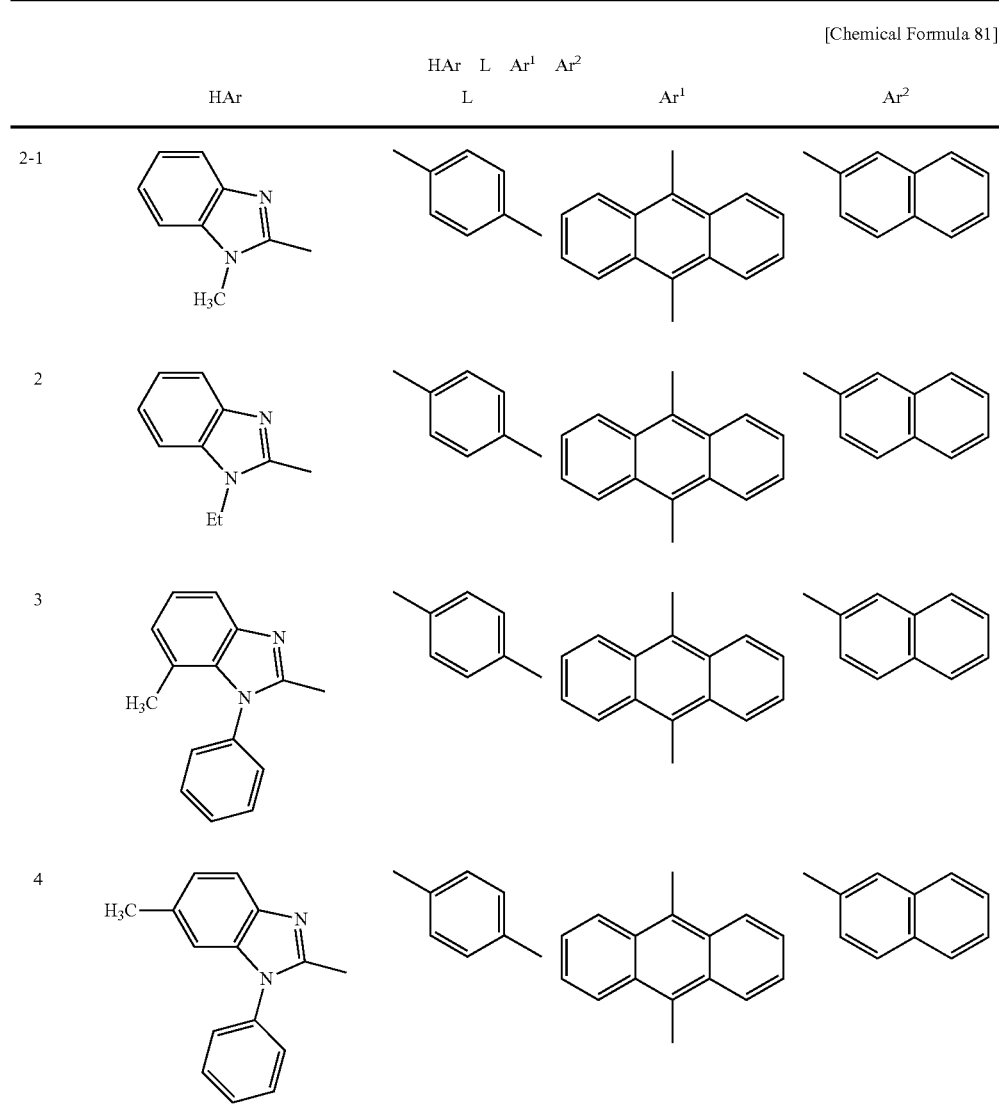

-continued
[Chemical Formula 81]
| | HAr | HAr L Ar¹ Ar² L | Ar¹ | Ar² |
|---|---|---|---|---|
| 5 | 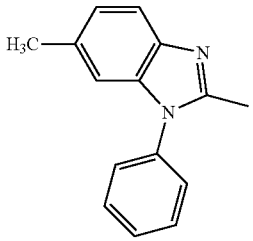 | 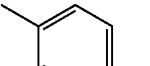 | 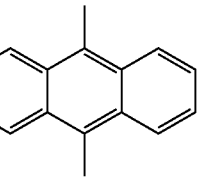 | 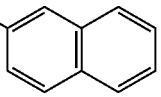 |
| 6 | 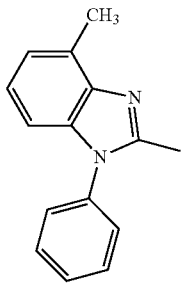 | 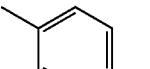 | 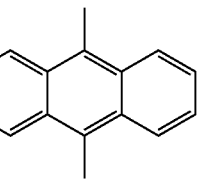 | 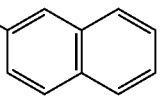 |
| 7 | 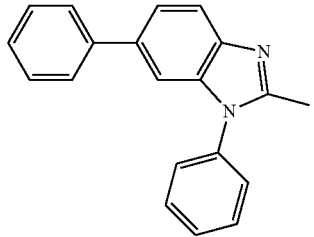 | 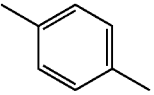 | 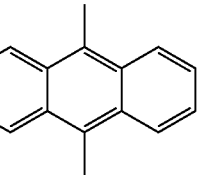 | 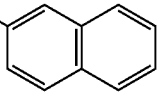 |
| 8 | 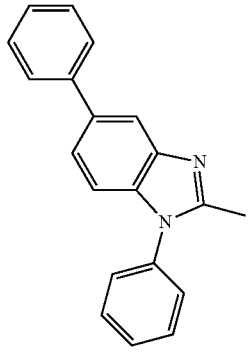 | 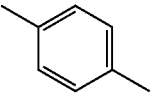 | 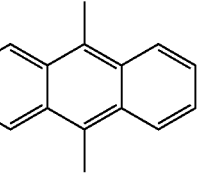 | 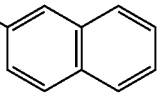 |
| 9 | 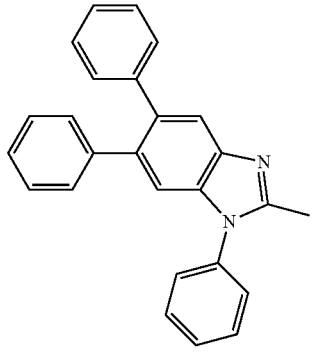 | 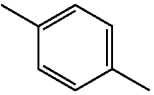 | 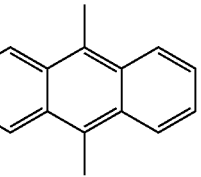 | 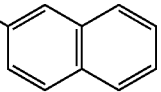 |

[Chemical Formula 82]

| | HAr | L | Ar¹ | Ar² |
|---|---|---|---|---|
| 3-1 | | | | |
| 2 | | | | |
| 3 | | | | |
| 4 | | | | |
| 5 | | | | |

[Chemical Formula 82]
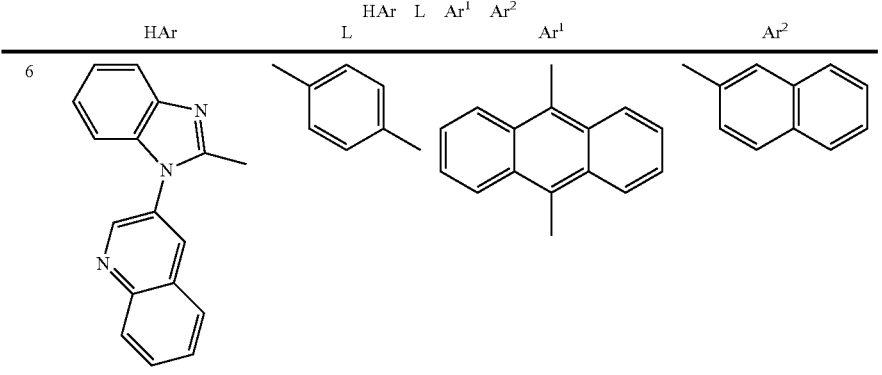
[Chemical Formula 83]
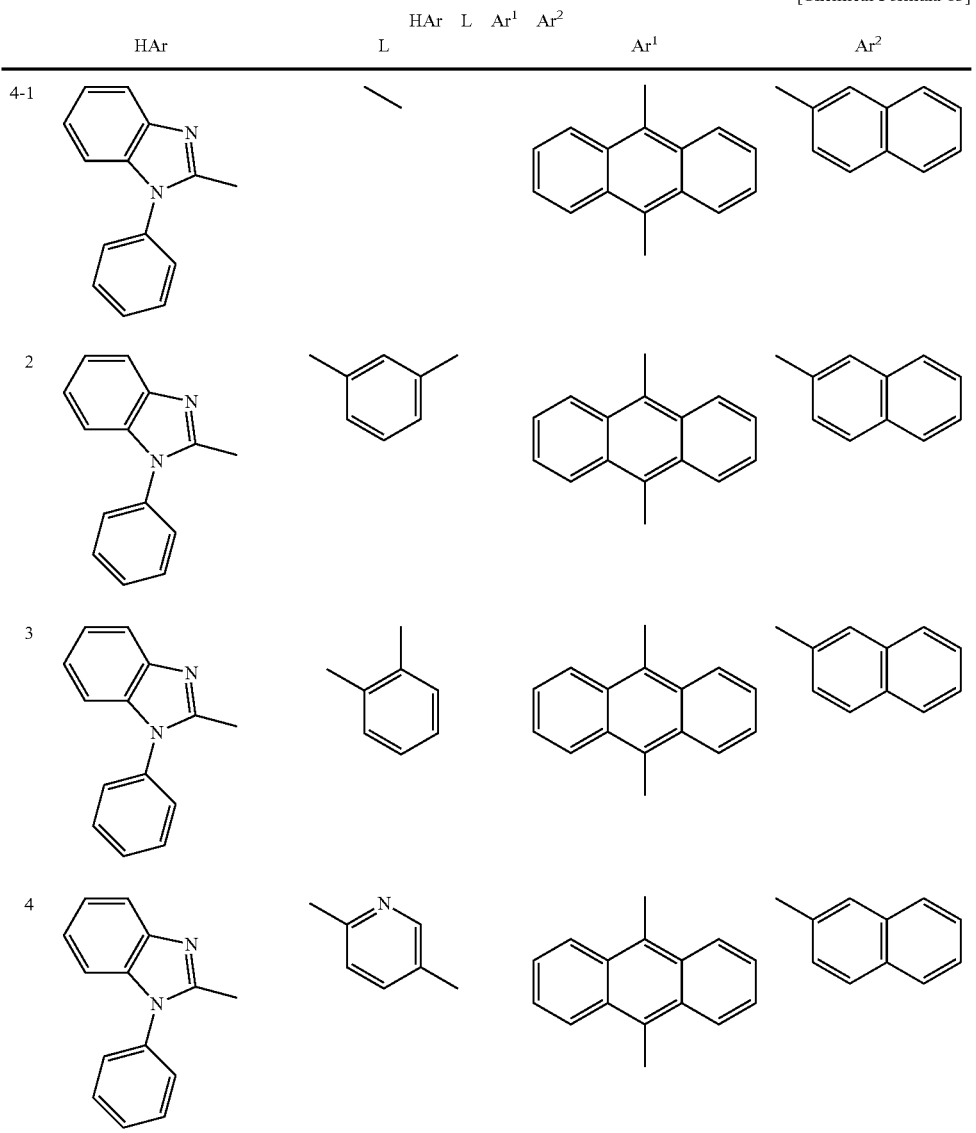

-continued

| | HAr | L | Ar¹ | Ar² |
|---|---|---|---|---|
| 5 | | | | |
| 6 | | | | |
| 7 | | | | |
| 8 | | | | |
| 9 | | | | |
| 10 | | | | |

-continued
[Chemical Formula 83]
| | HAr | L | Ar¹ | Ar² |
|---|---|---|---|---|
| 11 | 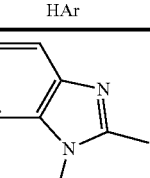 | 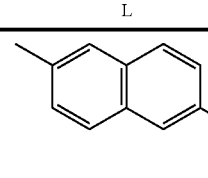 | 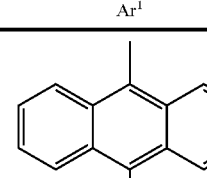 | 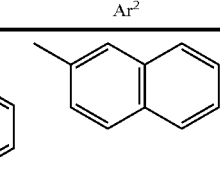 |
| 12 | 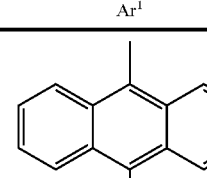 | 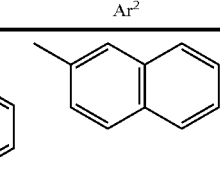 | 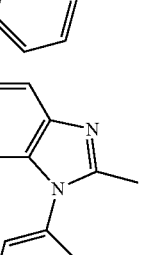 | 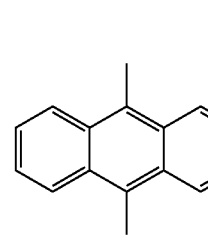 |
[Chemical Formula 84]
HAr—L—Ar¹—Ar²
| | HAr | L | Ar¹ | Ar² |
|---|---|---|---|---|
| 5-1 | 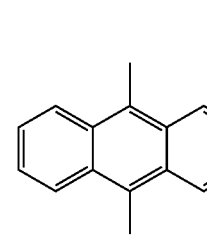 | | 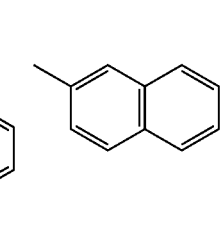 | |
| 2 | 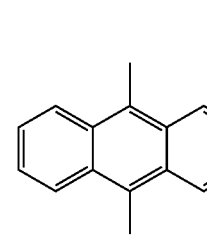 | | 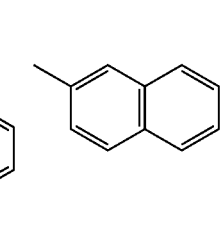 | |
| 3 | | | | |

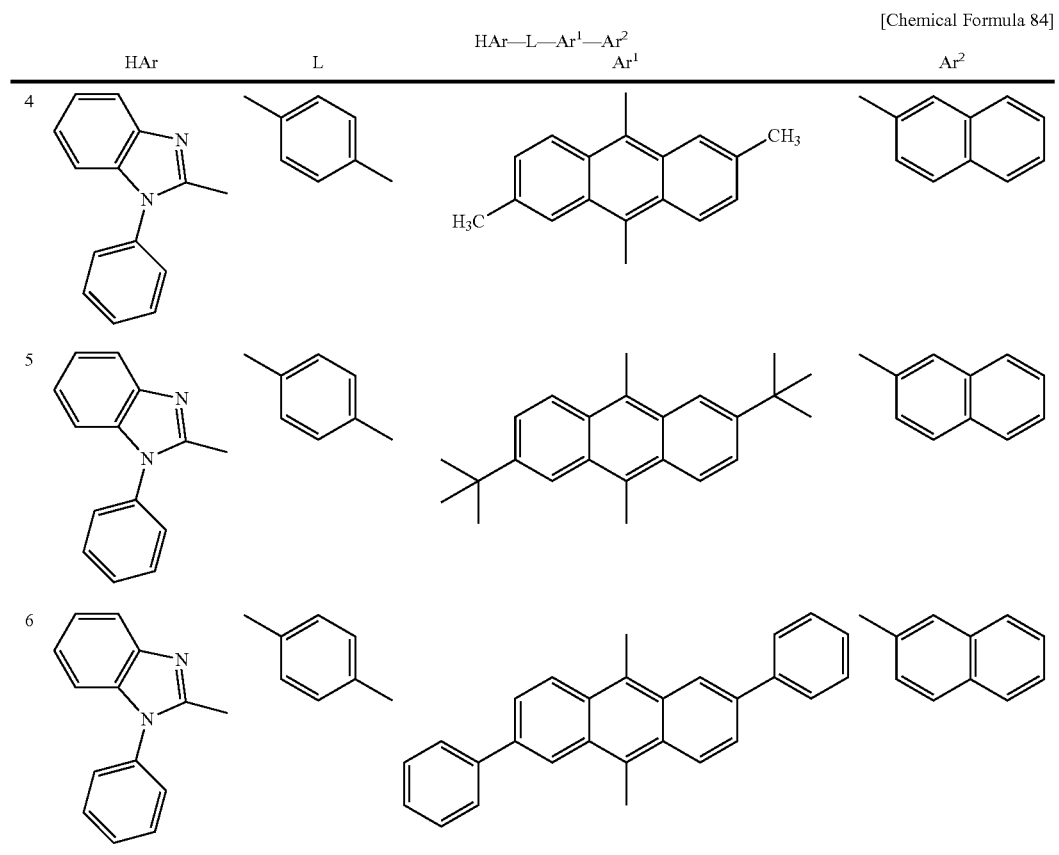
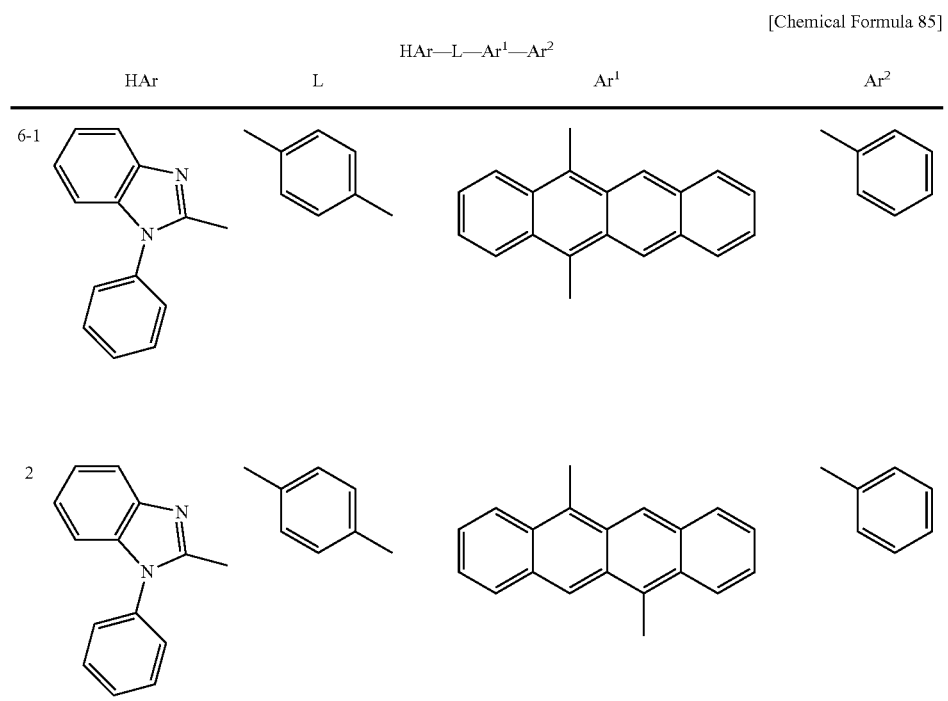

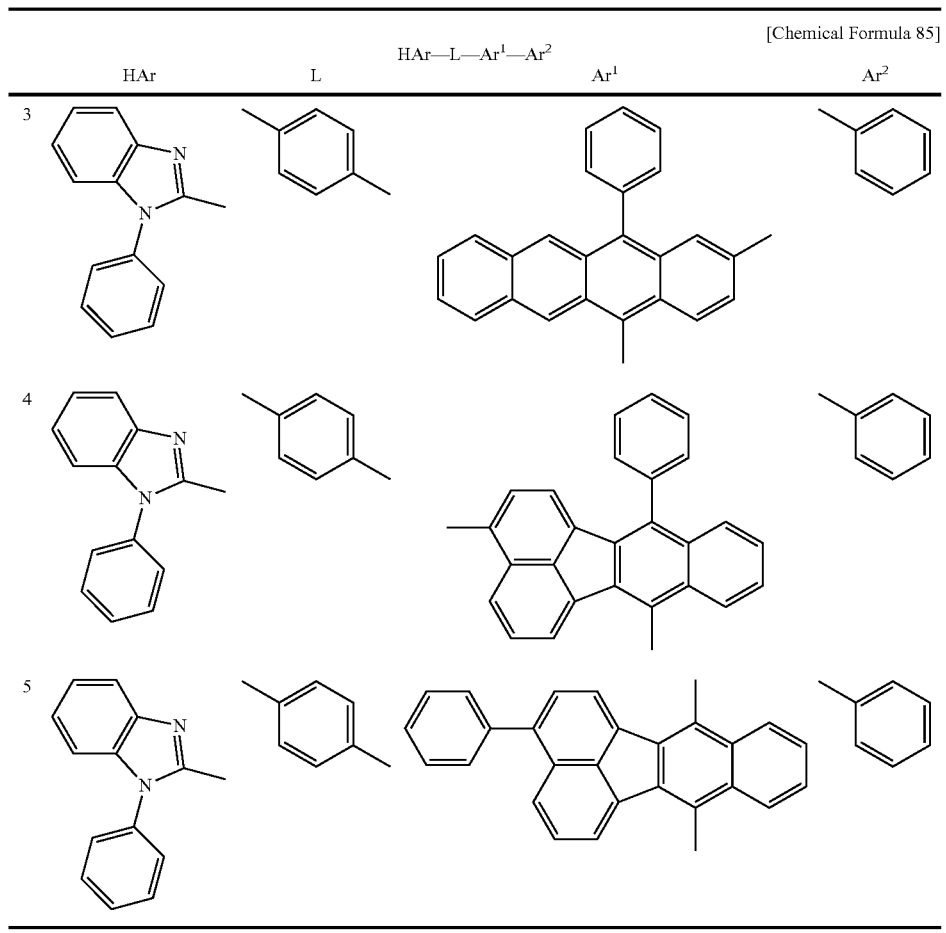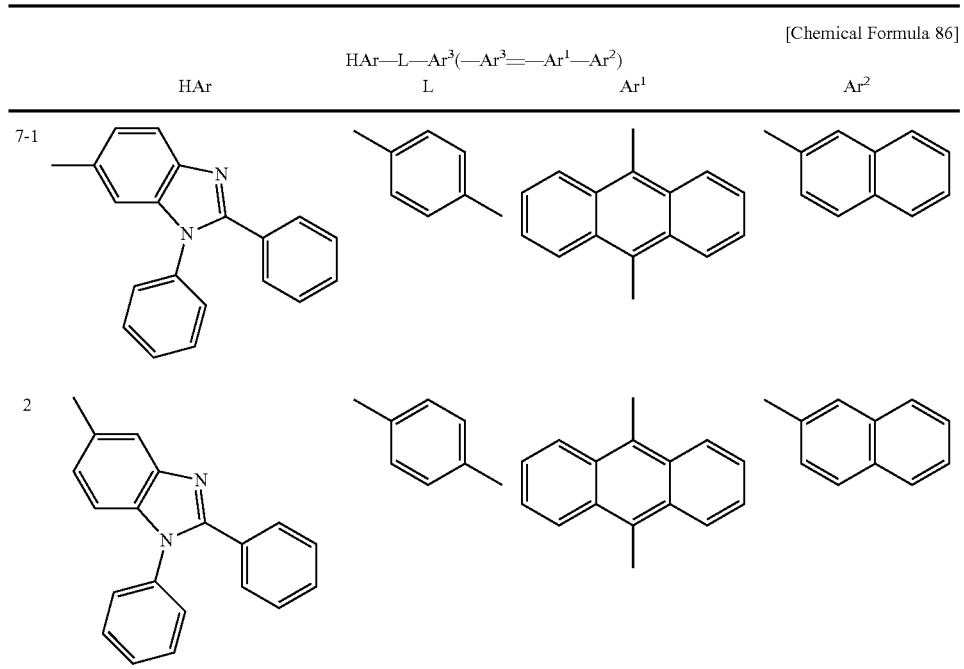

-continued
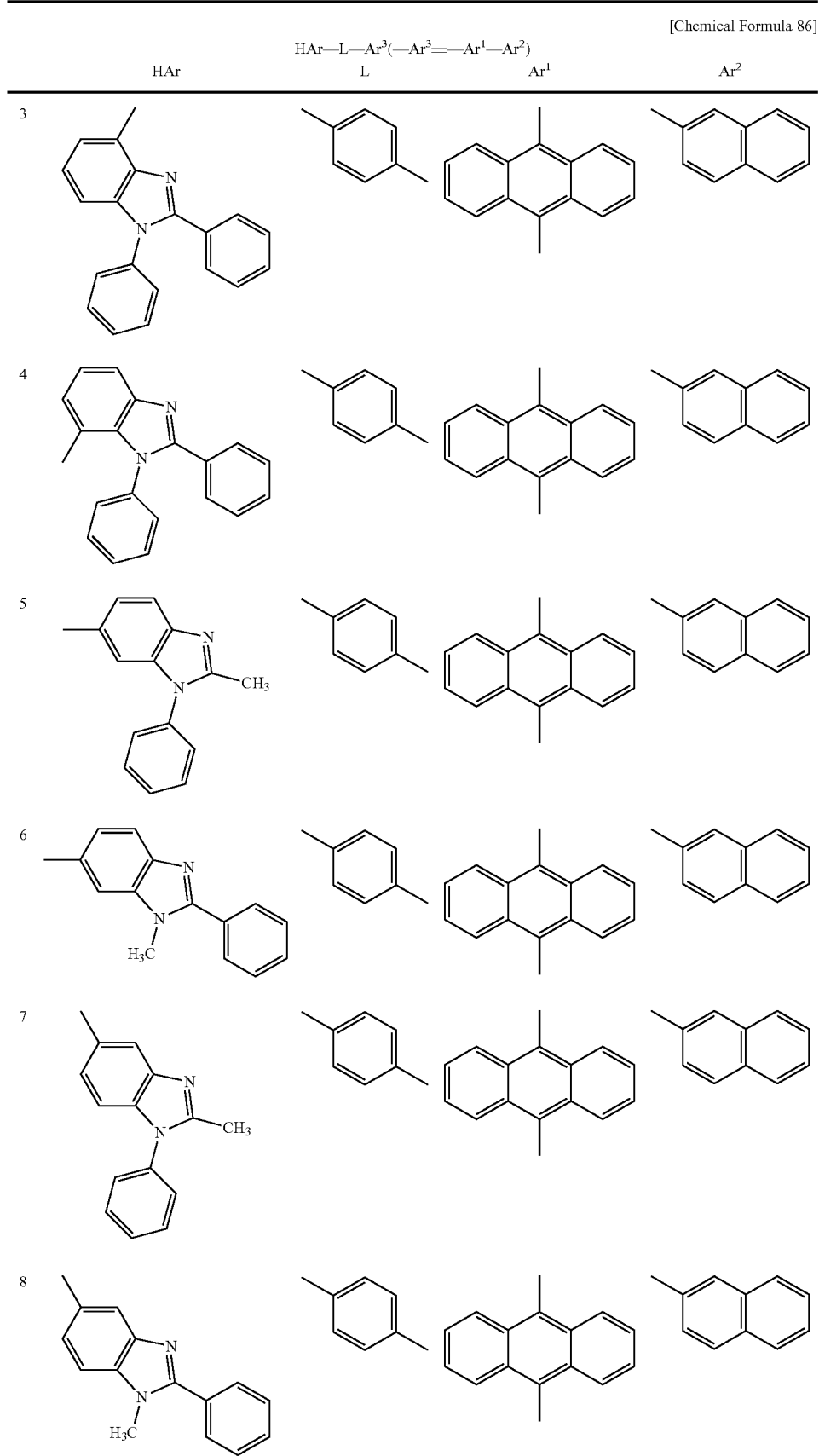

-continued
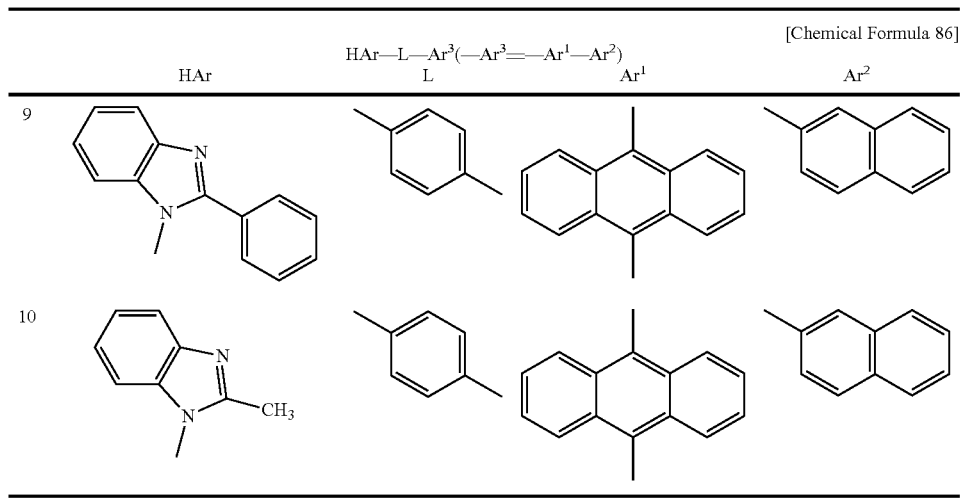
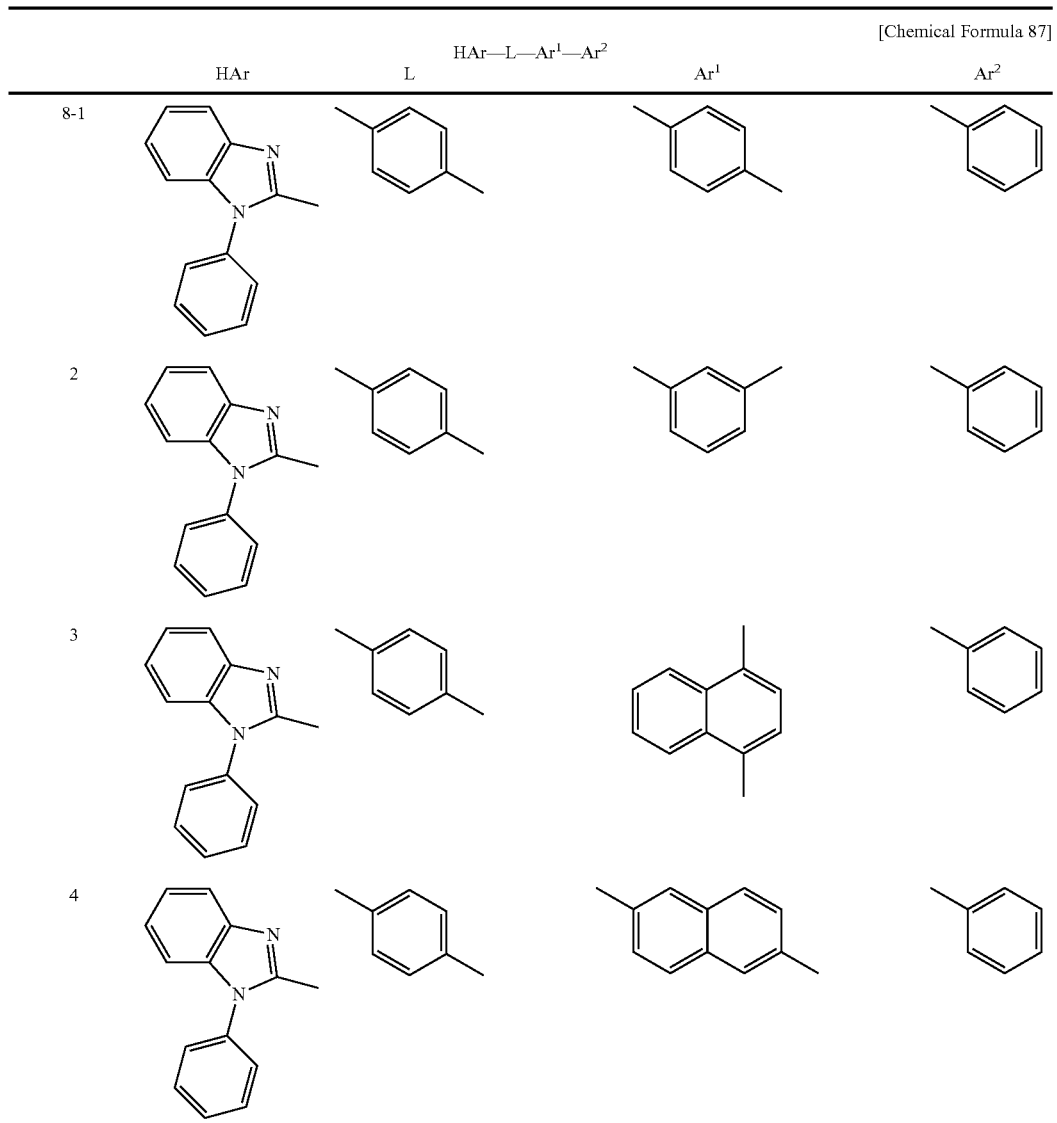

-continued

[Chemical Formula 87]

HAr—L—Ar¹—Ar²

| | HAr | L | Ar¹ | Ar² |
|---|---|---|---|---|
| 5 | | | | |
| 6 | | | | |
| 7 | | | | H |
| 8 | | | | |
| 9 | | | | |
| 10 | | | | |

-continued
[Chemical Formula 87]
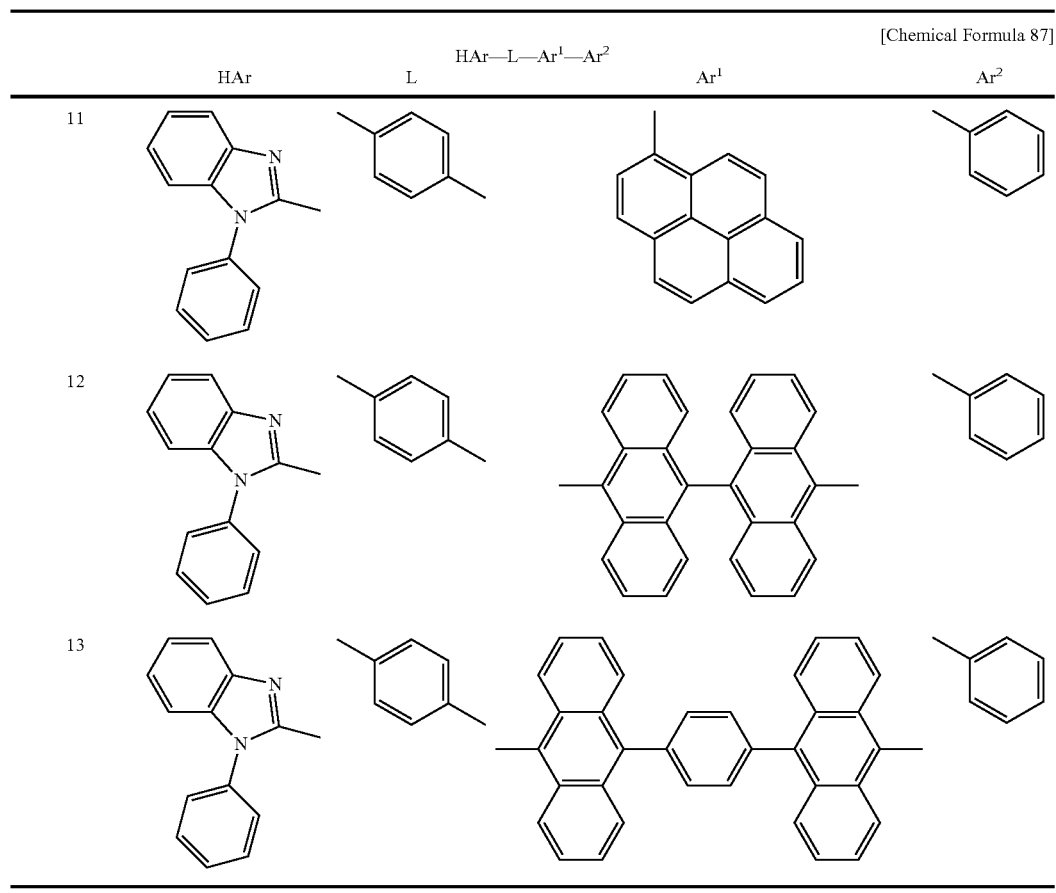
[Chemical Formula 88]
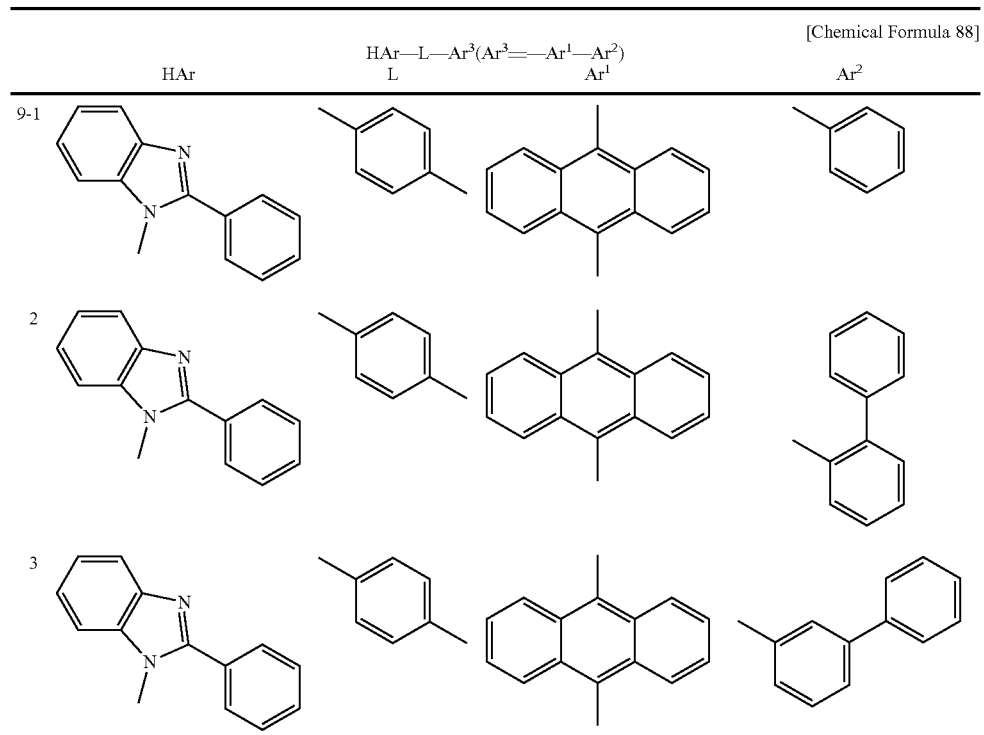

-continued
| HAr | HAr—L—Ar³(Ar³=—Ar¹—Ar²) L  Ar¹ | [Chemical Formula 88] Ar² |
|---|---|---|
| 4 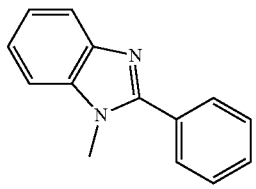 | 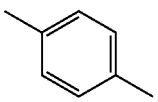 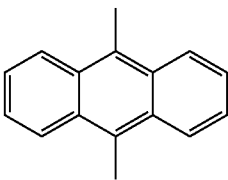 [SMILES: Cc1c2ccccc2c(C)c2ccccc12] | 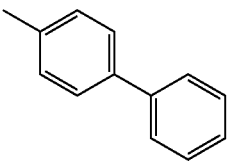 |
| 5 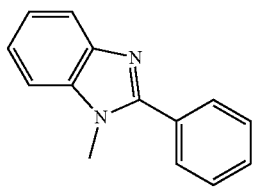 | 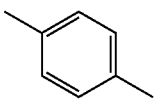 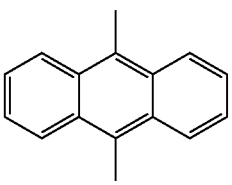 [SMILES: Cc1c2ccccc2c(C)c2ccccc12] | 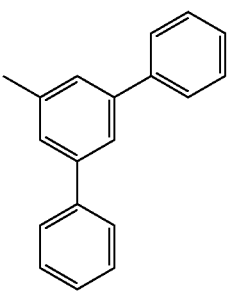 [SMILES: Cc1cc(-c2ccccc2)cc(-c2ccccc2)c1] |
| 6 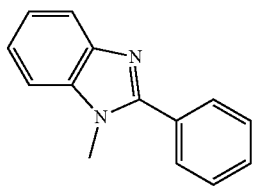 | 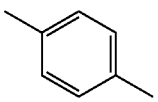 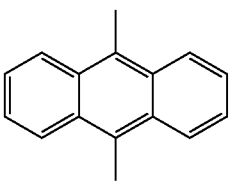 [SMILES: Cc1c2ccccc2c(C)c2ccccc12] | 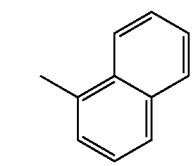 |
| 7 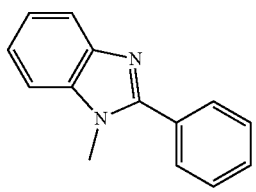 | 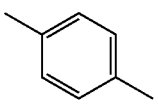 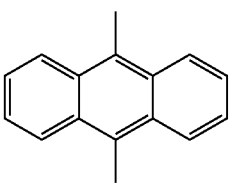 [SMILES: Cc1c2ccccc2c(C)c2ccccc12] | 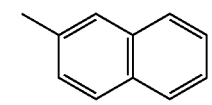 |
| 8 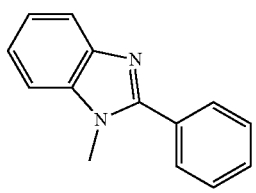 | 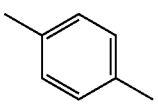 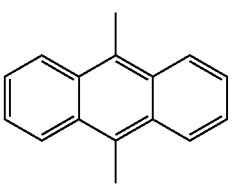 [SMILES: Cc1c2ccccc2c(C)c2ccccc12] | 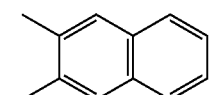 |
| 9 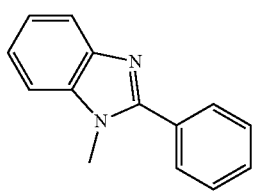 | 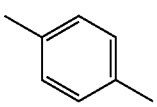 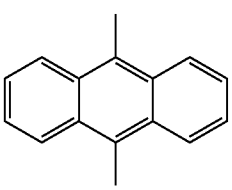 [SMILES: Cc1c2ccccc2c(C)c2ccccc12] | 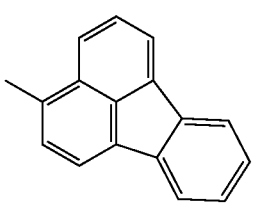 [SMILES: Cc1ccc2c3c(cccc13)-c1ccccc1-2] |
| 10 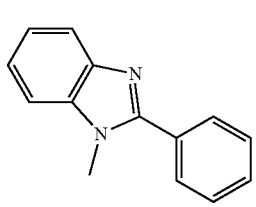 | 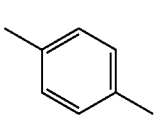 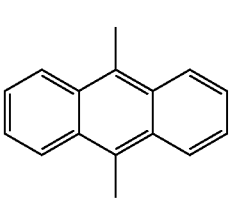 [SMILES: Cc1c2ccccc2c(C)c2ccccc12] | 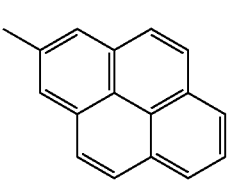 [SMILES: Cc1cc2ccc3cccc4ccc(c1)c2c34] |

-continued
[Chemical Formula 88]
HAr—L—Ar³(Ar³=—Ar¹—Ar²)
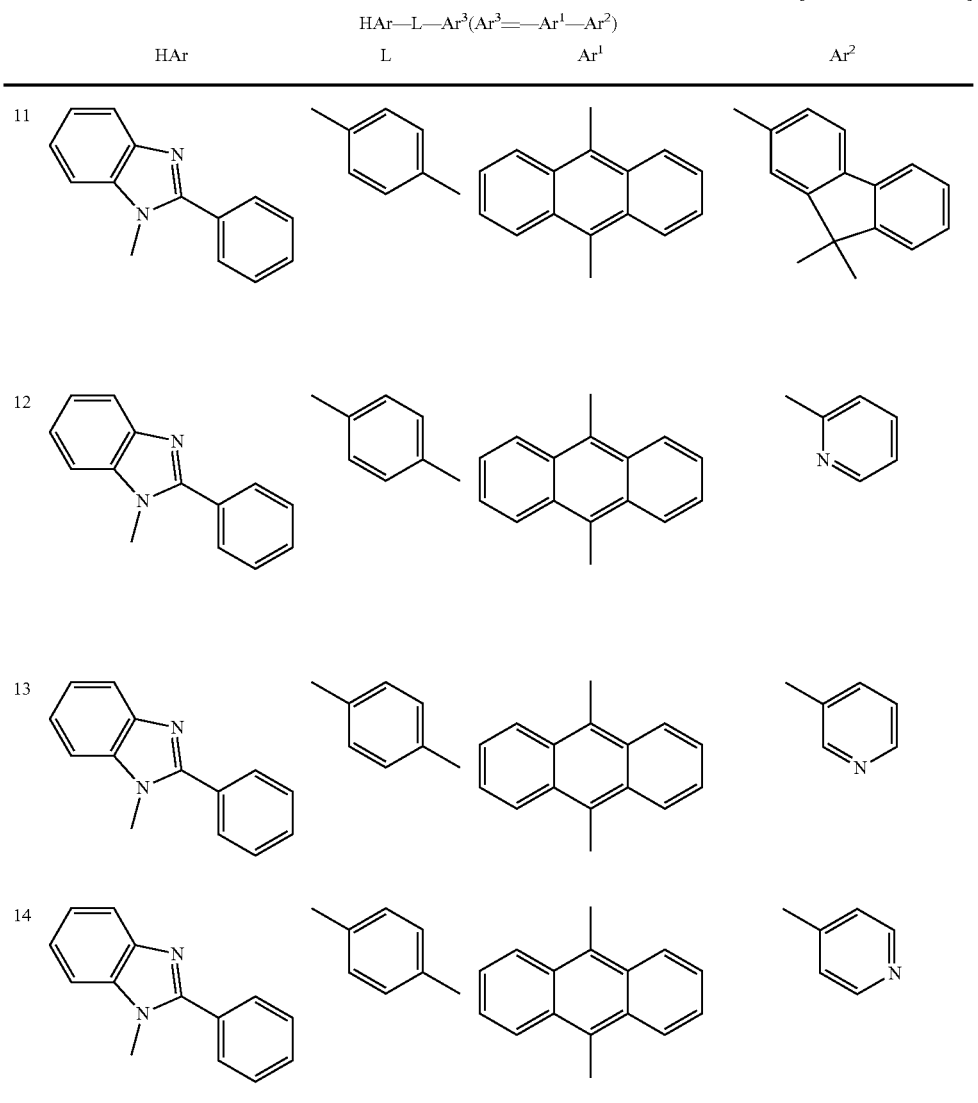
[Chemical Formula 89]
HAr—L—Ar³(—Ar³=—Ar¹—Ar²)
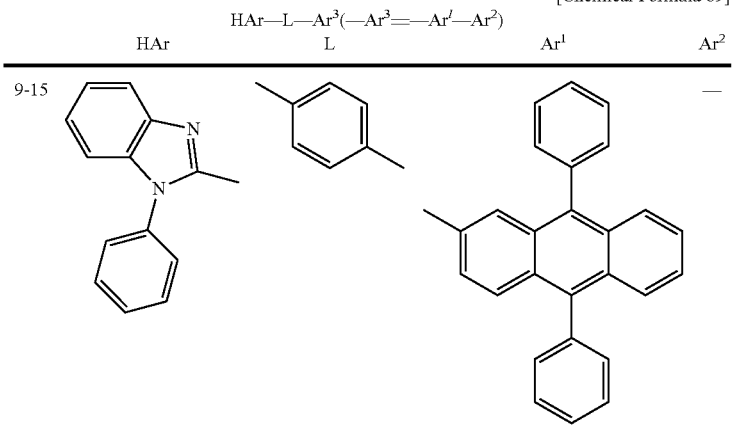

-continued
[Chemical Formula 89]
HAr—L—Ar³(—Ar³═—Ar¹—Ar²)
| HAr | L | Ar¹ | Ar² |
|---|---|---|---|
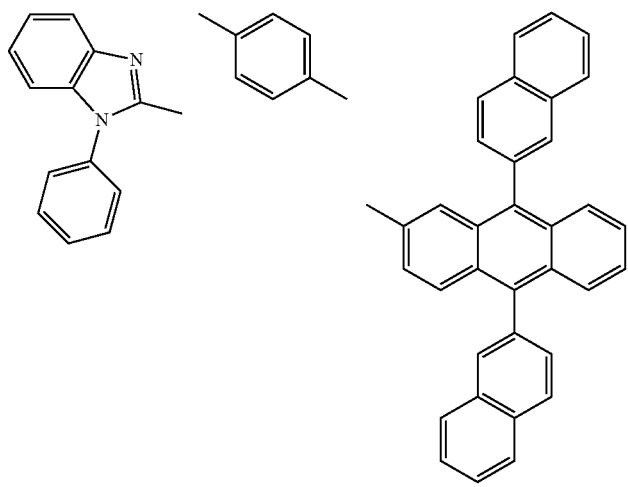
16
17
[Chemical Formula 90]
HAr—L—Ar³(—Ar³═—Ar¹—Ar²)
| HAr | L | Ar¹ | Ar² |
|---|---|---|---|
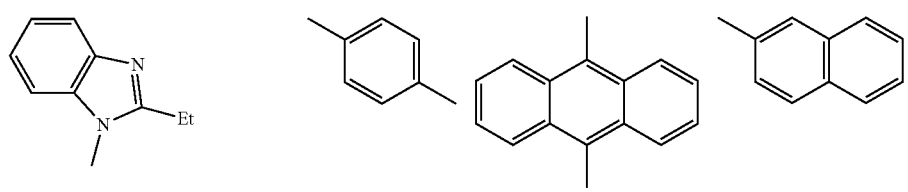
10-1
2

-continued

[Chemical Formula 90]

HAr—L—Ar³(—Ar³=—Ar¹—Ar²)

| | HAr | L | Ar¹ | Ar² |
|---|---|---|---|---|
| 3 | | | | |
| 4 | | | | |
| 5 | | | | |
| 6 | | | | |
| 7 | | | | |
| 8 | | | | |

-continued
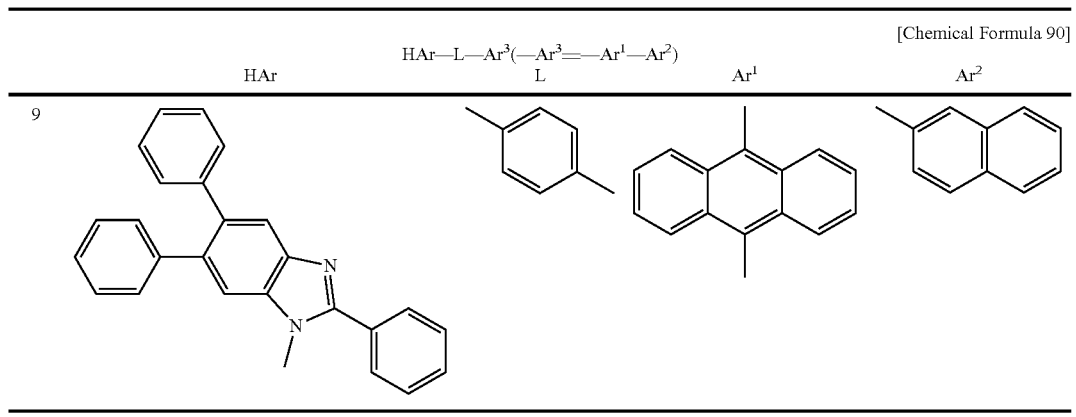
[Chemical Formula 90]
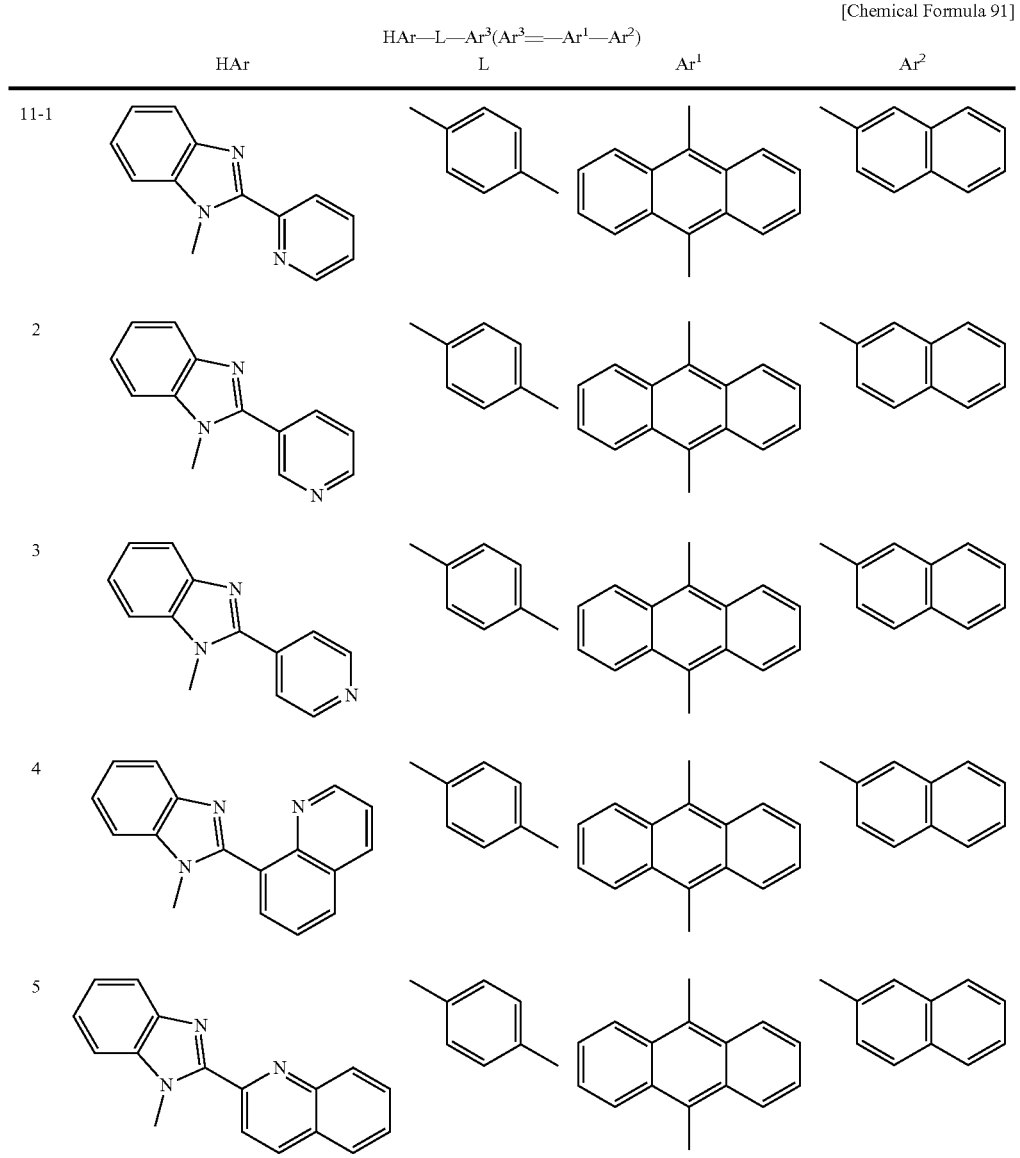
[Chemical Formula 91]

-continued
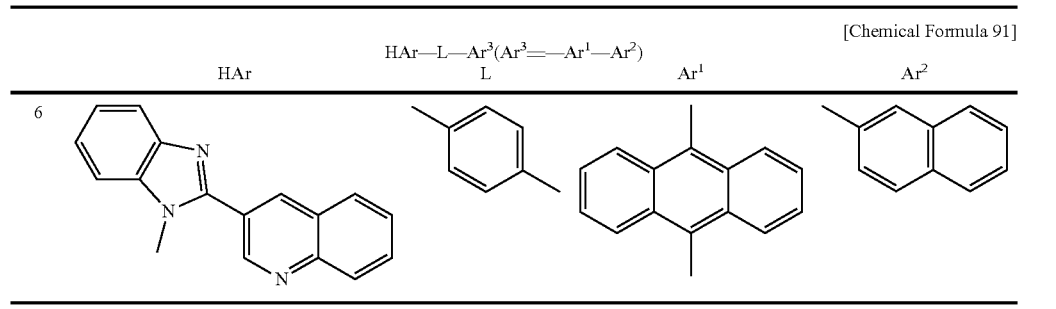
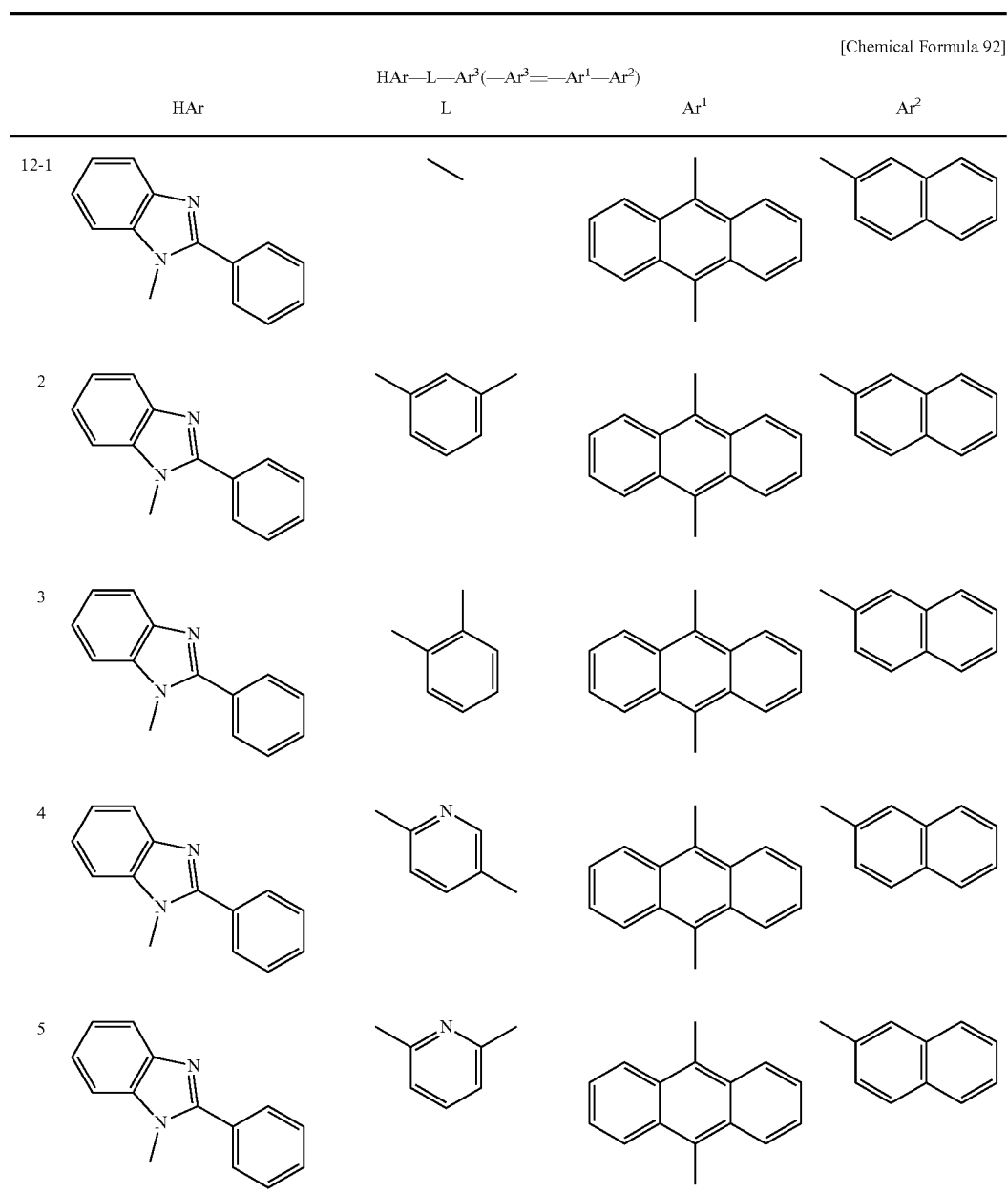

-continued
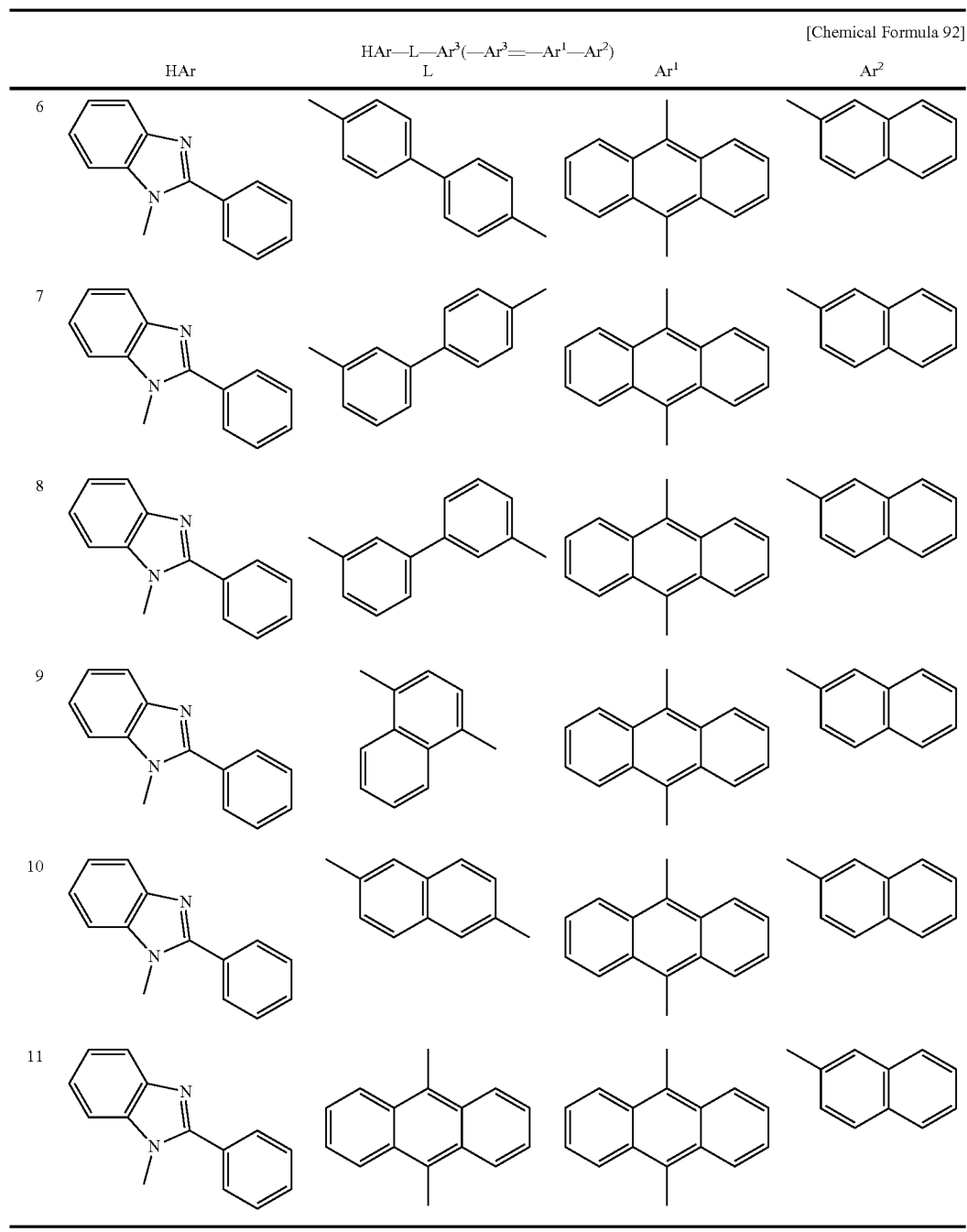
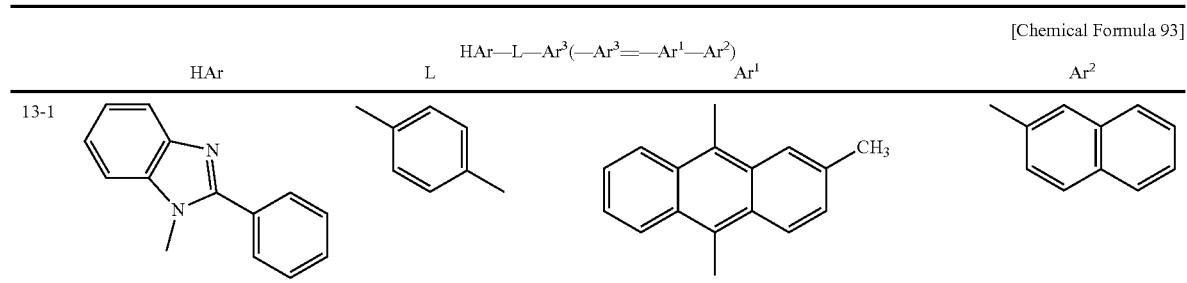

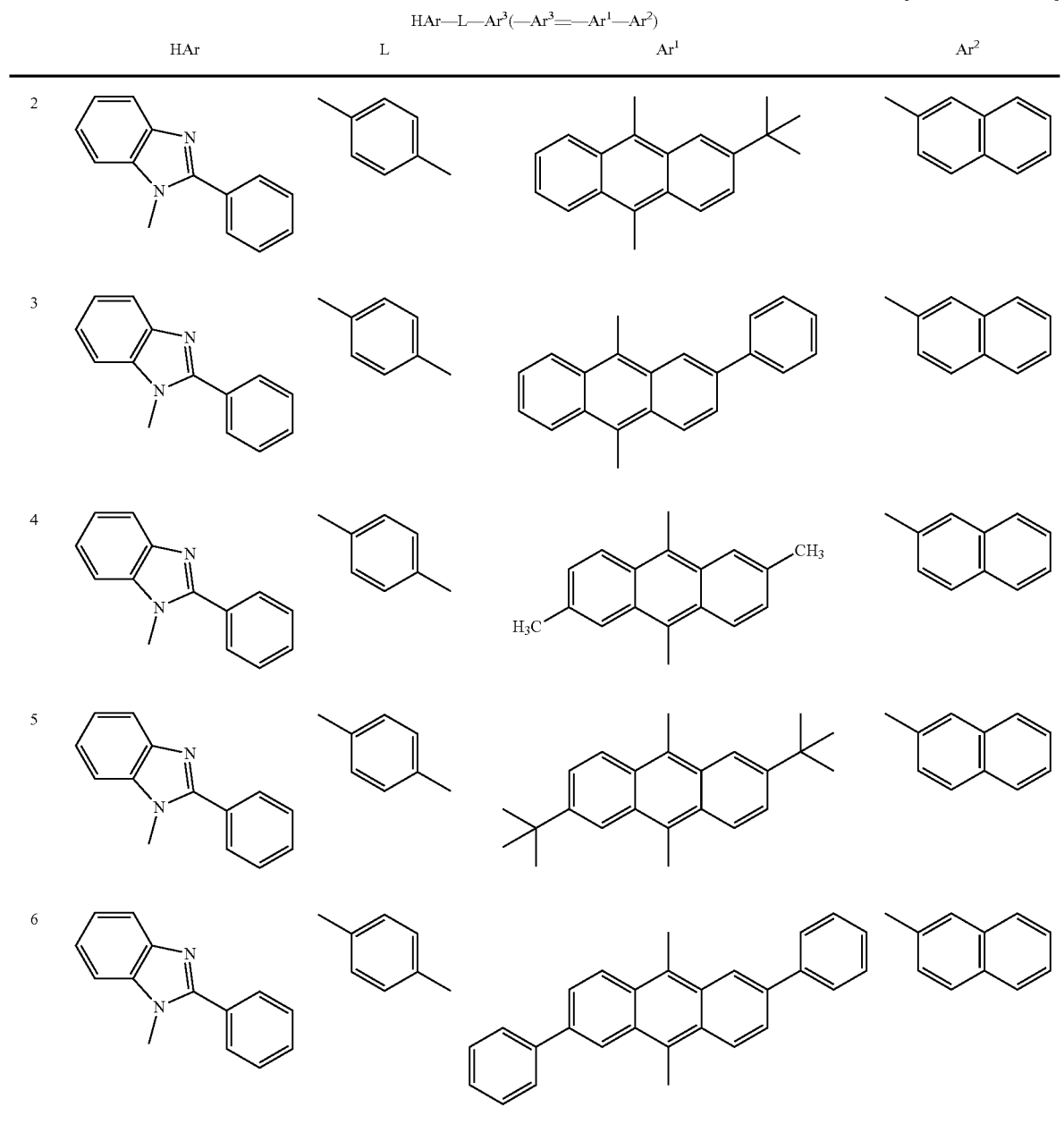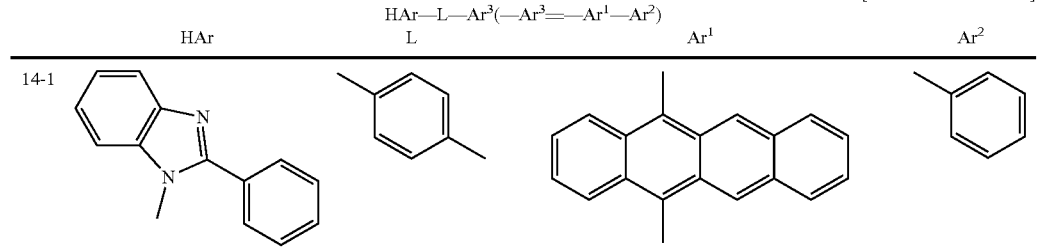

-continued
[Chemical Formula 94]
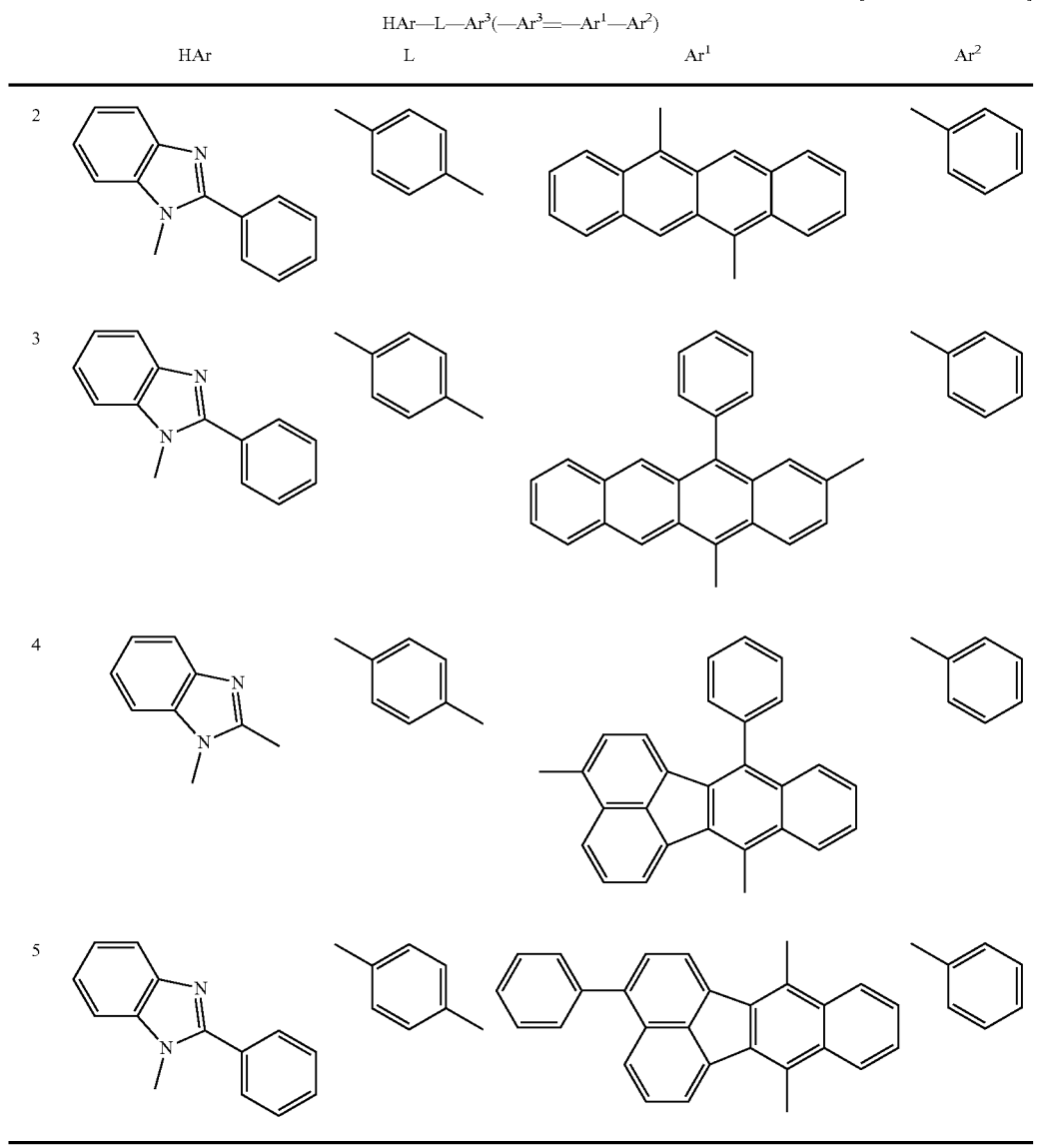
[Chemical Formula 95]
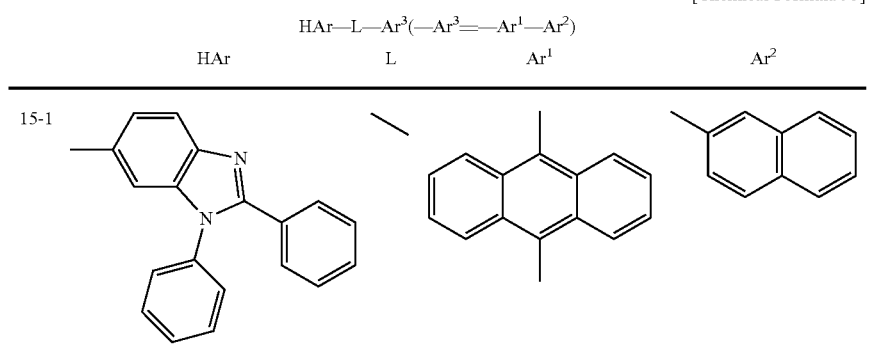

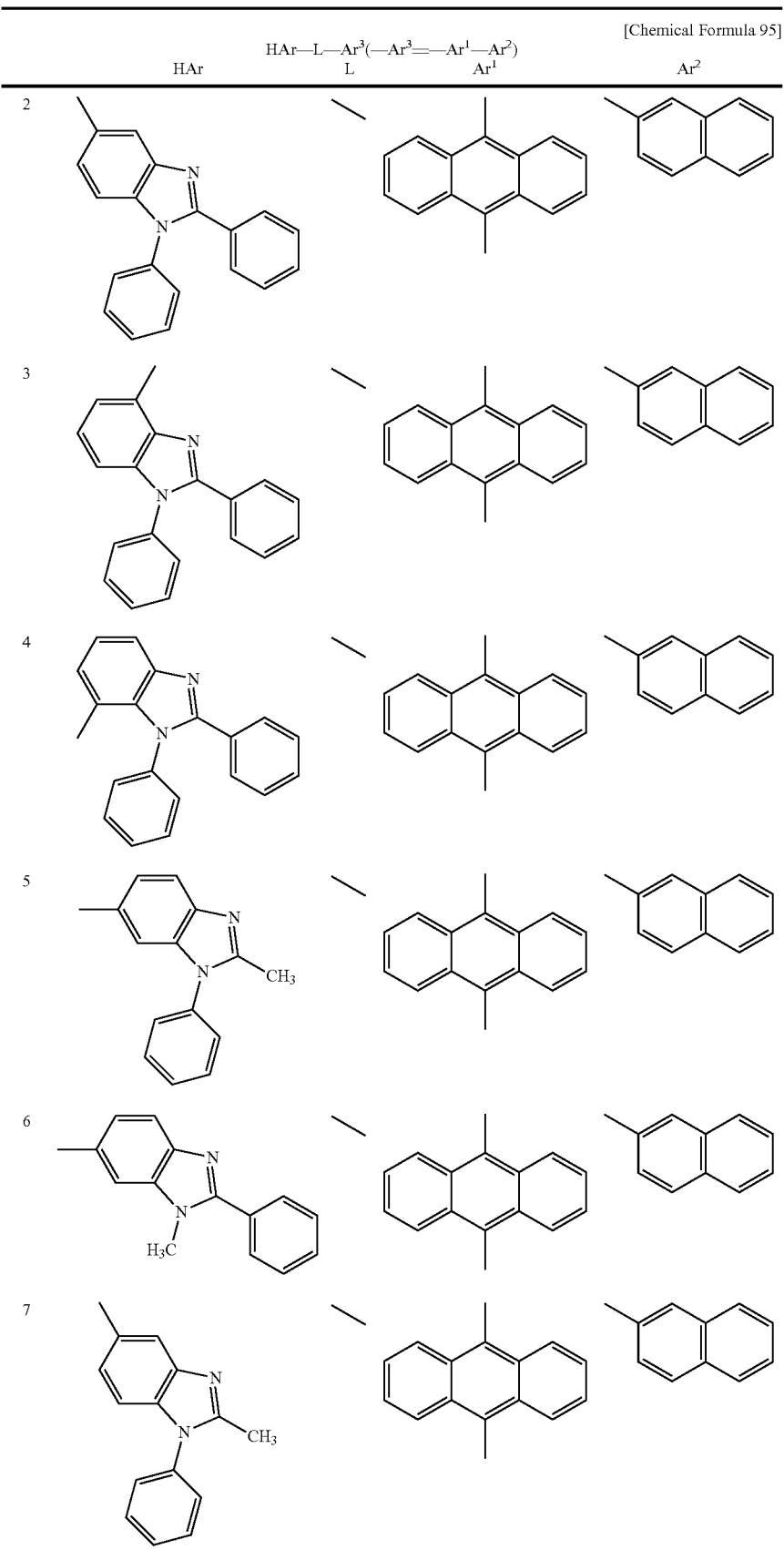

[Chemical Formula 95]
HAr—L—Ar³(—Ar³=—Ar¹—Ar²)
| | HAr | L | Ar¹ | Ar² |
|---|---|---|---|---|
| 8 | | | | |
| 9 | | | | |
| 10 | | | | |
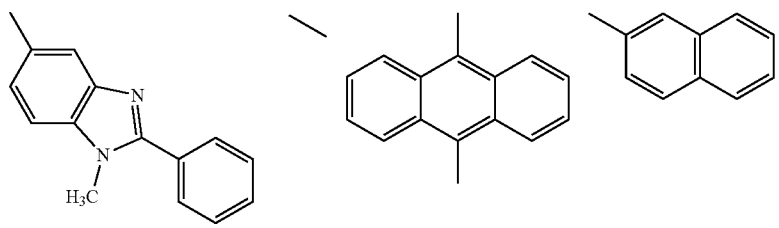
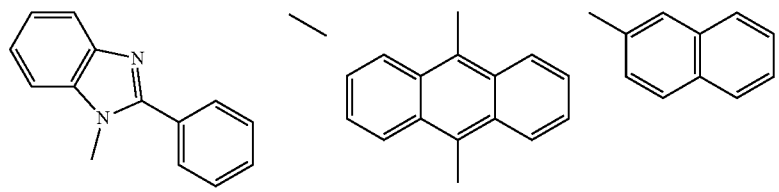
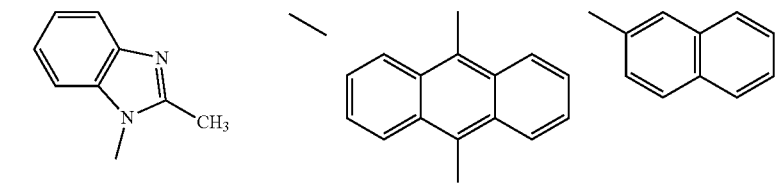
[Chemical Formula 96]
HAr—L—Ar³(—Ar³=—Ar¹—Ar²)
| | HAr | L | Ar¹ | Ar² |
|---|---|---|---|---|
| 15-11 | | | | — |
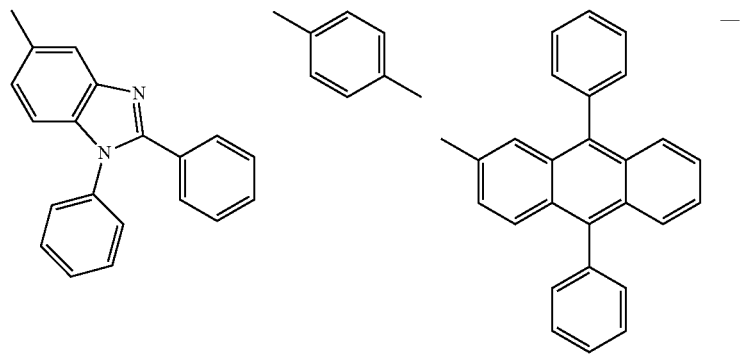

-continued
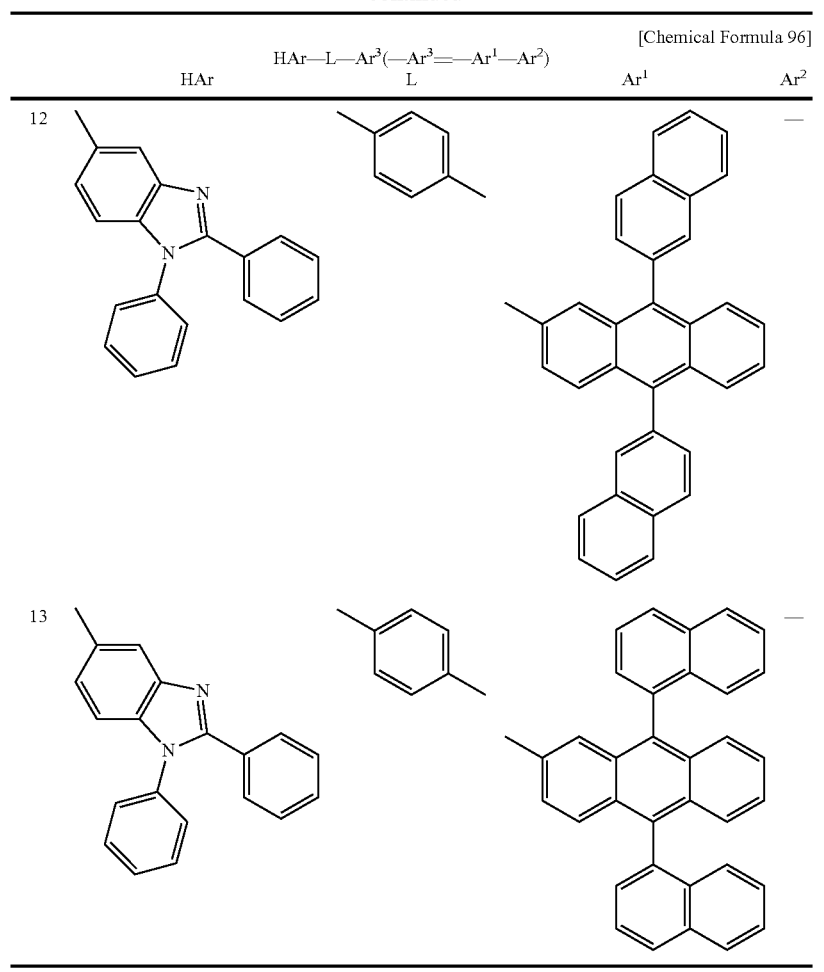
[Chemical Formula 96]
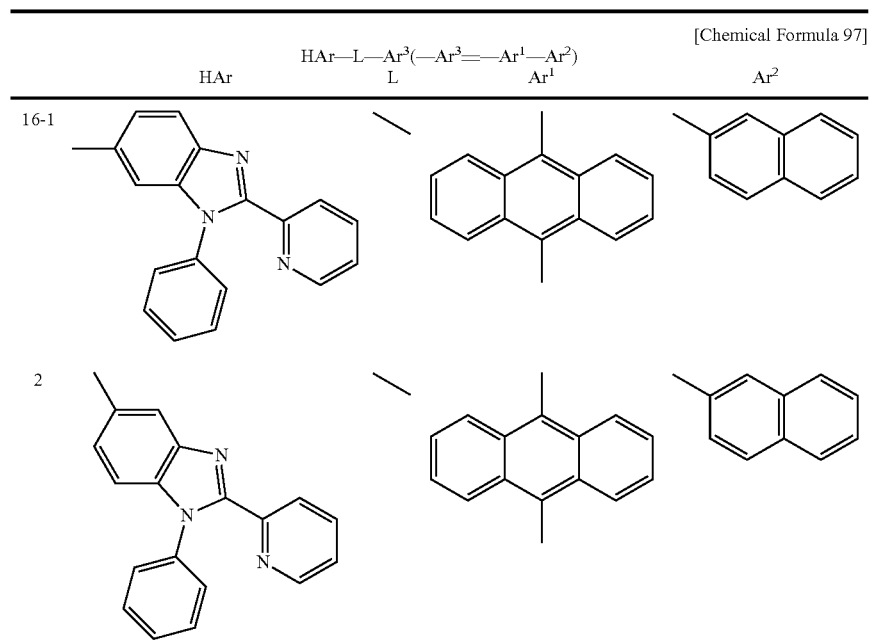
[Chemical Formula 97]

-continued
[Chemical Formula 97]
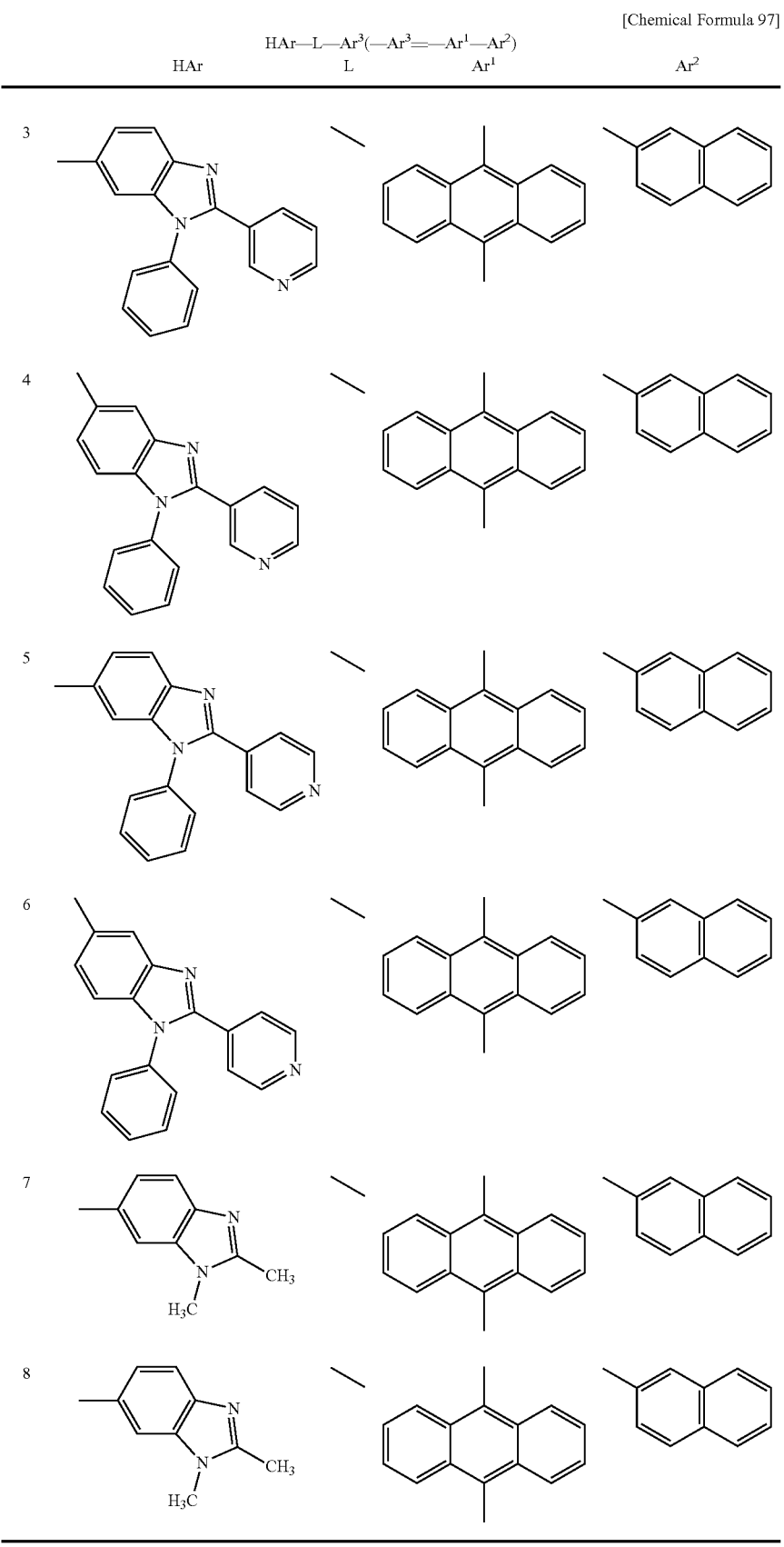

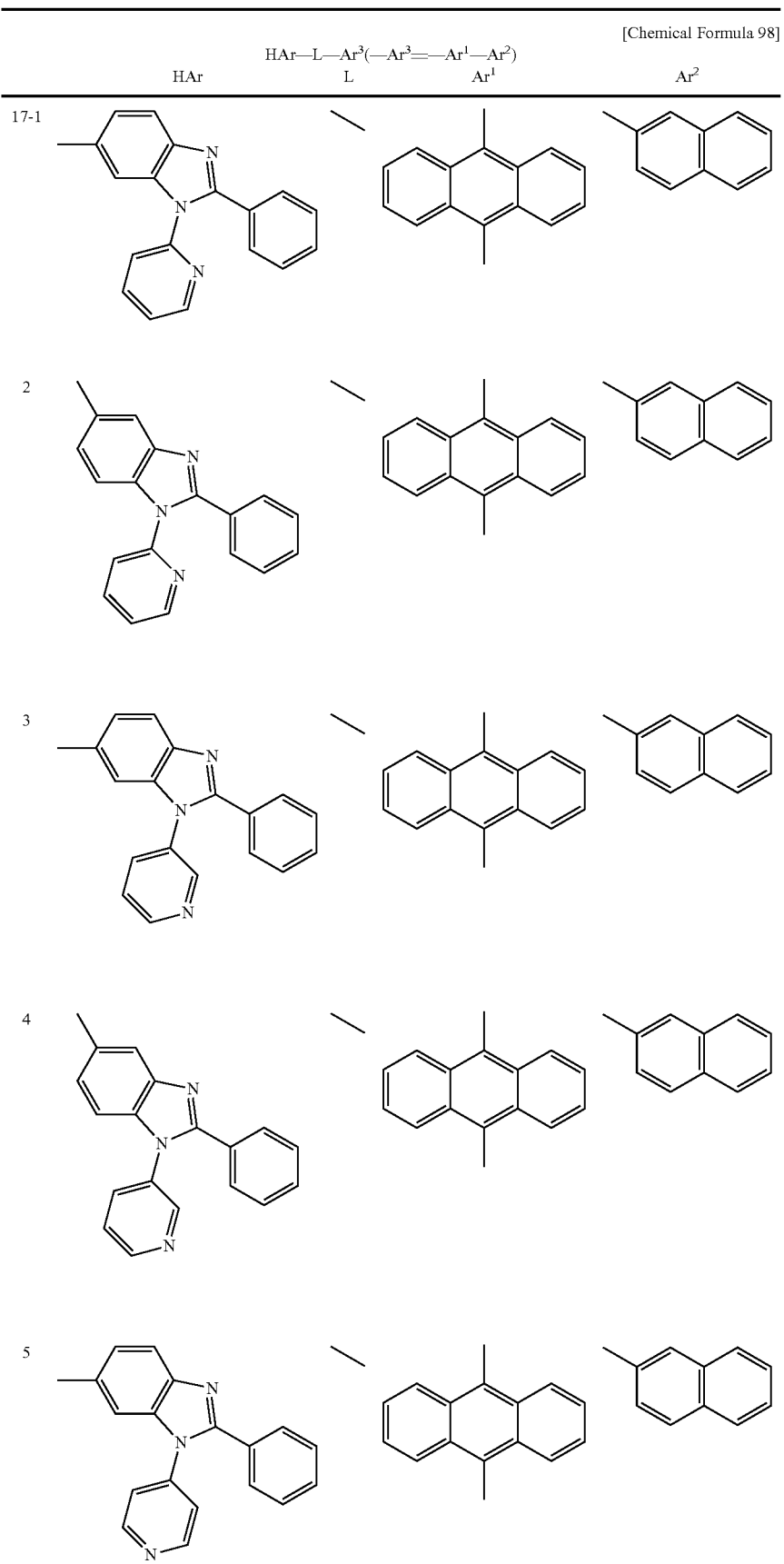

-continued

[Chemical Formula 98]

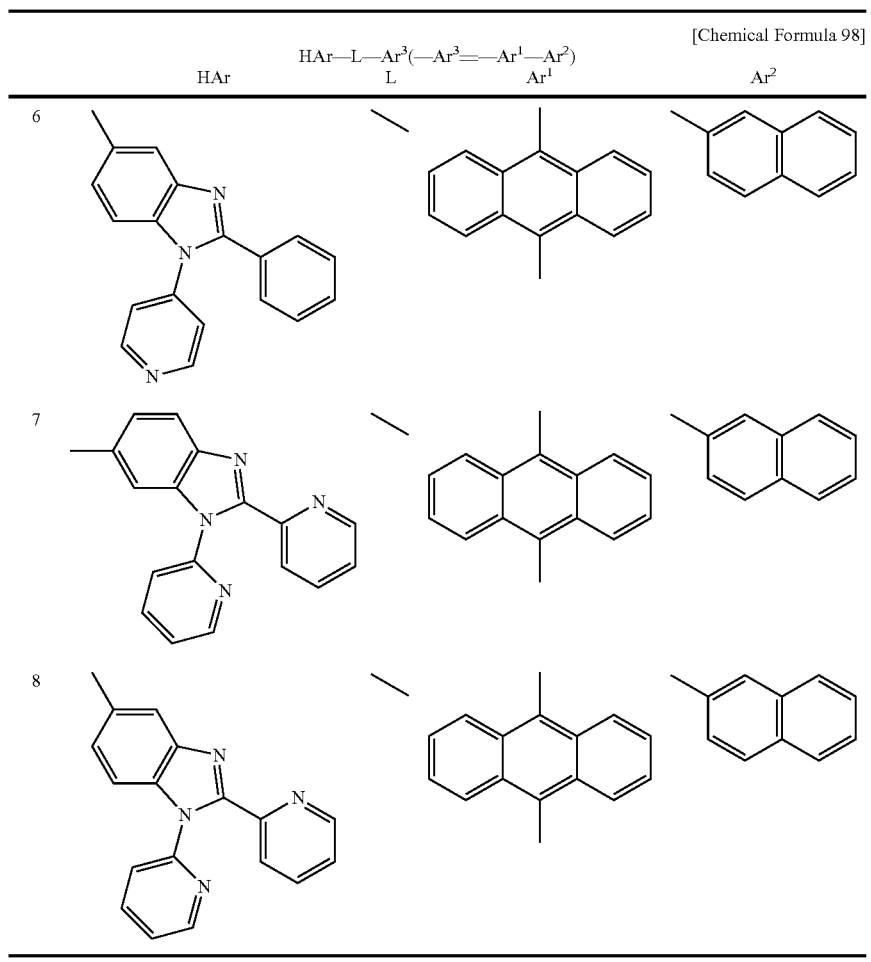

Among the above examples, examples (1-1), (1-5), (1-7), (2-1), (3-1), (4-2), (4-6), (7-2), (7-7), (7-8), (7-9) and (9-7) are particularly preferred.

Although thickness of the electron injecting layer or the electron transporting layer is not specifically limited, the thickness is preferably 1 to 100 nm.

In the aspect of the invention, a reduction-causing dopant is present at an interfacial region between the cathode and the organic thin-film layer.

With this arrangement, the organic electroluminescence device can emit light with enhanced luminance intensity and have a longer lifetime.

Here, a reduction-causing dopant is defined as a material that can reduce an electron transport compound. Thus, various substances having a certain level of reducibility can be used, preferable examples of which are at least one substance selected from a group consisting of: alkali metal, alkali earth metal, rare earth metal, an oxide of the alkali metal, a halogenide of the alkali metal, an oxide of the alkali earth metal, a halogenide of the alkali earth metal, an oxide of the rare earth metal, a halogenide of the rare earth metal, an organic complex of the alkali metal, an organic complex of the alkali earth metal and an organic complex of the rare earth metal.

Specifically, a preferable reduction-causing dopant is at least one alkali metal selected from a group consisting of Li (work function: 2.9 eV), Na (work function: 2.36 eV), K (work function: 2.28 eV), Rb (work function: 2.16 eV) and Cs (work function: 1.95 eV), or at least one alkali earth metal selected from a group consisting of Ca (work function: 2.9 eV), Sr (work function: 2.0 to 2.5 eV) and Ba (work function: 2.52 eV). A substance having work function of 2.9 eV or less is particularly preferable.

Among the above, a more preferable reduction-causing dopant is at least one alkali metal selected from a group consisting of K, Rb and Cs. A further more preferable reduction-causing dopant is Rb or Cs. The most preferable reduction-causing dopant is Cs. Since the above alkali metals have particularly high reducibility, addition of a relatively small amount of these alkali metals to an electron injecting zone can enhance luminance intensity and lifetime of the organic electroluminescence device. As a reduction-causing dopant having work function of 2.9 eV or less, a combination of two or more of the alkali metals is also preferable. Particularly, a combination including Cs (e.g., Cs and Na, Cs and K, Cs and Rb, or Cs, Na and K) is preferable. A reduction-causing dopant containing Cs in a combining manner can efficiently exhibit reducibility. Addition of the reduction-causing dopant to the electron injecting zone can enhance luminance intensity and lifetime of the organic electroluminescence device.

An organic-electroluminescent-material-containing solution according to another aspect of the invention is for preparing a phosphorescent-emitting layer of the organic electroluminescence device according to the above aspect of the invention, the solution including: the host; the phosphorescent dopant; and a solvent in which the host and the phosphorescent dopant are dissolved.

According to the organic-electroluminescent-material-containing solution, the above phosphorescent-emitting layer can be easily and inexpensively formed with the use of ink-printing method, nozzle-jet method and the like.

Examples of the solvent of the organic-electroluminescent-material-containing solution are biphenyl derivative and cyclic ketone.

An example of the biphenyl derivative is an alkyl-substituted biphenyl. Specific examples of the alkyl-substituted biphenyl are methyl biphenyl, ethyl biphenyl, diethyl biphenyl, isopropyl biphenyl, diisopropyl biphenyl, n-propyl biphenyl, n-penthyl biphenyl and methoxy biphenyl.

Incidentally, the carbon number of the alkyl group of the alkyl-substituted biphenyl is preferably in a range from 1 to 5. With the above range, both appropriate viscosity and appropriate solubility can be exhibited.

For instance, ethyl biphenyl, isopropyl biphenyl and the like can be suitably used as the solvent of the organic-electroluminescent-material-containing solution.

Incidentally, the solvent may be provided solely by the biphenyl derivative, or, alternatively, the solvent may be provided by a solution of the biphenyl derivative mixed with viscosity control reagent and the like.

When the solvent is provided by a mixed solution, the mixed solution may contain 20% or more of the biphenyl derivative or, alternatively, 50% or more of the biphenyl derivative or, further alternatively, 75% or more of the biphenyl derivative. In order to utilize the viscosity and solubility of the biphenyl derivative, the percentage of the biphenyl derivative is preferably high.

Examples of cyclic ketone include cyclic alkyl ketones such as cyclopentanone derivative, cyclohexanone derivative, cycloheptanone derivative and cyclooctanone derivative. One of the above cyclic ketones may be singularly used, or a mixture of plurality thereof may be used.

Particularly, the solvent preferably contains a cyclic ketone in the form of cyclohexanone derivative.

Preferable cyclohexanone derivatives are: 2-acetylcyclohexanone; 2-methylcyclohexanone; 3-methylcyclohexanone; 4-methylcyclohexanone; 2-cyclohexylcyclohexanone; 2-(1-cyclohexenyl)cyclohexanone; 2,5-dimethylcyclohexanone; 3,4-dimethylcyclohexanone; 3,5-dimethylcyclohexanone; 4-ethylcyclohexanone; pulegone; menthone; 4-pentylcyclohexanone; 2-propylcyclohexanone; 3,3,5-trimethylcyclohexanone; and thujone.

Among the above, cyclohexanone is particularly preferable.

Cyclic ketones including a nitrogen-containing ring are also preferable, examples of which are: caprolactam; N-methylcaprolactam; 1,3-dimethyl-2-imidazolidine; 2-pyrrolidone; 1-acetyl-2-pyrrolidone; 1-buthyl-2-pyrrolidone; 2-piperidone; and 1,5-dimethyl-2-piperidone.

The cyclic ketone compounds are preferably selected from the group of cyclohexanone, cyclopentanone and cycloheptanone (including derivatives thereof).

After various researches, the inventors have found that cyclohexanone derivatives are capable of dissolving low-molecular organic electroluminescent material at a concentration higher than the other solvents and also capable of dissolving not limited range of compounds, thus allowing preparation of organic-electroluminescent-material-containing solution that utilizes various low-molecular organic electroluminescent materials.

Further, it has been found that, with the use of cyclohexanone derivative as the solvent, an organic-electroluminescent-material-containing solution that contains sufficient amount of high-performance low-molecular organic electroluminescent material that could not be used in a typical solvent on account of low solubility thereof can be prepared.

Further, cyclohexanone derivatives are suitable for coating process such as inkjet method in view of a high boiling point (156 degrees C.: cyclohexanone) and a high viscosity (2 cP: cyclohexanone) thereof. Furthermore, since cyclohexanone derivatives are favorably mixed with an alcohol solvent (a viscosity control reagent), especially with a diol solvent, a highly viscous solution can be prepared by adjusting the viscosity, which is advantageous as a solvent of low-molecular organic electroluminescent material of which viscosity does not change only by dissolving.

Incidentally, the solvent of the organic-electroluminescent-material-containing solution of the invention is not limited to the above biphenyl derivatives and cyclic ketones, but may alternatively alcohols (e.g. methanol and ethanol), carboxylate esters (e.g. ethyl acetate and propyl acetate), nitriles (e.g. acetonitrile), ethers (e.g. isopropyl ether and THF), aromatic hydrocarbons (e.g. cyclohexyl benzene, toluene and xylene), alkyl halides (e.g. methylene chloride) and saturated hydrocarbons (e.g. heptane).

Among the above, carboxylate esters, nitriles, ethers, aromatic hydrocarbons, alkyl halides and saturated hydrocarbons are preferable. Carboxylate esters, ethers and aromatic hydrocarbons are more preferable.

BRIEF DESCRIPTION OF DRAWINGS

FIG. 1 shows an outline structure of an organic electroluminescence device according to an exemplary embodiment of the invention.

BEST MODE FOR CARRYING OUT THE INVENTION

Preferable exemplary embodiment(s) of the invention will be described below.

Organic Electroluminescence Device

FIG. 1 shows a schematic arrangement of an organic electroluminescence device according to an exemplary embodiment of, the invention.

An organic electroluminescence device 1 includes a transparent substrate 2, an anode 3, a cathode 4 and an organic thin-film layer 10 disposed between the anode 3 and the cathode 4.

The organic thin-film layer 10 includes a phosphorescent-emitting layer 5 containing a phosphorescent host and a phosphorescent dopant. A layer such as a hole injecting/transporting layer (i.e. at least one of hole-injecting layer and hole-transporting layer) 6 may be provided between the phosphorescent-emitting layer 5 and the anode 3 while a layer such as an electron injecting/transporting layer (i.e. at least one of electron-injecting layer and electron-transporting layer) 7 may be provided between the phosphorescent-emitting layer 5 and the cathode 4.

In addition, an electron blocking layer may be provided to the phosphorescent-emitting layer 5 adjacent to the anode 3 while a hole blocking layer may be provided to the phosphorescent-emitting layer 5 adjacent to the cathode 4.

With this arrangement, electrons and holes can be trapped in the phosphorescent-emitting layer 5, thereby enhancing probability of exciton generation in the phosphorescent-emitting layer 5.

EXAMPLES

Next, the invention will be described in further detail by exemplifying Example(s) and Comparative(s). However, the invention is not limited by the description of Example(s).

Note that solid-property values of each material, which are shown in the Table 2 below, were measured in the following manner.

The Eg(T) was defined based on phosphorescence spectrum.

Specifically, each material was dissolved in an EPA solvent (diethylether:isopentane:ethanol=5:5:2 in volume ratio) at a concentration of 10 μmol/L, thereby forming a sample for phosphorescence measurement.

The sample for phosphorescence measurement was put into a quartz cell and is cooled to 77 K.

Excitation light was irradiated to the sample and the wavelength of emitted phosphorescence was measured.

A tangent line was drawn to be tangent to a rising section adjacent to short-wavelength of the obtained phosphorescence spectrum, a wavelength value at an intersection of the tangent line and a base line obtained from absorbance was obtained.

The value of the obtained wavelength value converted into energy was defined as the Eg(T).

For the measurement, a commercially-available measuring equipment F-4500 (manufactured by Hitachi, Ltd.) was used.

The affinity level Af (electron affinity) means energy emitted or absorbed when an electron is fed to a molecule of a material. The affinity level is defined as "positive" when energy is emitted while being defined as "negative" when energy is absorbed.

The affinity level Af is defined by an ionization potential Ip and an optical energy gap Eg(S) as follows.

$$Af=Ip-Eg(S)$$

Here, the ionization potential Ip refers to energy necessary for a compound of each material to remove electrons to ionize, for which a value measured with an ultraviolet ray photoelectron spectrometer (AC-3 manufactured by Riken Keiki Co., Ltd.).

The optical energy gap Eg(S) refers to a difference between a conduction level and a valence electron level. For instance, Eg(S) is a value obtained by converting into energy a wavelength value at an intersection of a long-wavelength-side tangent line in an absorbing spectrum of a toluene-diluted solution of each material and a base line in the absorbing spectrum obtained according to absorbance.

Example 1

A glass substrate (size: 25 mm×75 mm×1.1 mm thick) having an ITO transparent electrode (manufactured by Geomatec Co., Ltd.) was ultrasonic-cleaned in isopropyl alcohol for five minutes, and then UV/ozone-cleaned for 30 minutes.

After the glass substrate having the transparent electrode line was cleaned, the glass substrate was mounted on a substrate holder of a vacuum deposition apparatus. Then, 50-nm thick film of 4,4'-bis[N-(1-naphthyl)-N-phenylamino]biphenyl (hereinafter abbreviated as "NPD film") was initially formed by resistance heating deposition onto a surface of the glass substrate where the transparent electrode line was provided so that the NPD film covered the transparent electrode. The NPD film served as the hole injecting/transporting layer.

A 40-nm thick film of the following compounds F and E, which were used as the first and second hosts, was formed on the NPD film by resistance heating deposition. The deposited mass of the compound E occupied 20% (mass ratio) of the entire host consisting of the first host and the second host. Simultaneously with the deposition of the host, Ir(piq)$_3$, which was used as the phosphorescent dopant, was deposited to be contained at a content of 5% (mass ratio) of the host. This film served as the phosphorescent-emitting layer.

Subsequently, a 40-nm thick film of a compound J was formed on the phosphorescent-emitting layer. This film served as an electron injecting layer.

After that, LiF was formed into 1-nm thick film. Metal (Al) was deposited on the LiF film to form a 150-nm thick metal cathode, thereby providing the organic electroluminescence device.

[Chemical Formula 99]

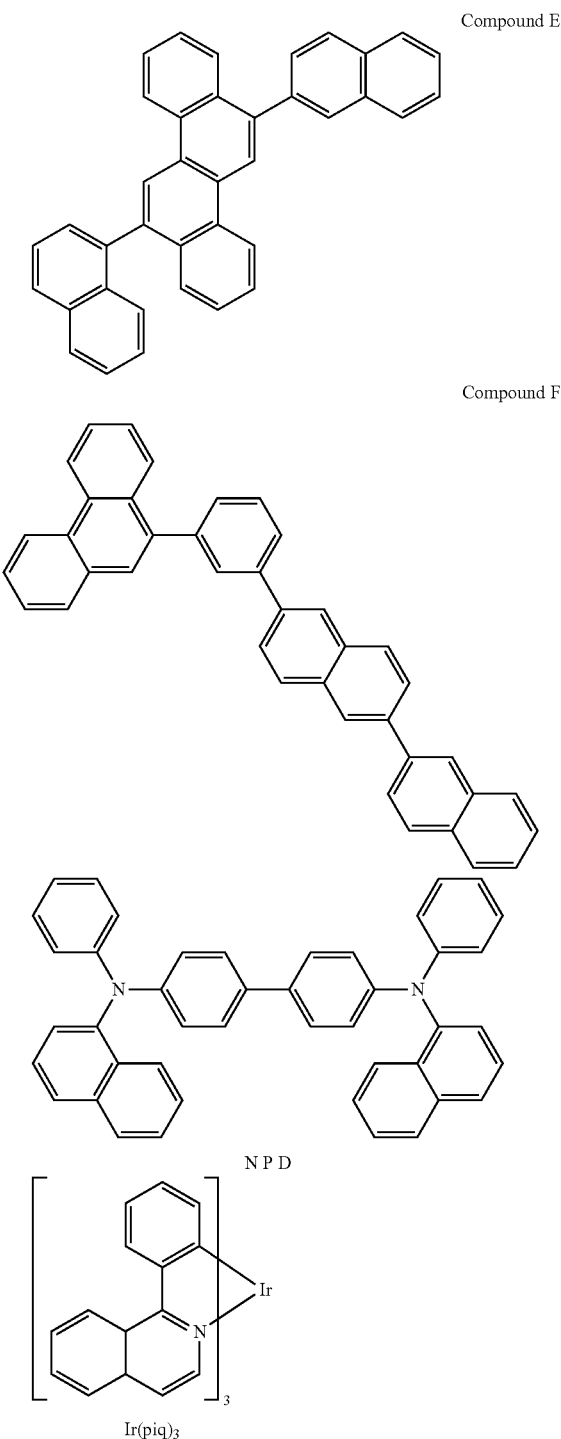

-continued

[Chemical Formula 100]

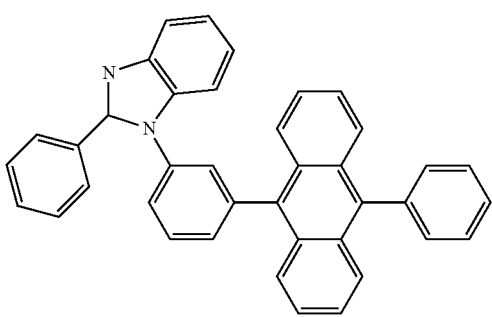

Compound J

Examples 2 to 16 and Comparatives 1 to 6

The organic electroluminescence device was manufactured in the same manner as in Example 1 except that the compounds constituting the host were altered as in the following Table.

TABLE 1

|  | First Host | Second Host |
|---|---|---|
| Example 1 | Compound F (80 wt. %) | Compound E (20 wt. %) |
| Example 2 | Compound F (50 wt. %) | Compound E (50 wt. %) |
| Example 3 | Compound F (20 wt. %) | Compound E (80 wt. %) |
| Example 4 | Compound F (80 wt. %) | Compound D (20 wt. %) |
| Example 5 | Compound F (50 wt. %) | Compound D (50 wt. %) |
| Example 6 | Compound F (20 wt. %) | Compound D (80 wt. %) |
| Example 7 | Compound D (80 wt. %) | Compound E (20 wt. %) |
| Example 8 | Compound D (50 wt. %) | Compound E (50 wt. %) |
| Example 9 | Compound D (20 wt. %) | Compound E (80 wt. %) |
| Example 10 | Compound G (80 wt. %) | Compound E (20 wt. %) |
| Example 11 | Compound G (50 wt. %) | Compound E (50 wt. %) |
| Example 12 | Compound G (20 wt. %) | Compound E (80 wt. %) |
| Example 13 | Compound F (80 wt. %) | BAlq (20 wt. %) |
| Example 14 | Compound F (20 wt. %) | Zn (BTP)$_2$ (80 wt. %) |
| Example 15 | Compound D (20 wt. %) | BAlq (20 wt. %) |
| Example 16 | Compound D (80 wt. %) | Zn (BTP)$_2$ (80 wt. %) |
| Comparative 1 | Compound D | — |
| Comparative 2 | Compound E | — |
| Comparative 3 | Compound F | — |
| Comparative 4 | Compound G | — |
| Comparative 5 | BAlq | — |
| Comparative 6 | Zn (BTP)$_2$ | — |

(Content relative to the entire host)

[Chemical Formula 101]

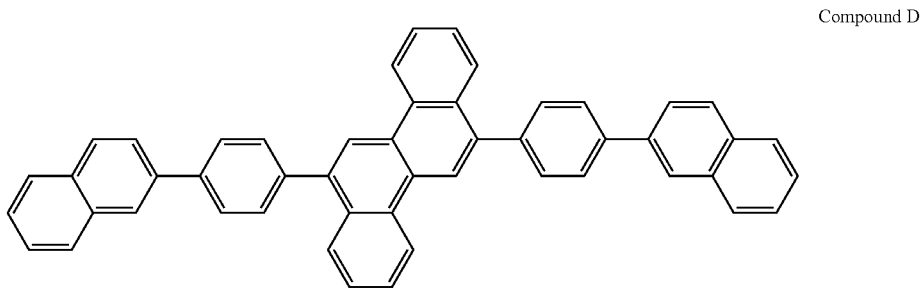

Compound D

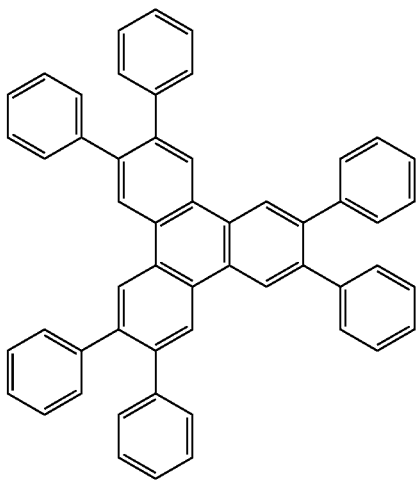

Compound G

-continued

[Chmeical Formula 102]

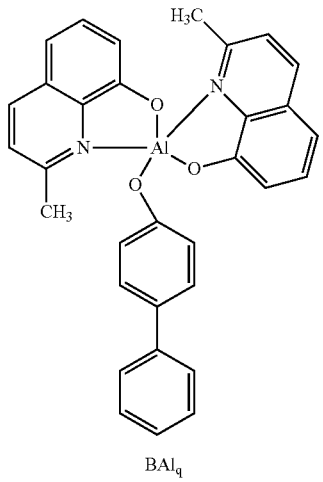

BAl$_q$

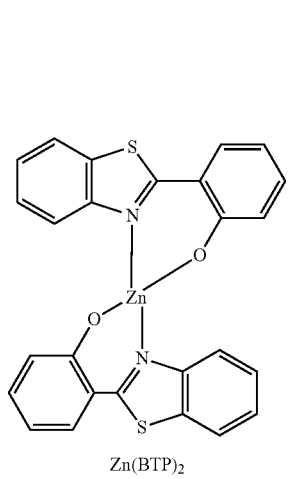

Zn(BTP)$_2$

[Evaluation of Organic EL Device]

The organic electroluminecence devices each manufactured as described above were driven by direct-current electricity (1 mA/cm$^2$) to emit light, and then the luminance (L) and voltage were measured.

Based on the measurement, the current efficiency (L/J) was obtained. In addition, by conducting a direct-current continuous current test with the initial luminance intensity being set at 5000 nit(cd/m$^2$) for each organic electroluminescence device, time elapsed until the initial luminance intensity was reduced to the half (i.e., time until half-life) was measured for each organic electroluminescence device.

The results are shown in the following Table 2. The affinity level (Af) and the triplet energy gap (Eg(T)) of the respective materials are shown in the following Table 3.

TABLE 2

| | Voltage (V) | Luminous Efficiency (L/J) (cd/A) | Emission Lifetime (H, @ 5000 nit) |
|---|---|---|---|
| Example 1 | 4.25 | 9.9 | 3000 |
| Example 2 | 4.30 | 10.2 | 3000 |
| Example 3 | 4.33 | 11.5 | 4000 |
| Example 4 | 4.36 | 11.0 | 5000 |
| Example 5 | 4.35 | 10.5 | 4000 |
| Example 6 | 4.28 | 10.3 | 3000 |
| Example 7 | 4.32 | 11.8 | 3000 |
| Example 8 | 4.34 | 11.6 | 4000 |
| Example 9 | 4.35 | 11.9 | 6000 |
| Example 10 | 4.61 | 11.3 | 3000 |
| Example 11 | 4.42 | 10.8 | 3000 |
| Example 12 | 4.35 | 10.5 | 4000 |
| Example 13 | 4.80 | 11.5 | 2500 |
| Example 14 | 4.32 | 11.7 | 2000 |
| Example 15 | 5.01 | 10.9 | 1500 |
| Example 16 | 4.54 | 9.8 | 1400 |
| Comparative 1 | 3.92 | 9.4 | 500 |
| Comparative 2 | 4.31 | 11.8 | 1000 |
| Comparative 3 | 4.42 | 11.7 | 1000 |
| Comparative 4 | 5.13 | 11.3 | 800 |
| Comparative 5 | 5.74 | 10.8 | 700 |
| Comparative 6 | 3.83 | 10.5 | 200 |

TABLE 3

| | Af (eV) | Eg(T) (eV) |
|---|---|---|
| Compound D | 2.64 | 2.38 |
| Compound E | 2.8 | 2.40 |
| Compound F | 2.55 | 2.44 |
| Compound G | 2.66 | 2.66 |

As is clear from the Tables 1 and 2, the organic electroluminescence device according to Examples 1 to 16 containing the second host in addition to the first host exhibited a longer lifetime than the organic electroluminescence device according to Comparatives 1 to 6 not containing the second host.

Accordingly, it is recognized that the organic electroluminescence device of the invention provides a longer lifetime than a typical phosphorescent organic electroluminescence device in which the second host is not added.

In Examples 1 to 6, the compound E or the compound D is added as the second host to Comparative 3 containing the compound F as the sole host. Consequently, the drive voltage of the organic electroluminescence device is reduced to lengthen the lifetime.

In Examples 7 to 9, the compound E is added as the second host to Comparative 1 containing the compound D as the sole host. Consequently, the efficiency of the organic electroluminescence device is enhanced and the lifetime is lengthened.

In Examples 10 to 12, the compound E is added as the second host to Comparative 4 containing the compound G as the sole host. Consequently, the drive voltage of the organic electroluminescence device is reduced to lengthen the lifetime.

In Examples 13 to 16, the compound F or the compound D is added to Comparative 5 containing BAlq as the sole host or Comparative 6 containing An(BTP)$_2$ as the sole host. Consequently, the lifetime of the organic electroluminescence device is lengthened.

It should be noted that the invention is not limited to the above description but may include any modification as long as such modification stays within a scope of the invention.

For instance, the following is a preferable example of such modification made to the present invention.

According to the aspect of the present invention, the phosphorescent-emitting layer may preferably contain an assistance substance for assisting injection of charges.

When the phosphorescent-emitting layer is formed of a host material that exhibits a large Eg(T), a difference in Ip between the host material and the hole injecting/transporting layer etc. becomes so large that the holes can hardly be injected into the phosphorescent-emitting layer and a driving voltage required for providing sufficient luminance may be raised.

In the above instance, introducing a hole-injectable or hole-transportable assistance substance for assisting injection of charges in the phosphorescent-emitting layer can contribute to facilitation of the injection of the holes into the phosphorescent-emitting layer and to reduction of the driving voltage.

As the assistance material for assisting the injection of charges, for instance, a typical hole injecting/transporting material or the like can be used.

Examples of the material are a triazole derivative (see, for instance, the specification of U.S. Pat. No. 3,112,197), an oxadiazole derivative (see, for instance, the specification of U.S. Pat. No. 3,189,447), an imidazole derivative (see, for instance, JP-B-37-16096), a polyarylalkane derivative (see, for instance, the specifications of U.S. Pat. No. 3,615,402, U.S. Pat. No. 3,820,989 and U.S. Pat. No. 3,542,544, JP-B-45-555, JP-B-51-10983, JP-A-51-93224, JP-A-55-17105, JP-A-56-4148, JP-A-55-108667, JP-A-55-156953, and JP-A-56-36656), a pyrazoline derivative and a pyrazolone derivative (see, for instance, the specifications of U.S. Pat. No. 3,180,729 and U.S. Pat. No. 4,278,746, JP-A-55-88064, JP-A-55-88065, JP-49-105537, JP-A-55-51086, JP-A-56-80051, JP-A-56-88141, JP-A-57-45545, JP-A-54-112637 and JP-A-55-74546), a phenylenediamine derivative (see, for instance, the specification of U.S. Pat. No. 3,615,404, JP-B-51-10105, JP-B-46-3712, JP-B-47-25336, JP-A-54-53435, JP-A-54-110536 and JP-A-54-119925), an arylamine derivative (see, for instance, the specifications of U.S. Pat. No. 3,567,450, U.S. Pat. No. 3,180,703, U.S. Pat. No. 3,240,597, U.S. Pat. No. 3,658,520, U.S. Pat. No. 4,232,103, U.S. Pat. No. 4,175,961 and U.S. Pat. No. 4,012,376, JP-B-49-35702, JP-B-39-27577, JP-A-55-144250, JP-A-56-119132 and JP-A-56-22437 and the specification of West Germany Patent No. 1,110,518), an amino-substituted chalcone derivative (see, for instance, the specification of U.S. Pat. No. 3,526, 501), an oxazole derivative (disclosed in, for instance, the specification of U.S. Pat. No. 3,257,203), a styrylanthracene derivative (see, for instance, JP-A-56-46234), a fluorenone derivative (see, for instance, JP-A-54-110837), a hydrazone derivative (see, for instance, the specification of U.S. Pat. No. 3,717,462 and JP-A-54-59143, JP-A-55-52063, JP-A-55-52064, JP-A-55-46760, JP-A-55-85495, JP-A-57-11350, JP-A-57-148749 and JP-A-02-311591), a stilbene derivative (see, for instance, JP-A-61-210363, JP-A-61-228451, JP-A-61-14642, JP-A-61-72255, JP-A-62-47646, JP-A-62-36674, JP-A-62-10652, JP-A-62-30255, JP-A-60-93455, JP-A-60-94462, JP-A-60-174749 and JP-A-60-175052), a silazane derivative (see the specification of U.S. Pat. No. 4,950,950), a polysilane type (see JP-A-02-204996), an aniline-based copolymer (see JP-A-02-282263), and a conductive polymer oligomer (particularly, thiophene oligomer) disclosed in JP-A-01-211399.

The hole-injectable material, examples of which are as listed above, is preferably a porphyrin compound (disclosed in JP-A-63-295695 etc.), an aromatic tertiary amine compound or a styrylamine compound (see, for instance, the specification of U.S. Pat. No. 4,127,412, JP-A-53-27033, JP-A-54-58445, JP-A-54-149634, JP-A-54-64299, JP-A-55-79450, JP-A-55-144250, JP-A-56-119132, JP-A-61-295558, JP-A-61-98353 or JP-A-63-295695), particularly preferably an aromatic tertiary amine compound.

In addition, 4,4'-bis(N-(1-naphthyl)-N-phenylamino)biphenyl (hereinafter, abbreviated as NPD) having in the molecule two fused aromatic rings disclosed in U.S. Pat. No. 5,061,569, 4,4',4''-tris(N-(3-methylphenyl)-N-phenylamino) triphenylamine (hereinafter, abbreviated as MTDATA) in which three triphenylamine units disclosed in JP-A-04-308688 are bonded in a starbust form and the like may also be used.

Further, a hexaazatriphenylene derivative disclosed in Japanese Patent No. 3614405 and No. 3571977 and U.S. Pat. No. 4,780,536 may also preferably be used as the hole-injecting material.

Alternatively, inorganic compounds such as p-type Si and p-type SiC can also be used as the hole-injecting material.

The invention claimed is:

1. An organic electroluminescence device, comprising:
   an anode;
   a cathode; and
   an organic thin-film layer interposed between the anode and the cathode, wherein
   the organic thin-film layer includes a phosphorescent-emitting layer containing a host and a phosphorescent dopant,
   the host contains a first host and a second host,
   one of the first host and the second host exhibits a higher affinity level than the other,
   the first host includes a substituted or unsubstituted polycyclic fused aromatic skeleton, the skeleton having 10 to 30 ring-forming atoms not including an atom of a substituent,
   a minimum excited triplet energy gap of the first host is in a range from 2.1 eV to 2.7 eV.

2. The organic electroluminescence device according to claim 1, wherein
   the polycyclic fused aromatic skeleton is present in a chemical structure formula as a divalent or multivalent group.

3. The organic electroluminescence device according to claim 1, wherein
   the polycyclic fused aromatic skeleton comprises the substituent, and
   the substituent is a substituted or unsubstituted aryl or heteroaryl group.

4. The organic electroluminescence device according to claim 3, wherein
   the substituent does not have a carbazole skeleton.

5. The organic electroluminescence device according to claim 2, wherein
   the polycyclic fused aromatic skeleton is selected from the group consisting of a substituted or unsubstituted phenanthrene-diyl, chrysene-diyl, fluoranthene-diyl and triphenylene-diyl.

6. The organic electroluminescence device according to claim 5, wherein
   the polycyclic fused aromatic skeleton is substituted by a group including phenanthrene, chrysene, fluoranthene and triphenylene.

7. The organic electroluminescence device according to claim 1, wherein
   the polycyclic fused aromatic skeleton is represented by any one of formulae (1) to (4) as follows,

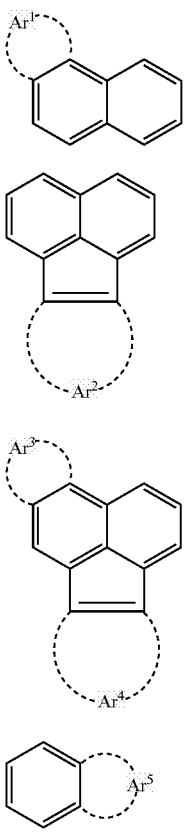

where Ar¹ to Ar⁵ in the formulae (1) to (4) each represent a substituted or unsubstituted fused cyclic structure having 4 to 10 ring-forming carbon atoms not including the atom of the substituent.

8. The organic electroluminescence device according to claim 1, wherein
the first host is a substituted or unsubstituted phenanthrene or a substituted or unsubstituted chrysene.

9. The organic electroluminescence device according to claim 1, wherein
the second host comprises the polycyclic fused aromatic skeleton.

10. The organic electroluminescence device according to claim 9, wherein
the second host is a substituted or unsubstituted phenanthrene or a substituted or unsubstituted chrysene.

11. The organic electroluminescence device according to claim 1, wherein
the first host comprises the polycyclic fused aromatic skeleton,
an affinity level of the second host is higher than the affinity level of the first host, and
a content of the second host in the host is in a range from 1 mass % to 50 mass %.

12. The organic electroluminescence device according to claim 1, wherein
the phosphorescent dopant contains a metal complex having: a metal selected from the group consisting of Ir, Pt, Os, Au, Cu, Re and Ru; and a ligand.

13. The organic electroluminescence device according to claim 1, wherein
a wavelength of a light of a maximum luminance of the phosphorescent dopant is in a range from 500 nm to 700 nm.

14. The organic electroluminescence device according to claim 1, wherein
the organic thin-film layer comprises an electron injecting layer between the cathode and the phosphorescent-emitting layer, and
the electron injecting layer contains a nitrogen-containing heterocyclic derivative.

15. The organic electroluminescence device according to claim 1, wherein
a reduction-causing dopant is present at an interfacial region between the cathode and the organic thin-film layer.

16. An organic-electroluminescent-material-containing solution for preparing a phosphorescent-emitting layer comprising:
a host;
a phosphorescent dopant; and
a solvent in which the host and the phosphorescent dopant are dissolved,
wherein
the host contains a first host and a second host,
one of the first host and the second host exhibits a higher affinity level than the other,
the first host includes a substituted or unsubstituted polycyclic fused aromatic skeleton, the skeleton having 10 to 30 ring-forming atoms not including an atom of a substituent, and a minimum excited triplet energy gap of the first host is in a range from 2.1 eV to 2.7 eV.

* * * * *